United States Patent
Chang et al.

(12)

(10) Patent No.: US 9,865,736 B2
(45) Date of Patent: Jan. 9, 2018

(54) SEMICONDUCTOR DEVICES AND METHODS OF MANUFACTURING THE SAME

(71) Applicant: SAMSUNG ELECTRONICS CO., LTD., Suwon-si OT (KR)

(72) Inventors: Chong-Kwang Chang, Hwaseong-si (KR); Young-Mook Oh, Hwaseong-si (KR); Hak-Yoon Ahn, Seoul (KR); Jung-Gun You, Ansan-si (KR); Gi-Gwan Park, Suwon-si (KR); Baik-Min Sung, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/292,144

(22) Filed: Oct. 13, 2016

(65) Prior Publication Data

US 2017/0110569 A1 Apr. 20, 2017

(30) Foreign Application Priority Data

Oct. 16, 2015 (KR) .......................... 10-2015-0144399

(51) Int. Cl.
| | | |
|---|---|---|
| *H01L 29/78* | (2006.01) | |
| *H01L 23/528* | (2006.01) | |
| *H01L 21/768* | (2006.01) | |
| *H01L 23/522* | (2006.01) | |

(52) U.S. Cl.
CPC ...... *H01L 29/785* (2013.01); *H01L 21/76807* (2013.01); *H01L 23/5226* (2013.01); *H01L 23/5283* (2013.01); *H01L 2029/7858* (2013.01)

(58) Field of Classification Search
CPC ............. H01L 29/785; H01L 21/76807; H01L 23/5226; H01L 23/5283; H01L 2029/7858
USPC .................................................. 257/401, 369
See application file for complete search history.

(56) References Cited

U.S. PATENT DOCUMENTS

| | | |
|---|---|---|
| 6,927,461 B2 | 8/2005 | Kim et al. |
| 7,696,087 B2 | 4/2010 | Hyun |
| 8,119,523 B2 | 2/2012 | Yang |
| 8,426,310 B2 | 4/2013 | Adetutu et al. |
| 8,530,949 B2 | 9/2013 | Onuma et al. |
| 9,379,119 B1 * | 6/2016 | Huang ................ H01L 27/1104 |
| 2013/0307032 A1 * | 11/2013 | Kamineni ............. H01L 23/485 257/288 |

(Continued)

FOREIGN PATENT DOCUMENTS

| | | |
|---|---|---|
| JP | 2002-033389 A | 1/2002 |
| JP | 3282607 B | 5/2002 |
| KR | 1016855 B | 2/2011 |

*Primary Examiner* — Cuong Q Nguyen
*Assistant Examiner* — Tong-Ho Kim
(74) *Attorney, Agent, or Firm* — Muir Patent Law PLLC

(57) ABSTRACT

A semiconductor device includes a gate structure on a substrate, a source/drain layer on a portion of the substrate adjacent the gate structure, a first contact plug contacting an upper surface of the source/drain layer, and a second contact plug contacting upper surfaces of the gate structure and the first contact plug. A bottom surface of the second contact plug has a first portion not contacting the upper surface of the first contact plug, and the first portion is higher than the upper surface of the gate structure.

18 Claims, 91 Drawing Sheets

(56) References Cited

U.S. PATENT DOCUMENTS

| | | | |
|---|---|---|---|
| 2014/0353756 A1* | 12/2014 | Yamamoto | H01L 27/1203 257/351 |
| 2015/0179756 A1 | 6/2015 | Liu et al. | |
| 2015/0194425 A1 | 7/2015 | Wu et al. | |
| 2015/0194516 A1 | 7/2015 | Wu et al. | |

* cited by examiner

2ND DIRECTION

1ST DIRECTION

⊗⟶ 2ND DIRECTION
1ST DIRECTION

⊗⟶ 1ST DIRECTION
2ND DIRECTION

⊗——▶ 2ND DIRECTION
1ST DIRECTION

⊗ → 1ST DIRECTION
2ND DIRECTION

⊗ ⟶ 2ND DIRECTION
1ST DIRECTION

⊗──── 1ST DIRECTION
2ND DIRECTION

SEMICONDUCTOR DEVICES AND METHODS OF MANUFACTURING THE SAME

CROSS-REFERENCE TO RELATED APPLICATION

This application claims priority under 35 USC §119 to Korean Patent Application No. 10-2015-0144399, filed on Oct. 16, 2015 in the Korean Intellectual Property Office (KIPO), the contents of which are herein incorporated by reference in their entirety.

BACKGROUND

1. Field

The present disclosure relates to semiconductor devices and methods of manufacturing the same. More particularly, example embodiments relate to semiconductor devices including contact plugs and methods of manufacturing the same.

2. Description of the Related Art

A second contact plug commonly contacting a first contact plug, which may contact an upper surface of a source/drain layer on a substrate, and a gate structure on the substrate may be formed to fill an opening, which may be formed by twice etching an insulating interlayer on the substrate. Thus, the insulating interlayer may be over-etched so that an upper surface of the substrate may be exposed, and the second contact plug filling the opening may contact the upper surface of the substrate to generate electrical failure.

SUMMARY

Example embodiments provide a semiconductor device having good reliability.

Example embodiments provide a method of manufacturing a semiconductor device having good reliability.

According to example embodiments, there is provided a semiconductor device. The semiconductor device may include a gate structure on a substrate, a source/drain layer on a portion of the substrate adjacent the gate structure, a first contact plug contacting an upper surface of the source/drain layer, and a second contact plug contacting upper surfaces of the gate structure and the first contact plug. A bottom surface of the second contact plug may have a first portion not contacting the upper surface of the first contact plug, and the first portion may be higher than the upper surface of the gate structure.

In example embodiments, the first portion of the bottom surface of the second contact plug may vertically overlap neither the first contact plug nor the gate structure.

In example embodiments, the bottom surface of the second contact plug may further include a convex portion adjacent the first portion, and a lower surface of the convex portion may be lower than the upper surface of the gate structure.

In example embodiments, the convex portion of the bottom surface of the second contact plug may be closer than the first portion of the bottom surface of the second contact plug to the gate structure.

In example embodiments, the bottom surface of the second contact plug may include a concave portion of which an upper surface is the first portion thereof.

In example embodiments, the concave portion of the bottom of the second contact plug may have a width constant along a vertical direction.

In example embodiments, the concave portion of the bottom of the second contact plug may have a width gradually decreasing from a bottom toward a top thereof.

In example embodiments, the second contact plug may include a metal pattern, and a barrier pattern covering a bottom and a sidewall of the metal pattern. A thickness of the barrier pattern at the upper surface of the concave portion may be greater than a thickness of the barrier pattern at a sidewall of the concave portion.

In example embodiments, the semiconductor device may further include an insulation layer structure filling the concave portion of the bottom of the second contact plug.

In example embodiments, the insulation layer structure may include a first oxide layer, a nitride layer and a second oxide layer sequentially stacked.

In example embodiments, the insulation layer structure may include a nitride layer and an oxide layer sequentially stacked.

In example embodiments, the insulation layer structure may include a nitride layer.

In example embodiments, the bottom of the second contact plug may further include a convex portion adjacent the concave portion, and a lower surface of the convex portion may be lower than the upper surface of the gate structure.

In example embodiments, the convex portion of the bottom of the second contact plug may be closer than the concave portion to the gate structure.

In example embodiments, a lowermost portion of the bottom of the second contact plug may be substantially coplanar with the upper surface of the gate structure.

In example embodiments, a lowermost portion of the bottom surface of the second contact plug may be lower than the upper surface of the gate structure and higher than a bottom surface of the gate structure.

In example embodiments, a lowermost portion of the bottom surface of the second contact plug may be lower than a bottom surface of the gate structure and higher than an upper surface of the substrate.

In example embodiments, the gate structure may be one of a plurality of gate structures spaced apart from each other in a first direction, and each of the gate structures may extend in a second direction substantially perpendicular to the first direction. The second contact plug may include a first extension portion extending in the second direction between the gate structures and contacting part of the upper surface of the first contact plug, and a second extension portion extending in the first direction. The second extension portion may be connected to the first extension portion and contact part of the upper surface of at least one of the gate structures.

In example embodiments, the first portion of the bottom surface of the second contact plug may be formed at an area in which the first and second extension portions of the second contact plug meet each other.

In example embodiments, the semiconductor device may further include an isolation pattern on the substrate, and a plurality of active fins disposed in the second direction. Each of the active fins may partially protrude from an upper surface of the isolation pattern and extend in the first direction. The source/drain layer may be formed on each of the active fins.

In example embodiments, the first portion of the bottom surface of the second contact plug may vertically overlap the isolation pattern.

In example embodiments, the semiconductor device may further include an insulation layer structure between the isolation pattern and the first portion of the bottom surface of the second contact plug.

In example embodiments, the insulation layer structure may include a first oxide layer, a nitride layer and a second oxide layer.

In example embodiments, the insulation layer structure may include an oxide layer and a nitride layer.

In example embodiments, the bottom surface of the second contact plug may include a plurality of first portions, and a first one of the first portions has a height different from a second one of the first portions.

In example embodiments, the bottom surface of the second contact plug may include a plurality of first portions. The semiconductor device may further include a first oxide layer, a nitride layer and a second oxide layer sequentially stacked between the isolation pattern and ones of the first portions of the bottom surface of the second contact plug. The semiconductor device may further include the first oxide layer and the nitride layer sequentially stacked between the isolation pattern and other ones of the first portions of the bottom surface of the second contact plug.

In example embodiments, a lowermost portion of the bottom surface of the second contact plug may be higher than a lower surface of the isolation pattern.

According to example embodiments, there is provided a semiconductor device. The semiconductor device may include a gate structure on a substrate, a source/drain layer on a portion of the substrate adjacent the gate structure, a first contact plug contacting an upper surface of the source/drain layer, and a second contact plug contacting an upper surface of the gate structure and an upper surface of the first contact plug. A first portion of a bottom surface of the second contact plug contacts neither the upper surface of the gate structure nor the upper surface of the first contact plug, and may have a varying height.

In example embodiments, the first portion of the bottom surface of the second contact plug may have a step shape.

In example embodiments, the first portion of the bottom surface of the second contact plug may have a concave portion.

In example embodiments, the bottom surface of the second contact plug may further include a convex portion adjacent the concave portion.

In example embodiments, the convex portion of the bottom surface of the second contact plug may be closer than the concave portion thereof to the gate structure.

In example embodiments, a lower surface of the convex portion of the bottom surface of the second contact plug may be lower than the upper surface of the gate structure.

In example embodiments, a lower surface of the convex portion of the bottom surface of the second contact plug may be higher than the upper surface of the substrate.

In example embodiments, an upper surface of the concave portion of the bottom surface of the second contact plug may be higher than the upper surface of the gate structure.

In example embodiments, an upper surface of the concave portion of the bottom surface of the second contact plug may be lower than the upper surface of the gate structure and higher than a bottom of the gate structure.

In example embodiments, the bottom surface of the second contact plug may include a plurality of concave portions, and a first one of the concave portions may have a height different from a second one of the concave portions.

According to example embodiments, there is provided a semiconductor device. The semiconductor device may include a gate structure on a substrate, a source/drain layer on a portion of the substrate adjacent the gate structure, a first contact plug contacting a top surface of the source/drain layer, and a second contact plug contacting a top surface of the gate structure and a top surface of the first contact plug. A portion of a bottom surface of the second contact plug contacting neither the top surface of the gate structure nor the top surface of the first contact plug, and may be lower than or coplanar with the top surface of the gate structure and higher than a bottom of the gate structure.

According to example embodiments, there is provided a semiconductor device. The semiconductor device a gate structure on a substrate, a source/drain layer on a portion of the substrate adjacent the gate structure, and a contact plug being electrically connected to both of the gate structure and the source/drain layer. A portion of a bottom of the contact plug vertically overlapping neither the gate structure nor the source/drain layer and may have a step shape or a concave portion.

In example embodiments, the bottom of the contact plug may be higher than a top surface of the substrate.

In example embodiments, the portion of the bottom of the contact plug vertically overlapping neither the gate structure nor the source/drain layer has a concave portion, and an upper surface of the concave portion of the bottom of the contact plug may be higher than a top surface of the gate structure.

In example embodiments, the bottom of the second contact plug may further include a convex portion adjacent the concave portion.

In example embodiments, a lower surface of the convex portion of the bottom of the second contact plug may be lower than the top surface of the gate structure.

According to example embodiments, there is provided a method of manufacturing a semiconductor device. In the method, a gate structure may be formed on a substrate. First and second insulating interlayers may be sequentially formed on the gate structure. The second insulating interlayer may be partially removed to form a first opening exposing an upper surface of the first insulating interlayer. A first layer may be formed on the exposed upper surface of the first insulating interlayer and an upper surface of the second insulating interlayer to fill the first opening. The first layer may be partially removed until the upper surface of the second insulating interlayer may be exposed to form a second opening at least partially vertically overlapping the first opening. A portion of the first layer in the first opening may remain to at least fill a lower portion of the first opening. An exposed portion of the second insulating interlayer and a portion of the first insulating interlayer thereunder may be etched using the first layer as an etching mask to form a third opening exposing an upper surface of the gate structure. A contact plug may be formed to fill the third opening.

In example embodiments, the second opening may at least partially vertically overlap the upper surface of the gate structure.

In example embodiments, the first opening may not vertically overlap the upper surface of the gate structure.

In example embodiments, a portion of the third opening may vertically overlap the upper surface of the gate structure, and another portion of the third opening may not vertically overlap the upper surface of the gate structure.

In example embodiments, a first portion of a bottom of the third opening may be higher than the upper surface of the gate structure.

In example embodiments, a second portion of a bottom of the third opening may be lower than the upper surface of the gate structure.

In example embodiments, a bottom of the third opening may have a step shape.

In example embodiments, a bottom of the third opening may have a concave portion and a convex portion.

In example embodiments, when the third opening is formed, the exposed portion of the second insulating interlayer may be etched using the first layer as an etching mask to form a fourth opening to expose the portion of the first insulating interlayer. The fourth opening may be in communication with the first opening. The exposed portion of the first insulating interlayer may be etched using the first layer as an etching mask. At least a portion of the first layer may remain in the first opening when the fourth opening is formed.

In example embodiments, after the first layer is formed on the exposed upper surface of the first insulating interlayer and the upper surface of the second insulating interlayer to fill the first opening, a second layer, an anti-reflective layer and a photoresist pattern may be sequentially formed on the first layer. The anti-reflective layer and the second layer may be sequentially etched using the photoresist pattern as an etching mask. When the first layer is partially removed to form the second opening, the first layer may be etched using the second layer as an etching mask.

In example embodiments, after the first layer is partially removed to form the second opening, the second layer may be removed.

In example embodiments, an etch stop layer may be formed between the first and second insulating interlayer. When the second insulating interlayer is partially removed to form the first opening, the second insulating interlayer and the etch stop layer may be partially removed to form the first opening.

In example embodiments, the portion of the first layer in the first opening may remain so that an upper surface thereof may be higher than at least an upper surface of the etch stop layer, after the second opening at least partially vertically overlapping the first opening is formed.

In example embodiments, the first and second layers may include SOH and silicon oxynitride, respectively.

In example embodiments, before the first and second insulating interlayers are sequentially formed on the gate structure, an insulation layer may be formed to surround a sidewall of the gate structure. The insulating interlayer may be formed on the gate structure and the insulation layer.

In example embodiments, the contact plug may be a second contact plug, and before the first and second insulating interlayers are sequentially formed on the gate structure, a first contact plug may be formed through the insulation layer and the first insulating interlayer to be electrically connected to the substrate.

In example embodiments, the first opening may be formed to partially vertically overlap an upper surface of the first contact plug so that the second contact plug may contact the upper surface of the first contact plug.

In example embodiments, before the gate structure is formed on the substrate, an isolation pattern may be formed on the substrate to define an active fin. A source/drain layer may be formed on the active fin. The first contact plug may contact an upper surface of the source/drain layer.

In example embodiments, a bottom of the contact plug may have a step shape or a concave portion at an area in which the contact plug vertically overlaps the upper surface of the source/drain layer.

According to example embodiments, there is provided a method of manufacturing a semiconductor device. In the method, an insulation layer containing a first structure therein may be formed on a substrate. A first insulating interlayer containing a second structure therein may be formed on the first structure and the insulation layer. A second insulating interlayer may be formed on the second structure and the first insulating interlayer. The second insulating interlayer may be partially removed to form a first opening exposing upper surfaces of the second structure and the first insulating interlayer. A first layer may be formed on the exposed upper surfaces of the second structure and the first insulating interlayer and an upper surface of the second insulating interlayer to fill the first opening. The first layer may be partially removed to form a second opening at least partially vertically overlapping each of the first structure and the first opening and exposing an upper surface of the second insulating interlayer. A portion of the first layer in the first opening may remain to at least fill a lower portion of the first opening. An exposed portion of the second insulating interlayer and a portion of the first insulating interlayer thereunder may be etched using the first layer as an etching mask to form a third opening exposing an upper surface of the first structure. A contact plug may be formed to fill the third opening.

In example embodiments, the second structure may not vertically overlap the first structure.

In example embodiments, the second structure may be formed through the insulation layer and the first insulating interlayer to be electrically connected to the substrate.

In example embodiments, the first structure may be a gate structure, the contact plug may be a second contact plug, and the second structure may be a first contact plug.

In example embodiments, before the insulation layer is formed on the substrate, an isolation pattern may be formed on the substrate to define an active fin. A source/drain layer may be formed on the active fin. The second structure may contact an upper surface of the source/drain layer.

In example embodiments, the first opening may not vertically overlap the first structure.

In example embodiments, a portion of the third opening may vertically overlap the first structure, and another portion of the third opening may not vertically overlap the first structure.

In example embodiments, a bottom of the third opening may have a concave portion and a convex portion.

In the method of manufacturing the semiconductor device, the first contact plug on the source/drain layer and the second contact plug contacting both of the first contact plug and the gate structure may not contact the substrate. Thus, the electrical failure due to the leakage current from the second contact plug to the substrate may be prevented.

According to example embodiments, a semiconductor device includes a gate structure on a substrate, a source/drain layer on a portion of the substrate adjacent the gate structure, a first contact plug contacting a top surface of the source/drain layer, and a second contact plug. The gate structure has a topmost surface at a first height and a bottom-most surface at a second height. The second contact plug contacts the topmost surface of the gate structure and a top surface of the first contact plug. A first portion of a bottom surface of the second contact plug contacts neither the topmost surface of the gate structure nor the top surface of the first contact plug. The first portion of the bottom surface of the second contact plug contacting neither the topmost surface of the gate structure nor the top surface of the first contact plug has a first bottom surface portion at a height equal to the first height or the second height or has a height between the first height or the second height, and has a second bottom surface portion at a height either greater than the first height or less than the second height.

In some embodiments, both the first bottom surface portion and the second bottom surface portion are above a top surface of the substrate.

In some embodiments, the first bottom surface portion is higher than the second bottom surface portion.

In some embodiments, the first bottom surface portion is further from the gate structure than the second bottom surface portion.

BRIEF DESCRIPTION OF THE DRAWINGS

Example embodiments will be more clearly understood from the following detailed description taken in conjunction with the accompanying drawings.

FIGS. 1 to 50, 51A, 51B, and 52-54 are plan views and cross-sectional views illustrating stages of a method of manufacturing a semiconductor device in accordance with example embodiments;

FIGS. 92 to 97 are cross-sectional views illustrating semiconductor devices, respectively, in accordance with example embodiments.

Figure 1:
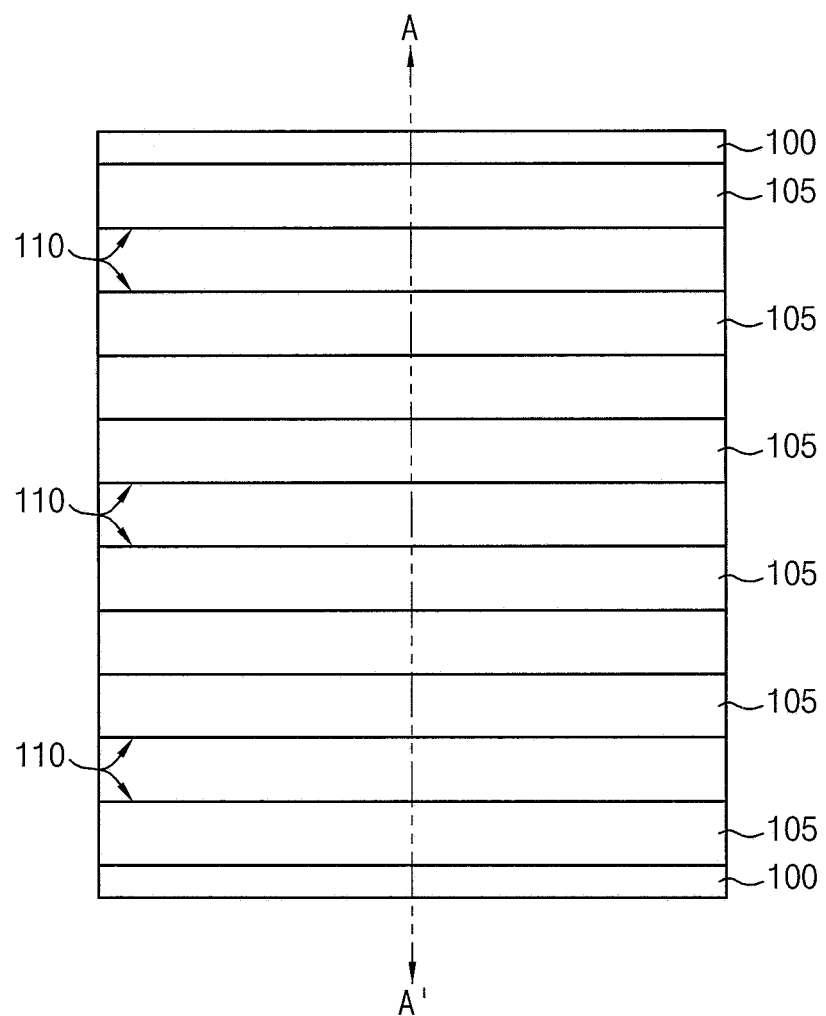
FIGS. 1 to 97 represent non-limiting, example embodiments as described herein.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

DETAILED DESCRIPTION

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, or as "contacting" or "in contact with" another element or layer, there are no intervening elements or layers present. As such, the term "contact" as used herein refers to touching. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 50, 51A, 51B, and 52-54 are plan views and cross-sectional views illustrating stages of a method of manufacturing a semiconductor device in accordance with example embodiments. Particularly, FIGS. 1, 3, 6, 9, 12, 15, 18, 21, 24, 27, 30, 34, 38, 42 and 50 are plan views, and FIGS. 2, 4-5, 7-8, 10-11, 13-14, 16-17, 19-20, 22-23, 25-26, 28-29, 31-33, 35-37, 39-41, 43-49 and 51A, 51B, and 52-54 are cross-sectional views.

Figure 7:
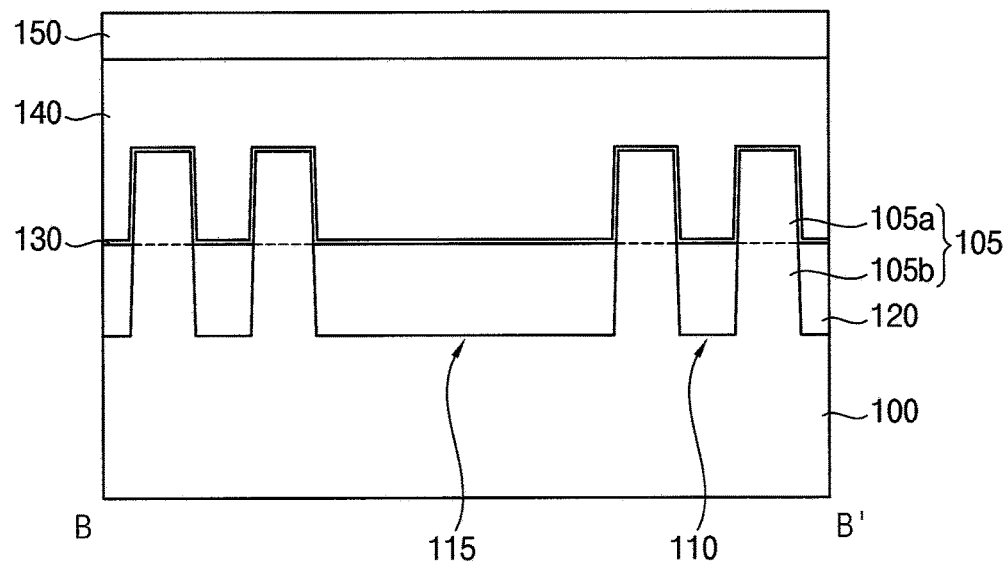
Figure 22:
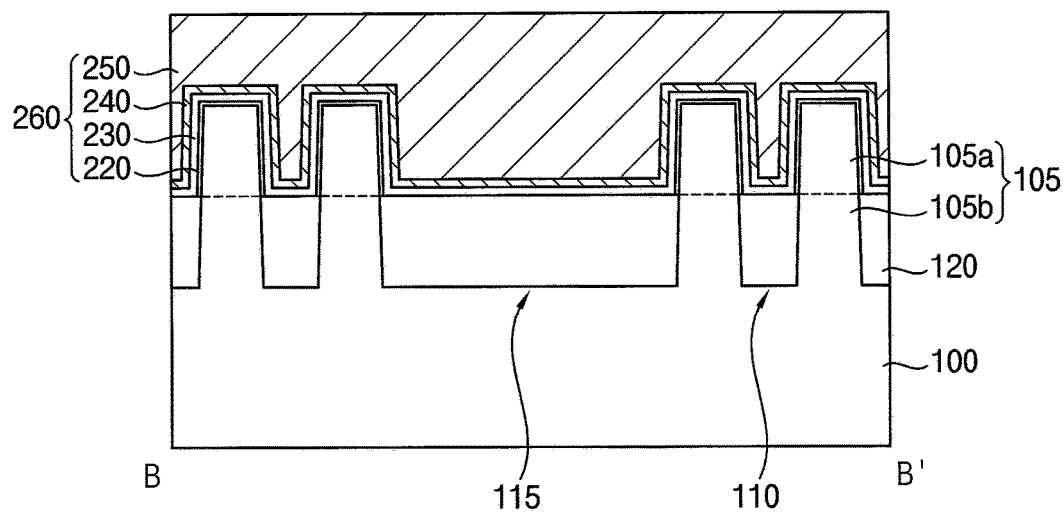
Figure 51A:
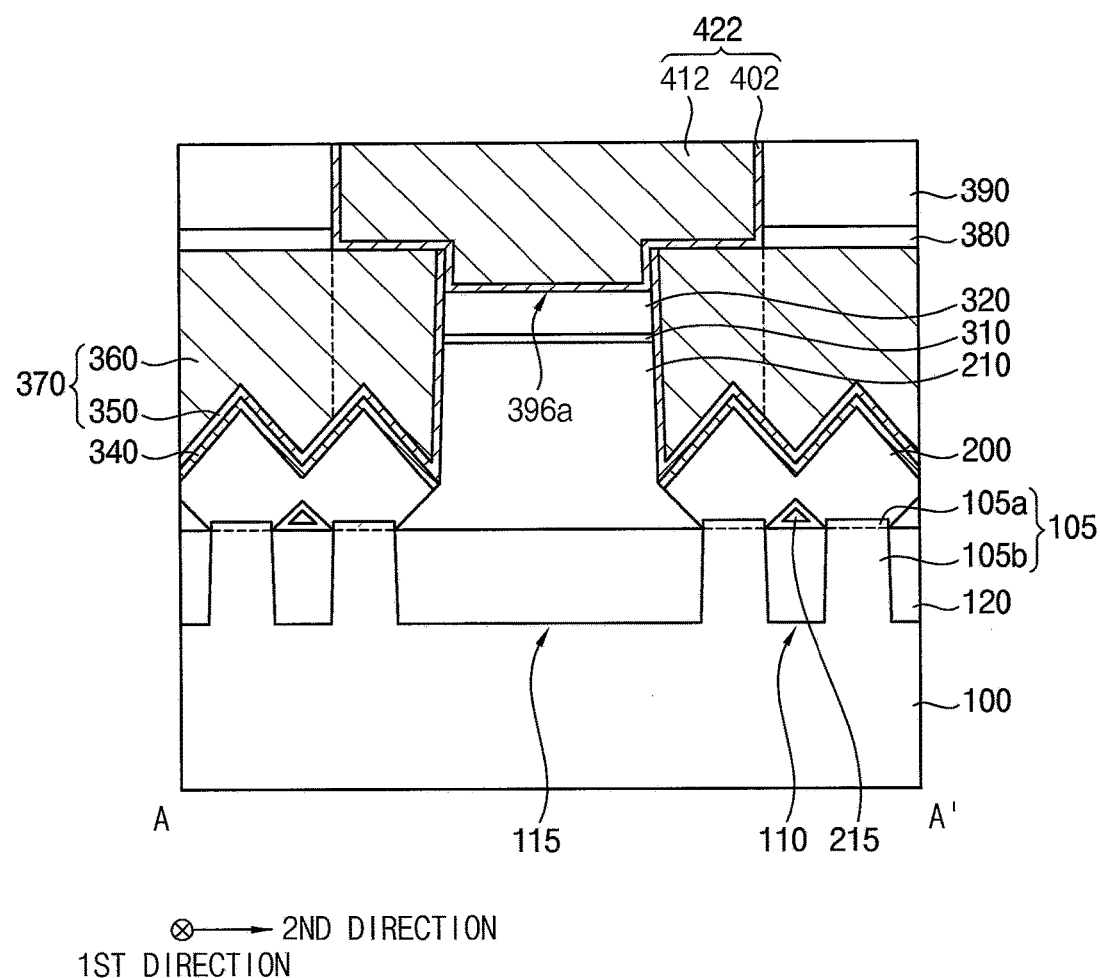
Figure 51B:
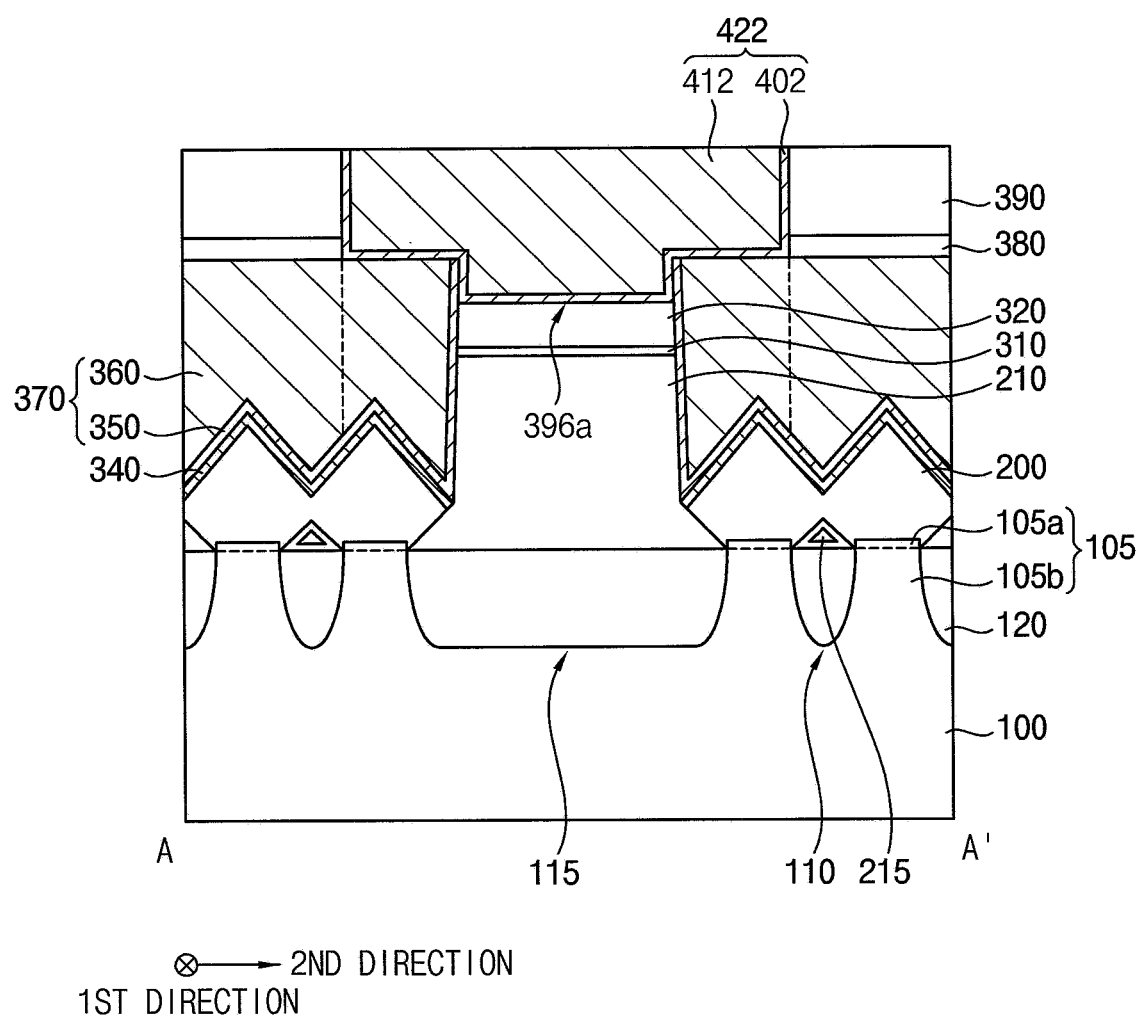
Figure 52:
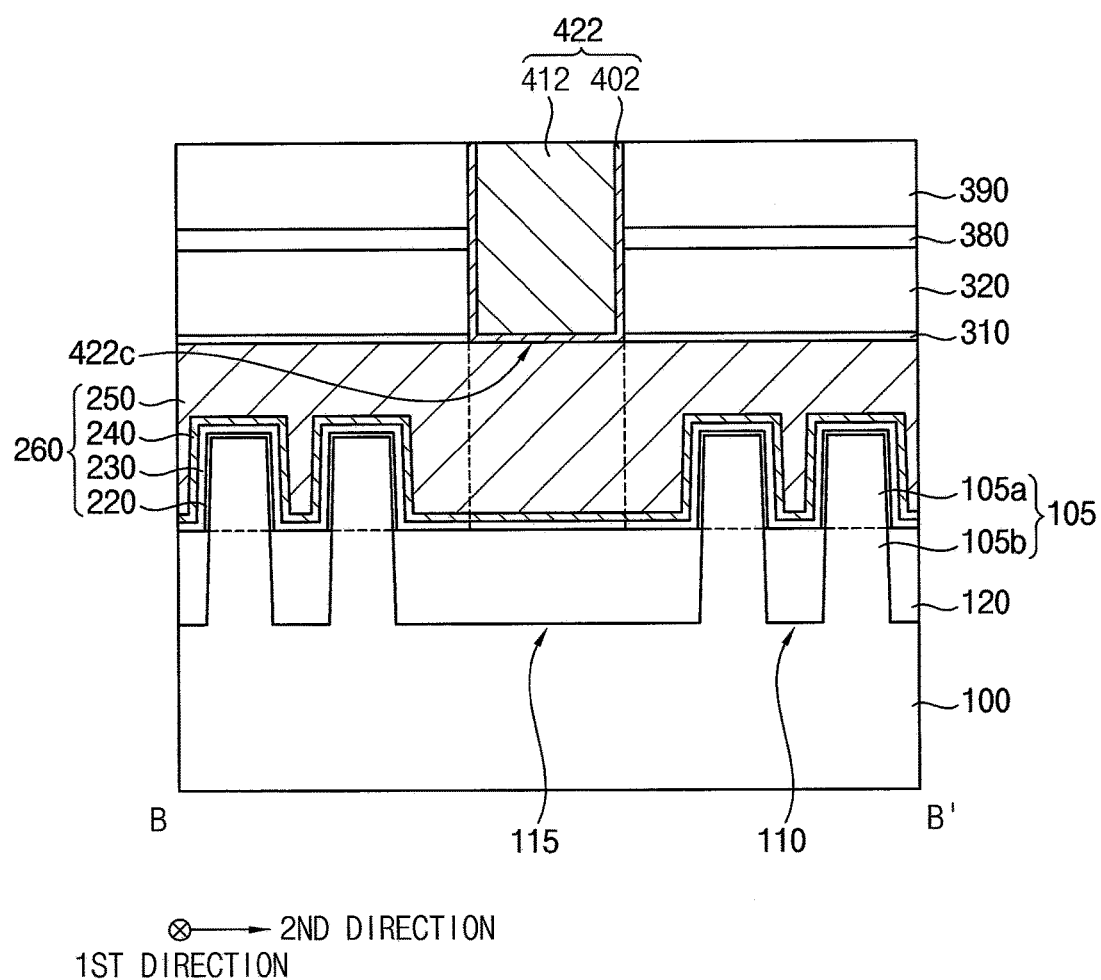
Figure 53:
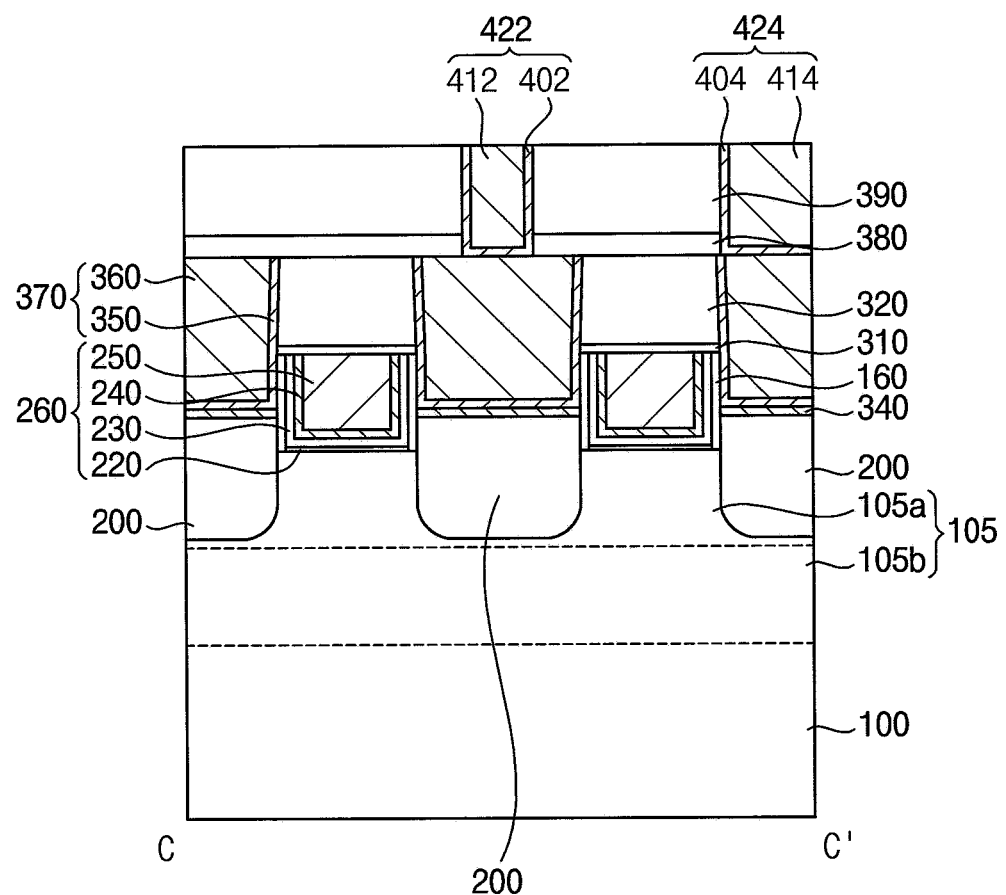

FIGS. 2, 4-5, 10, 13, 16, 19, 25, 28, 31, 35, 39, 43, 45, 47 and 51A and 51B are cross-sectional views taken along lines A-A' of corresponding plan views, respectively, FIGS. 7, 22 and 52 are cross-sectional views taken along lines B-B' of corresponding plan views, respectively, FIGS. 8, 11, 14, 17, 20, 23, 26, 29, 32, 36, 40, 48 and 53 are cross-sectional views taken along lines C-C' of corresponding plan views, respectively, and FIGS. 33, 37, 41, 44, 46, 49 and 54 are cross-sectional views taken along lines D-D' of corresponding plan views, respectively.

As used herein, a semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Figure 2A:
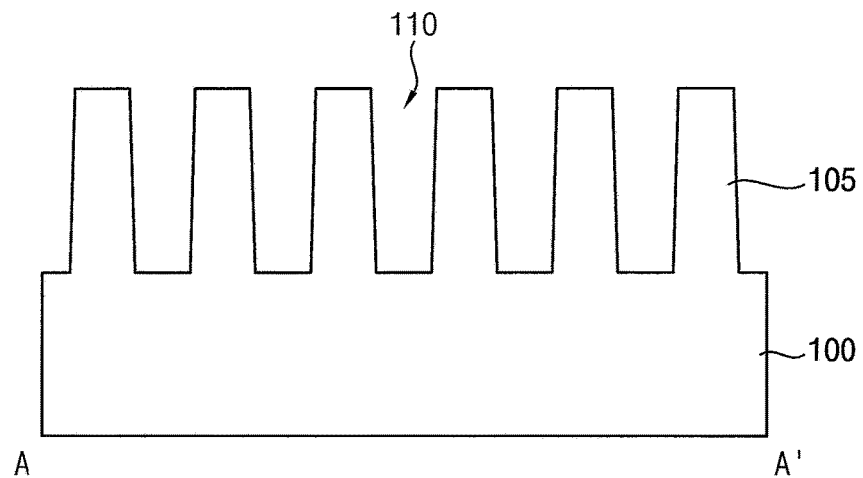

Referring to FIGS. 1 and 2A, an upper portion of a substrate 100 may be etched to form a first recess 110.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate.

As the first recess 110 is formed on the substrate 100, an active region 105 protruding from an upper surface of the substrate 100 may be defined, which may be also referred to as an active fin, or simply as a fin. Though a single first recess 110 and active region/fin 105 is labeled in FIG. 2A, as can be seen in FIG. 1, a plurality of first recesses 110 and active regions/active fins 105 may be formed.

In example embodiments, each active fin 105 may extend in a first direction substantially parallel to the upper surface of the substrate 100, and a plurality of active fins 105 may be arranged in a second direction, which may be substantially parallel to the upper surface of the substrate 100 and cross the first direction. In example embodiments, the first and second directions may cross each other at a right angle, and thus may be substantially perpendicular to each other.

Figure 2B:
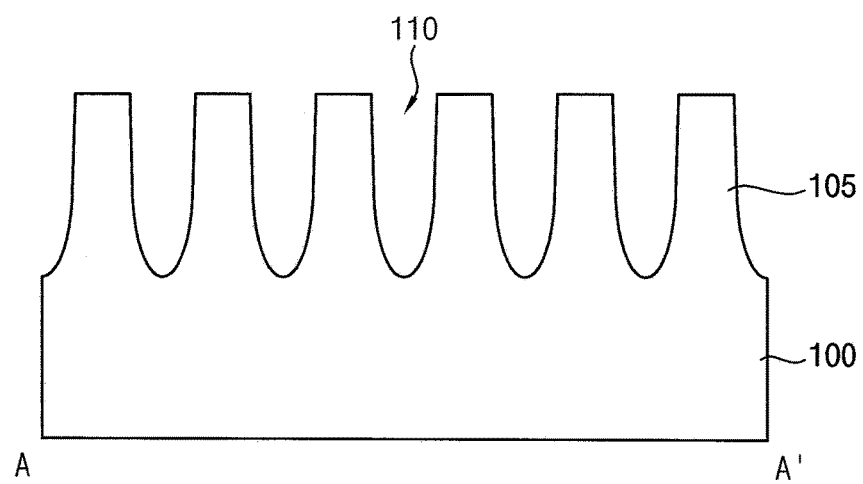

Referring to FIG. 2B, in some embodiments, each of the active fins 105 may have a width gradually increasing from a top toward a bottom thereof.

Figure 3:
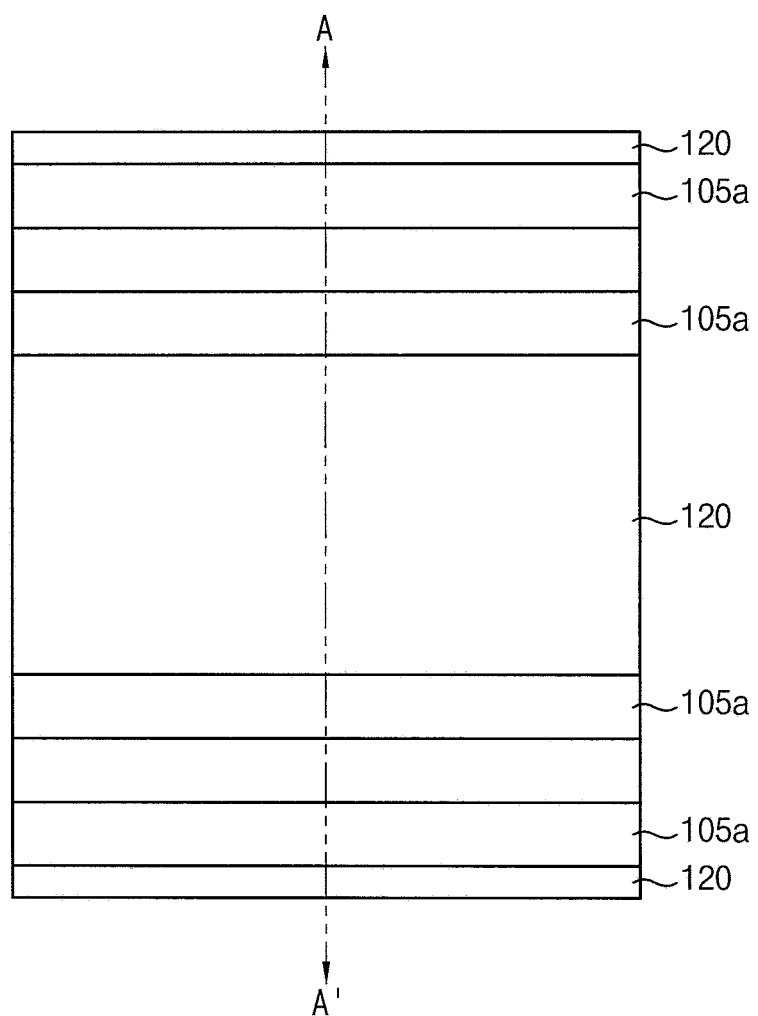
Figure 4:
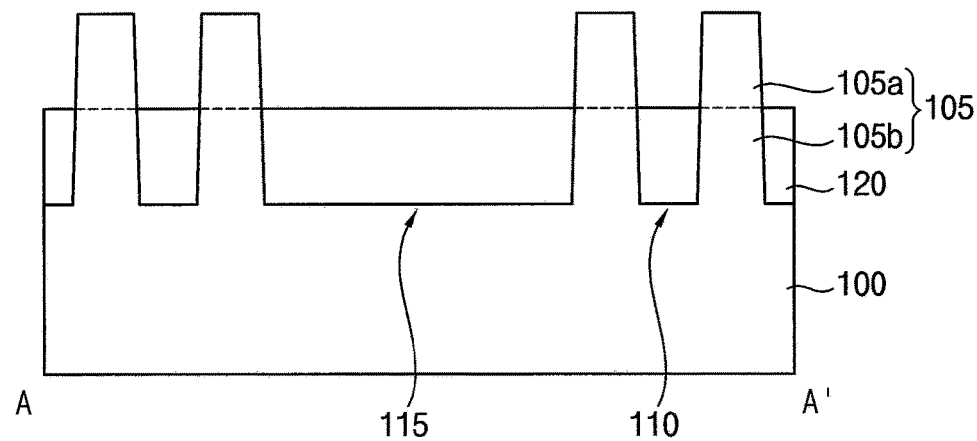

Referring to FIGS. 3 and 4, one or more of the active fins 105 may be removed to form a second recess 115 having a width greater than that of the first recess 110, and an isolation pattern 120 may be formed on the substrate 100 to fill lower portions of each of the first and second recesses 110 and 115.

The second recess 115 may be formed by forming a first photoresist pattern (not shown) on the substrate 100 to cover a plurality of the active fins 105, and etching one or more of the active fins 105 not covered by the first photoresist pattern. In example embodiments, the second recess 115 may be formed to a depth substantially equal to that of the first recess 110.

Figure 5:
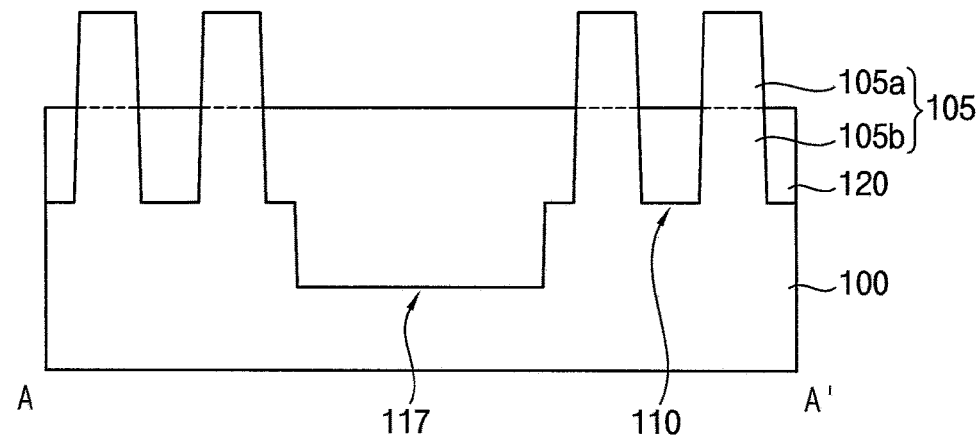

Alternatively, referring to FIG. 5, not only the ones of the active fins 105 not covered by the first photoresist pattern but also a portion of the substrate 100 thereunder may be etched to form a third recess 117 having a depth greater than that of the first recess 110. Hereinafter, for the convenience of explanation, only the second recess 115 will be illustrated.

In example embodiments, the isolation pattern 120 may be formed by forming an isolation layer on the substrate 100 to sufficiently fill the first and second recesses 110 and 115, planarizing the isolation layer until the upper surface of the substrate 100 (e.g., top of the active fins 105) is exposed, and removing an upper portion of the isolation layer to expose upper portions of the first and second recesses 110 and 115. In certain embodiments, the isolation layer may be formed of an oxide, e.g., silicon oxide.

As the isolation pattern 120 is formed on the substrate 100, each active fin 105 may be divided into a lower active pattern 105*b* of which a sidewall may be covered by the isolation pattern 120, and an upper active pattern 105*a* not covered by the isolation pattern 120 but protruding therefrom. These may be referred to as an upper fin portion 105*a* and a lower fin portion 105*b*. In example embodiments, the upper active pattern 105*a* may have a width in the second direction that may be less (e.g., slightly less) than a width of the lower active pattern 105*b*. For example, widths of the upper active pattern 105*a* in the second direction above a boundary between the upper active pattern 105*a* and lower active pattern 105*b* may be greater than widths of the lower active pattern 105*b* in the second direction below the boundary.

A portion of the substrate 100 covered by the isolation pattern 120, for example, a portion of the substrate 100 on which no active fin 105 is formed may be described as a field region.

In example embodiments, the isolation pattern 120 may be formed to have a multi-layered structure. Particularly, the isolation pattern 120 may include first and second liners (not shown) sequentially stacked on an inner wall of each of the first and second recesses 110 and 115, and a filling insulation layer (not shown) filling a remaining portion of each of the first and second recesses 110 and 115 on the second liner. For example, the first liner may be formed of an oxide, e.g., silicon oxide, the second liner may be formed of a nitride, e.g., silicon nitride, or polysilicon, and the filling insulation layer may be formed of an oxide, e.g., silicon oxide.

Figure 6:
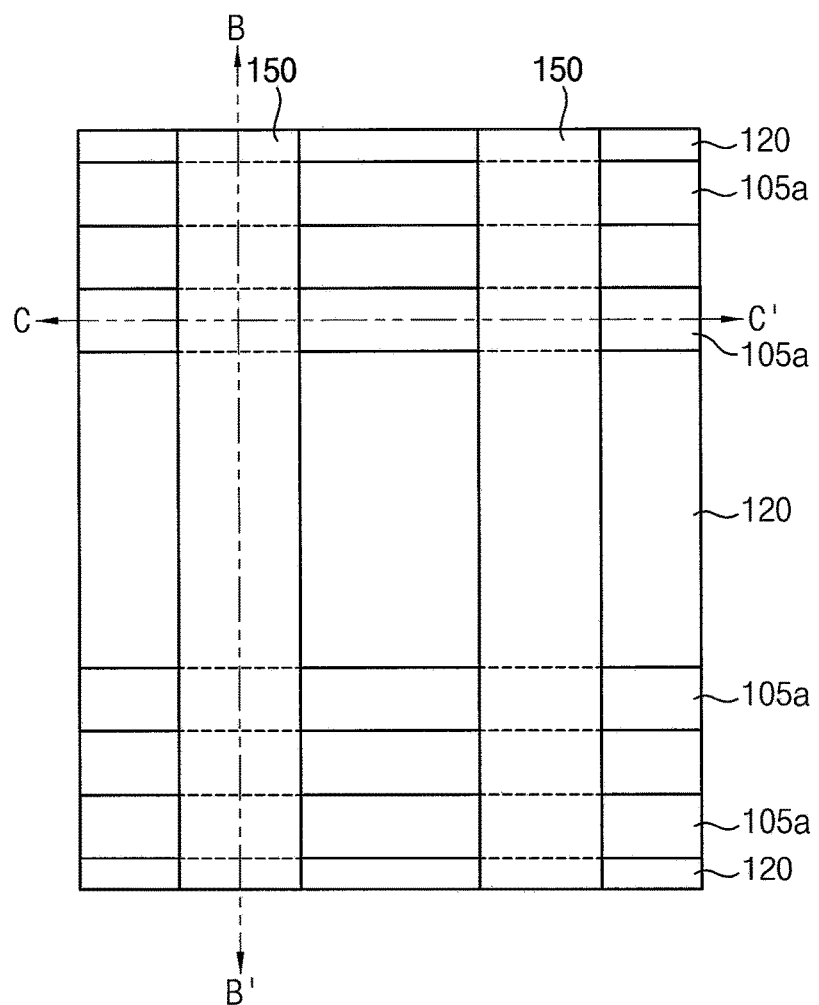
Figure 8:
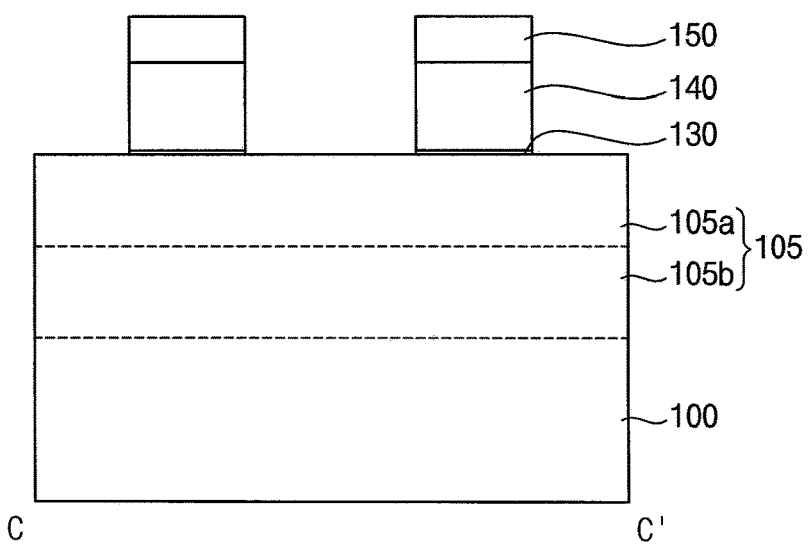

Referring to FIGS. 6 to 8, a dummy gate structure may be formed on the substrate 100.

The dummy gate structure may be formed by sequentially forming a dummy gate insulation layer, a dummy gate electrode layer and a dummy gate mask layer on the active fins 105 of the substrate 100 and the isolation pattern 120, patterning the dummy gate mask layer through a photolithography process using a second photoresist pattern (not shown) to form a dummy gate mask 150, and sequentially etching the dummy gate electrode layer and the dummy gate insulation layer using the dummy gate mask 150 as an etching mask. Thus, the dummy gate structure may include a sequentially stacked dummy gate insulation pattern 130, dummy gate electrode 140, and dummy gate mask 150 on the active fins 105 of the substrate 100 and a portion of the isolation pattern 120 adjacent thereto.

In some embodiments, the dummy gate insulation layer may be formed of an oxide, e.g., silicon oxide, the dummy gate electrode layer may be formed of, e.g., polysilicon, and the dummy gate mask layer may be formed of a nitride, e.g., silicon nitride. For example, the dummy gate insulation layer may be formed by a chemical vapor deposition (CVD) process, an atomic layer deposition (ALD) process, etc. Alternatively, the dummy gate insulation layer may be formed by a thermal oxidation process on an upper portion of the substrate 100, and in this case, the dummy gate insulation layer may be formed only on the upper active pattern 105*a*. The dummy gate electrode layer and the dummy gate mask layer may be formed by a CVD process, an ALD process, etc.

In example embodiments, the dummy gate structure may be formed to extend in the second direction on the active fins 105 of the substrate 100 and the isolation pattern 120, and a plurality of dummy gate structures may be formed to be spaced apart from each other in the first direction.

An ion implantation process may be performed to form an impurity region (not shown) at an upper portion of the active fin 105 adjacent the dummy gate structure.

Figure 9:
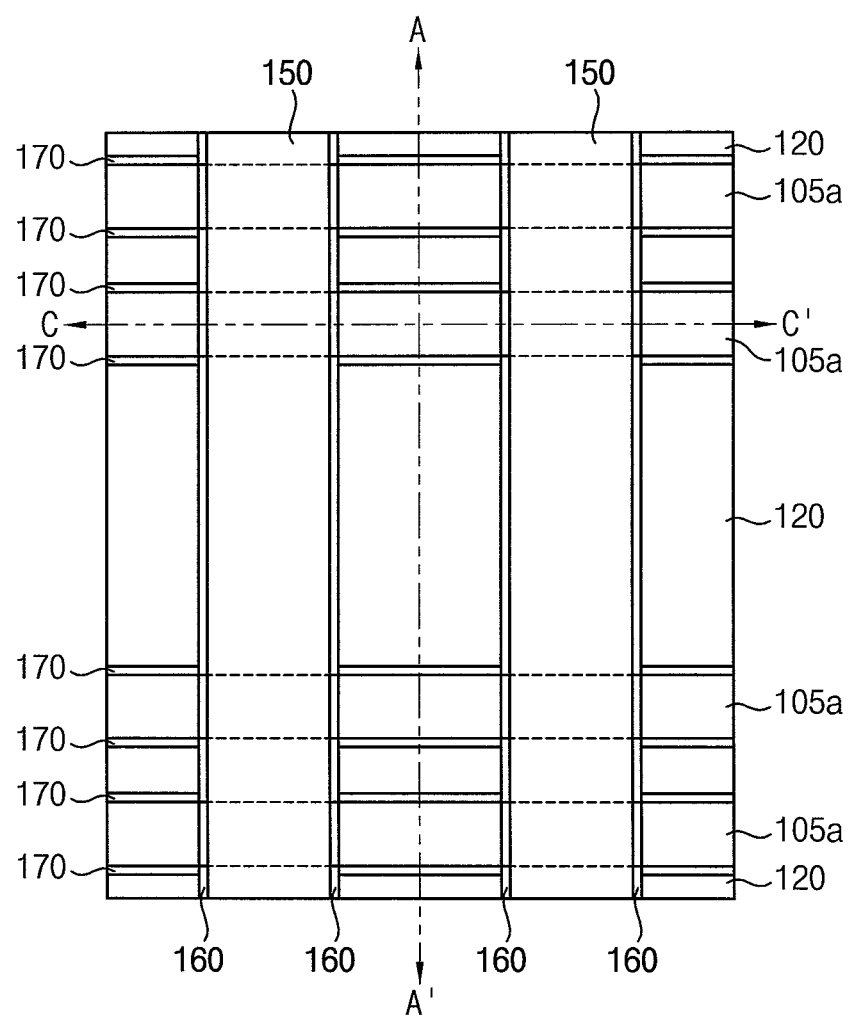
Figure 10:
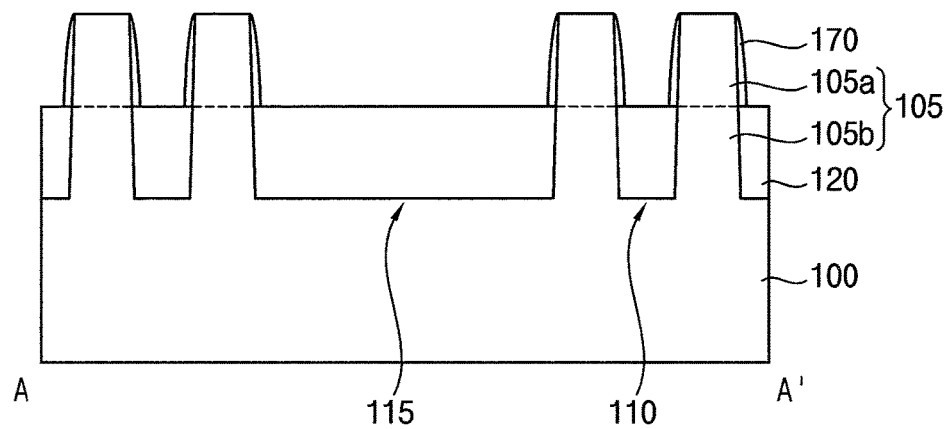
Figure 11:
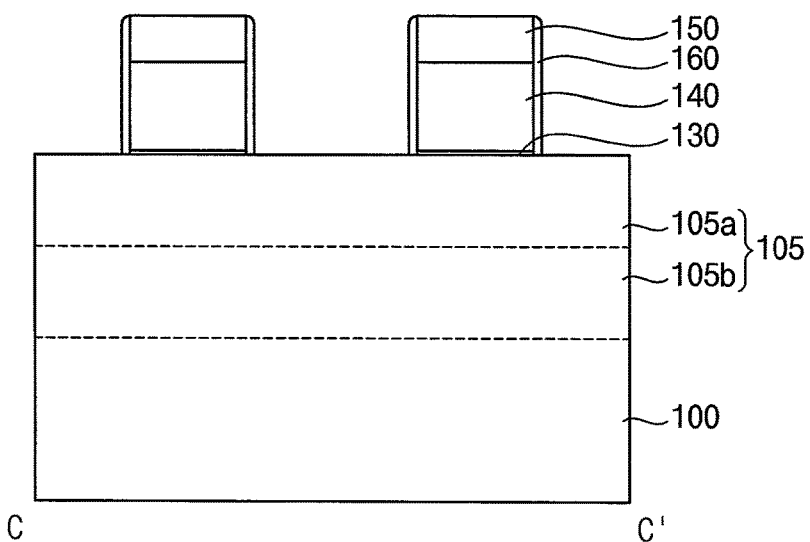

Referring to FIGS. 9 to 11, a gate spacer 160 may be formed on a sidewall of the dummy gate structure, and a fin spacer 170 may be formed on a sidewall of the active fin 105.

In example embodiments, the gate spacer 160 and the fin spacer 170 may be formed by forming a spacer layer on the dummy gate structure, the active fin 105 and the isolation pattern 120, and anisotropically etching the spacer layer. The spacer layer may be formed of a nitride, e.g., silicon nitride.

The gate spacer 160 may be formed on opposite sidewalls of the dummy gate structure in the first direction, and the fin spacer 170 may be formed on opposite sidewalls of the dummy gate structure in the second direction.

Figure 12:
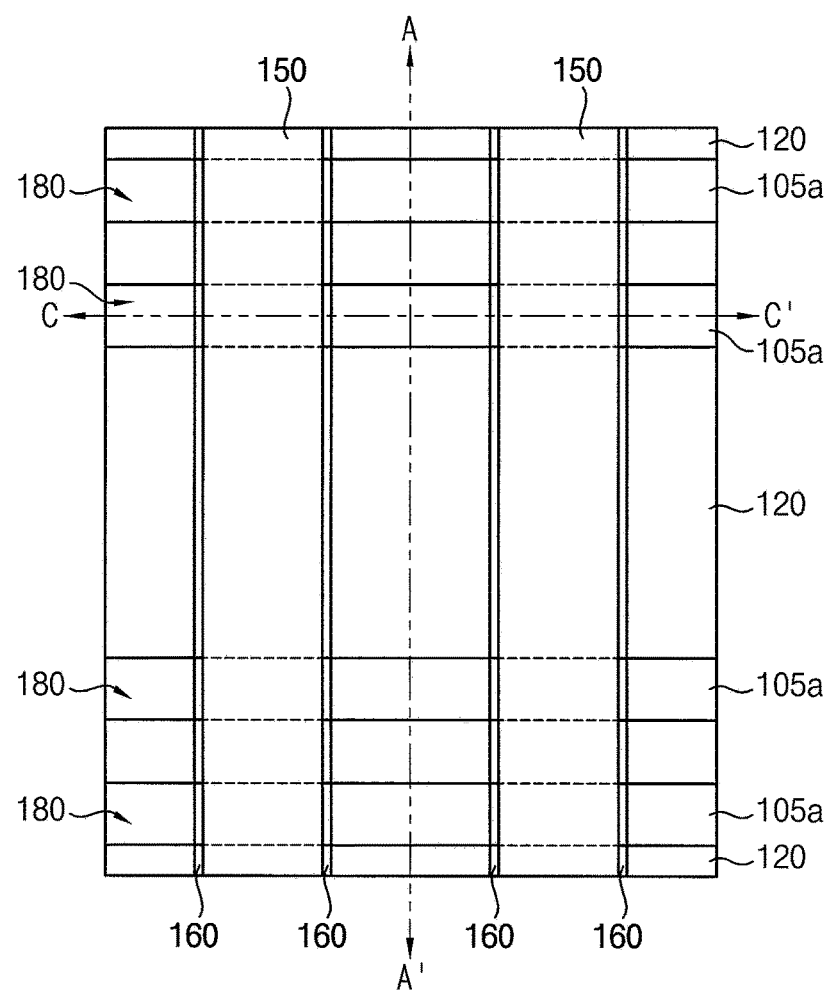
Figure 12:
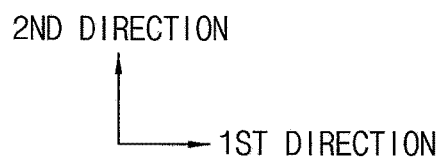
Figure 13:
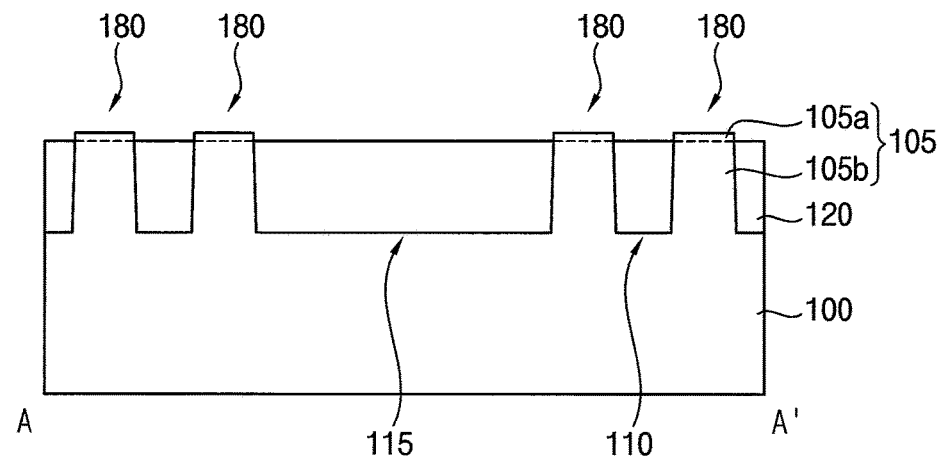
Figure 14:
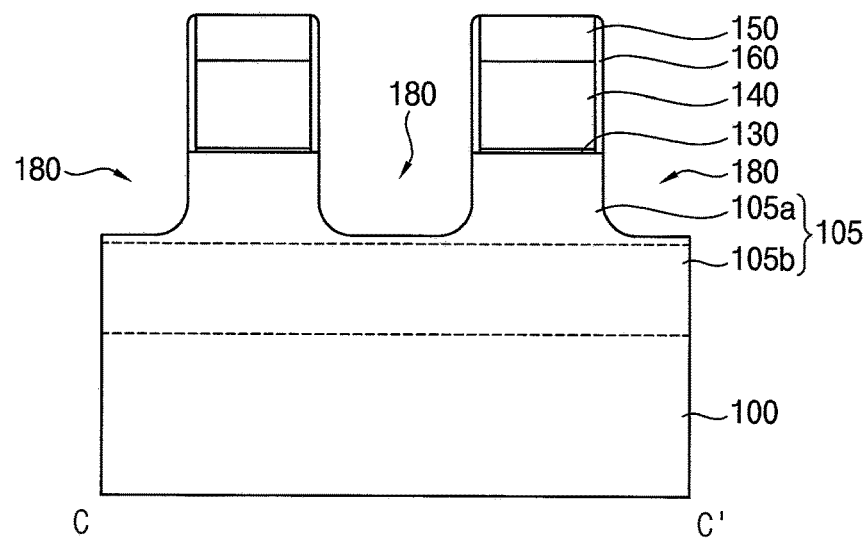

Referring to FIGS. 12 to 14, an upper portion of the active fin 105 adjacent the dummy gate structure may be etched to form a fourth recess 180 (e.g., a plurality of fourth recesses 180).

Particularly, the upper portion of the active fin 105 may be removed using the dummy gate structure and the gate spacer 160 as an etching mask to form the fourth recess 180. The fin spacer 170 may be also removed.

FIGS. 12 to 14 show that the upper active pattern 105*a* of the active fin 105 may be partially removed to form the fourth recess 180, however, the inventive concepts are not limited thereto. In example embodiments, not only the upper active pattern 105*a* but also a portion of the lower active pattern 105*b* may be removed to form the fourth recess 180.

In example embodiments, the etching process for forming the gate spacer 160 and the etching process for forming the fourth recess 180 may be performed in-situ (e.g., without removing the substrate from a chamber and/or without a vacuum break in the chamber).

Figure 15:
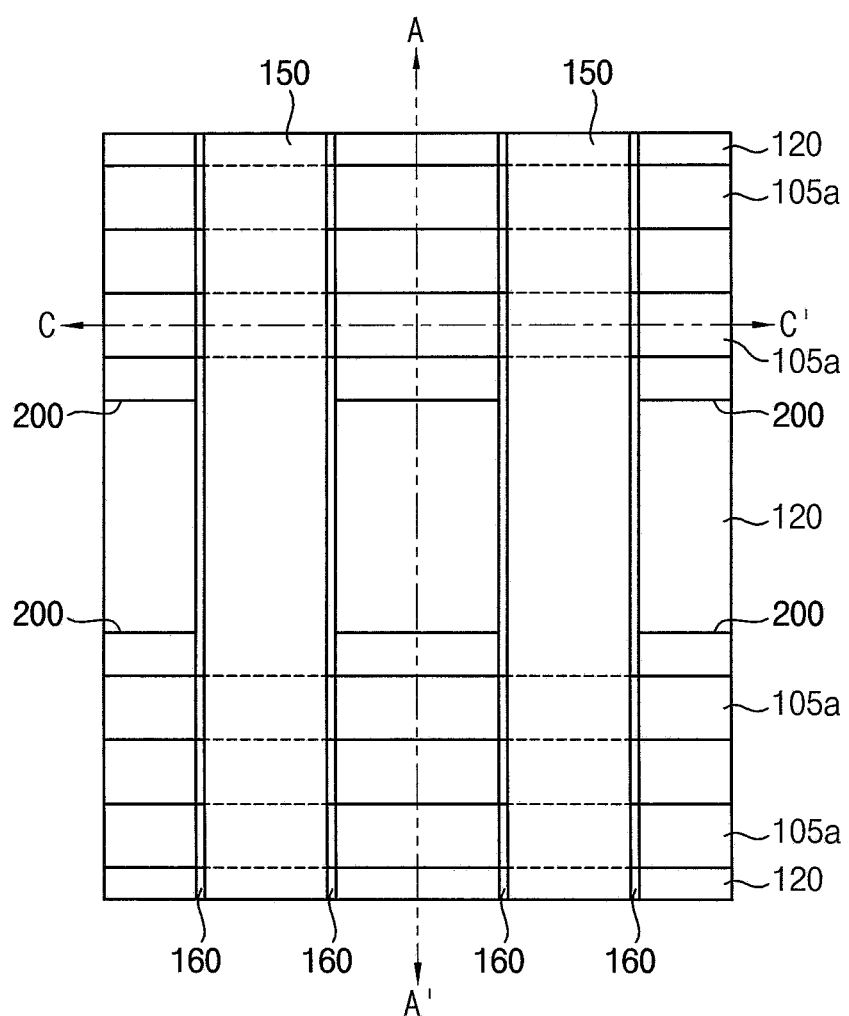
Figure 16:
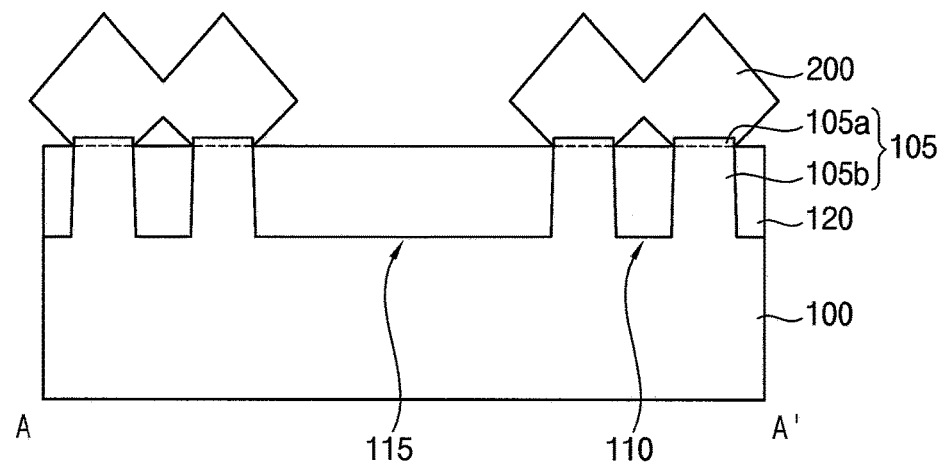
Figure 17:
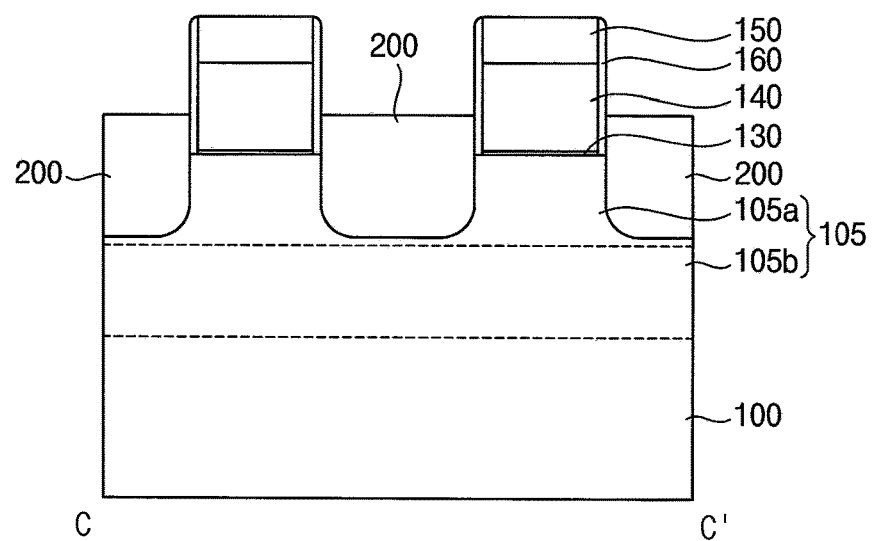

Referring to FIGS. 15 to 17, a source/drain layer 200 may be formed on the active fin 105 to fill the fourth recess 180.

In example embodiments, the source/drain layer 200 may be formed by a selective epitaxial growth (SEG) process using an upper surface of the active fin 105 exposed by the fourth recess 180 as a seed.

In example embodiments, the source/drain layer 200 may be formed by performing an SEG process using a silicon source gas, e.g., dichlorosilane ($SiH_2Cl_2$) gas, a germanium source gas, e.g., germane ($GeH_4$) gas to form a single crystalline silicon-germanium layer. In example embodiments, a p-type impurity source gas, e.g., diborane ($B_2H_6$) gas may be also used to form a single crystalline silicon-germanium layer doped with p-type impurities. Thus, in these example embodiments, the source/drain layer 200 may serve as a source/drain region of a positive-channel metal oxide semiconductor (PMOS) transistor.

In example embodiments, the source/drain layer 200 may be formed by an SEG process using a silicon source gas, e.g., disilane ($Si_2H_6$) gas and a carbon source gas, e.g., monomethylsilane ($SiH_3CH_3$) gas to form a single crystalline silicon carbide layer. Alternatively, the SEG process may be performed using only the silicon source gas, e.g., disilane ($Si_2H_6$) gas to form a single crystalline silicon layer. In example embodiments, an n-type impurity source gas, e.g., phosphine ($PH_3$) gas may be also used to form a single crystalline silicon carbide layer doped with n-type impurities or a single crystalline silicon layer doped with n-type impurities. Thus, in these example embodiments, the source/drain layer 200 may serve as a source/drain region of a negative-channel metal oxide semiconductor (NMOS) transistor.

The source/drain layer 200 may fill the fourth recess 180, and may be further grown to contact a portion of the gate spacer 160. The source/drain layer 200 may grow not only in the vertical direction but also in the horizontal direction, and thus may have a cross-section taken along the second direction of which a shape may be pentagon or hexagon. In example embodiments, individual ones of the source/drain layers 200 on the active fins 105 spaced apart from each other in the second direction by a short distance (e.g., spaced apart by the first recesses 110) may grow to be merged with each other. FIGS. 15 to 17 show examples of a merged source/drain layer 200 on two active fins 105.

Figure 18:
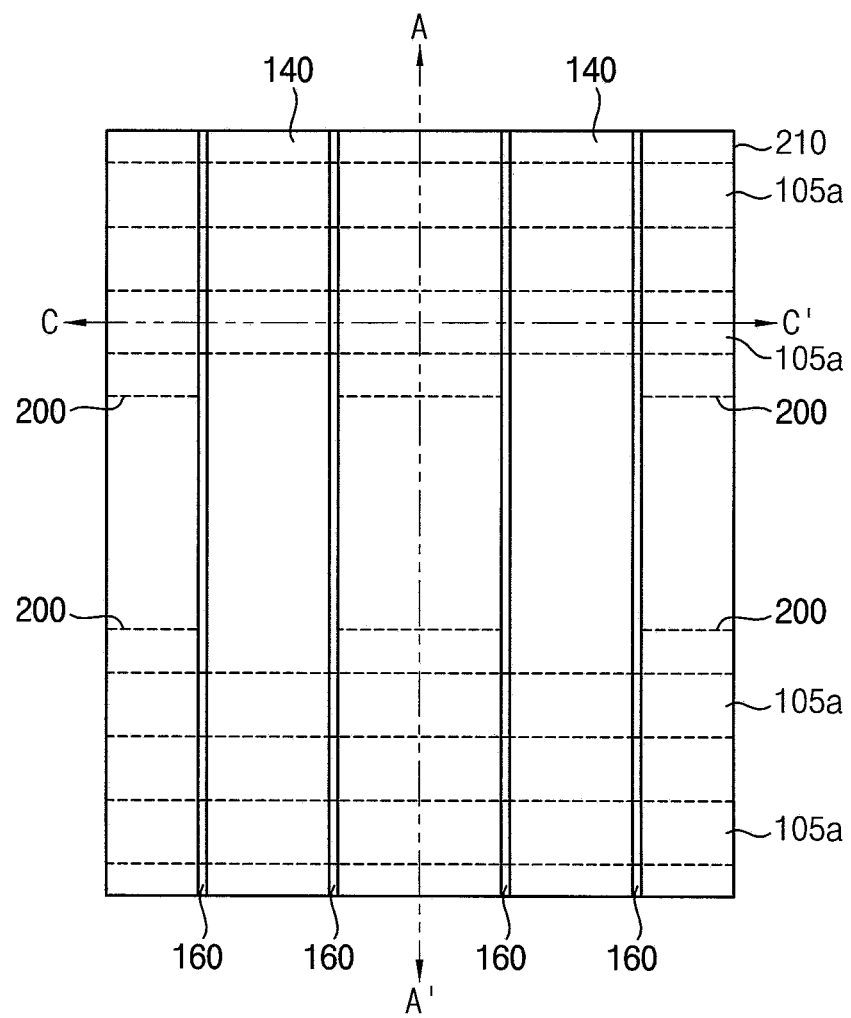
Figure 19:
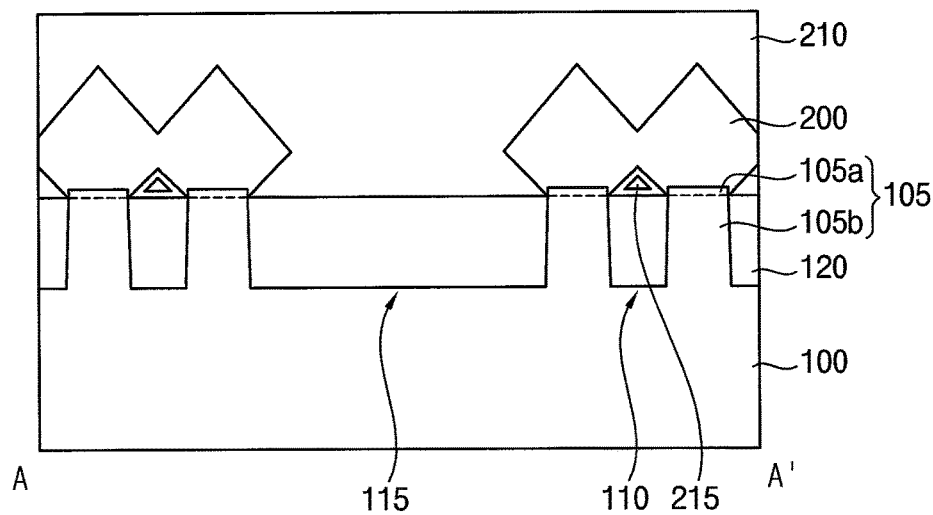
Figure 20:
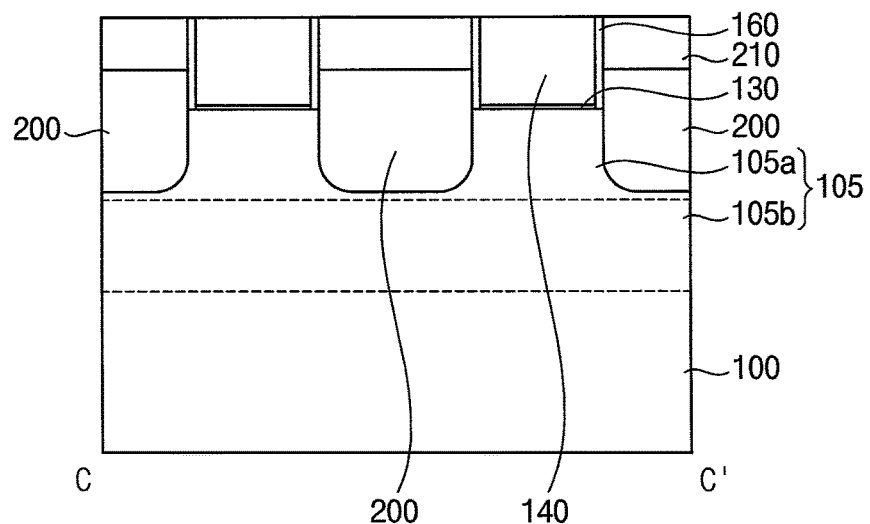

Referring to FIGS. 18 to 20, an insulation layer 210 may be formed on the active fin 105 and the isolation pattern 120 to cover the dummy gate structure, the gate spacer 160, and the source/drain layer 200 to a sufficient height, and may be planarized until an upper surface of the dummy gate electrode 140 of the dummy gate structure is exposed.

In the planarization process, the dummy gate mask 150 may be removed, and an upper portion of the gate spacer 160 may be partially removed.

A space between the merged source/drain layer 200 and the isolation pattern 120 may not be filled with the insulation layer 210, and thus an air gap 215 may be formed.

The insulation layer 210 may be formed, for example, of silicon oxide, e.g., tonen silazene (TOSZ). The planarization process may be performed by a CMP process and/or an etch back process. The term "air gap" refers to a space where solid and/or liquid material is absent. Such a gap may be filled with atmospheric air, or with other gases that may be present during the manufacturing process.

Figure 21:
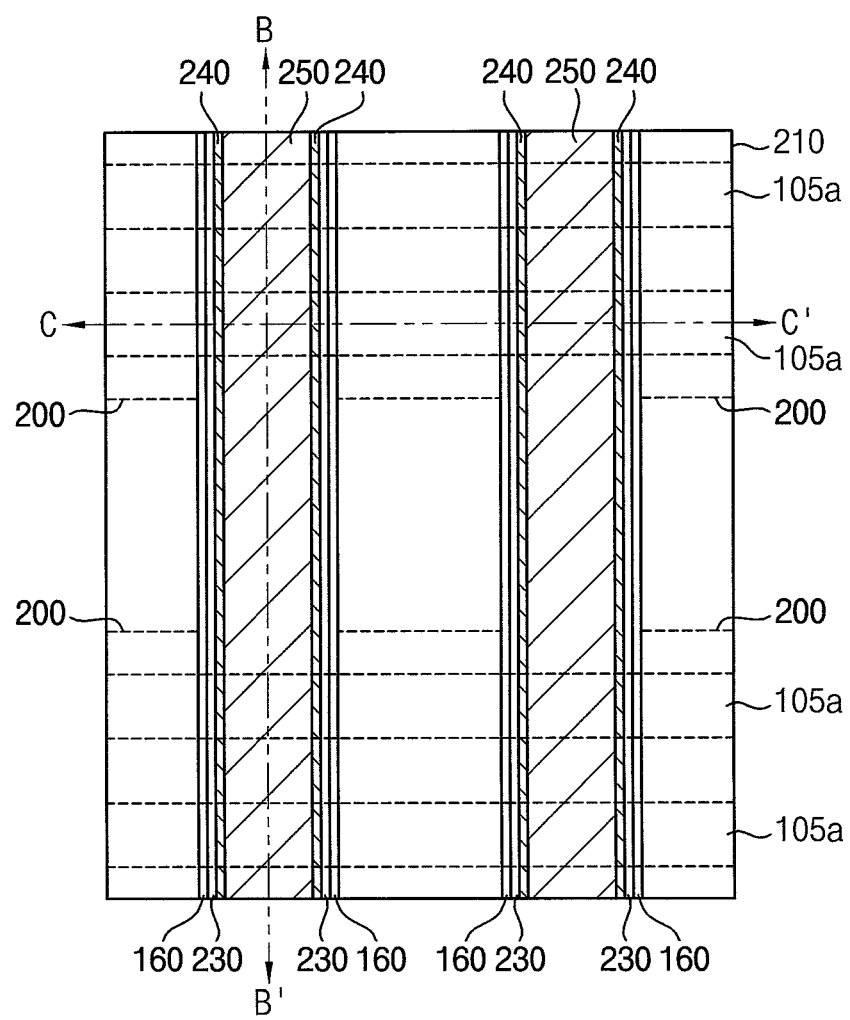
Figure 21:
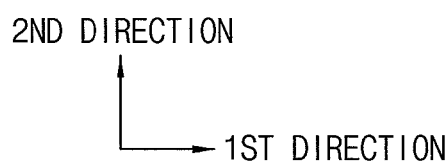
Figure 23:
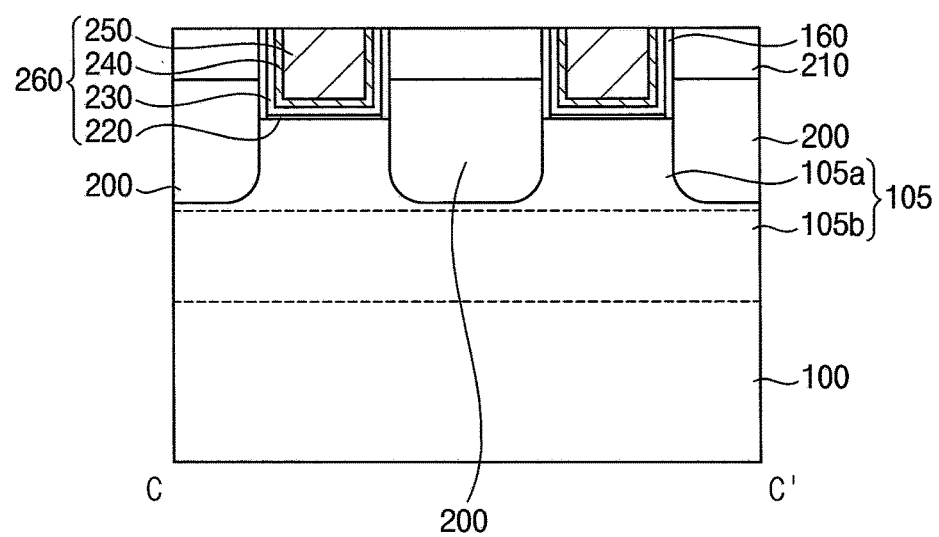

Referring to FIGS. 21 and 23, the exposed dummy gate electrode 140 and the dummy gate insulation pattern 130 thereunder may be removed to form a first opening (not shown) exposing an inner sidewall of the gate spacer 160 and an upper surface of the active fin 105, and a gate structure 260 may be formed to fill the first opening.

Particularly, after performing a thermal oxidation process on the upper surface of the active fin 105 exposed by the first opening to form an interface pattern 220, a gate insulation layer and a work function control layer may be sequentially formed on the interface pattern 220, the isolation pattern 120, the gate spacer 160, and the insulation layer 210, and a gate electrode layer may be formed on the work function control layer to sufficiently fill a remaining portion of the first opening.

The gate insulation layer may be formed, for example, of a metal oxide having a high dielectric constant, e.g., hafnium oxide, tantalum oxide, zirconium oxide, or the like, by a CVD process or an ALD process. The work function control layer may be formed, for example, of a metal nitride or a metal alloy, e.g., titanium nitride, titanium aluminum, titanium aluminum nitride, tantalum nitride, tantalum aluminum nitride, etc., and the gate electrode layer may be formed of a material having a low resistance, e.g., a metal such as aluminum, copper, tantalum, etc., or a metal nitride thereof. The work function control layer and the gate electrode layer may be formed, for example, by an ALD process, a physical vapor deposition (PVD) process, or the like. In an example embodiment, a heat treatment process, e.g., a rapid thermal annealing (RTA) process, a spike rapid thermal annealing (spike RTA) process, a flash rapid thermal annealing (flash RTA) process or a laser annealing process may be further performed.

The interface pattern 220 may be formed instead of the thermal oxidation process, by a CVD process, an ALD process, or the like, similarly to the gate insulation layer or the gate electrode layer. In this case, the interface pattern 220 may be formed not only on the upper surface of the active fin 105 but also on the upper surface of the isolation pattern 120 and the inner sidewall of the gate spacer 160.

The gate electrode layer, the work function control layer, and the gate insulation layer may be planarized until an upper surface of the insulation layer 210 is exposed to form a gate insulation pattern 230 and a work function control pattern 240 sequentially stacked on the interface pattern 220, the isolation pattern 120, and the inner sidewall of the gate spacer 160, and a gate electrode 250 filling the remaining portion of the first opening on the work function control pattern 240.

Accordingly, a bottom and a sidewall of the gate electrode 250 may be covered by the work function control pattern 240. In example embodiments, the planarization process may be performed by a CMP process and/or an etch back process.

The interface pattern 220, the gate insulation pattern 230, the work function control pattern 240 and the gate electrode 250 sequentially stacked may form the gate structure 260, and the gate structure 260 together with the source/drain layer 200 may form a PMOS transistor or an NMOS transistor.

Figure 24:
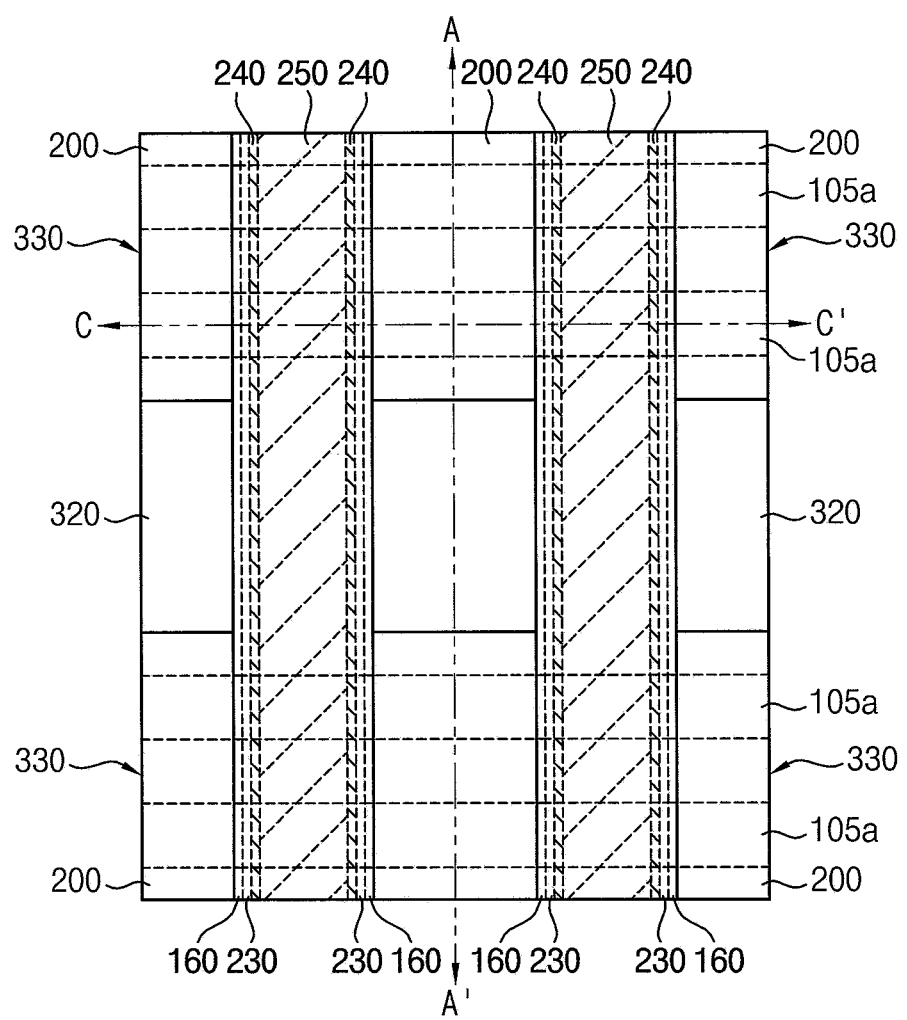
Figure 25:
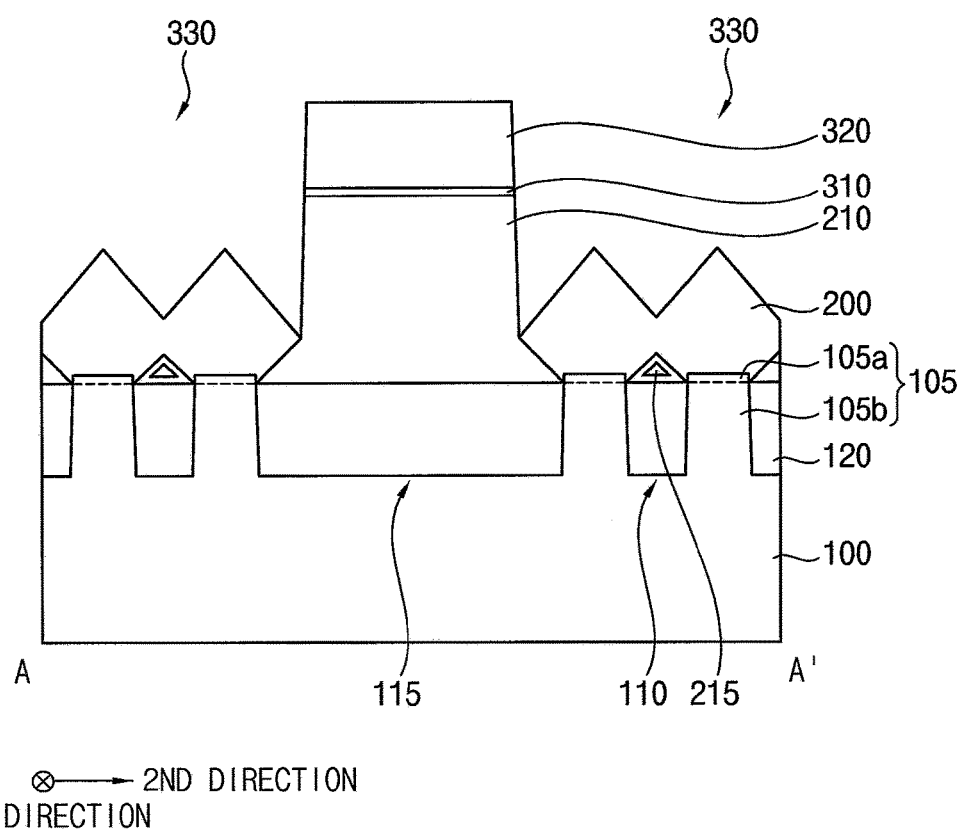
Figure 26:
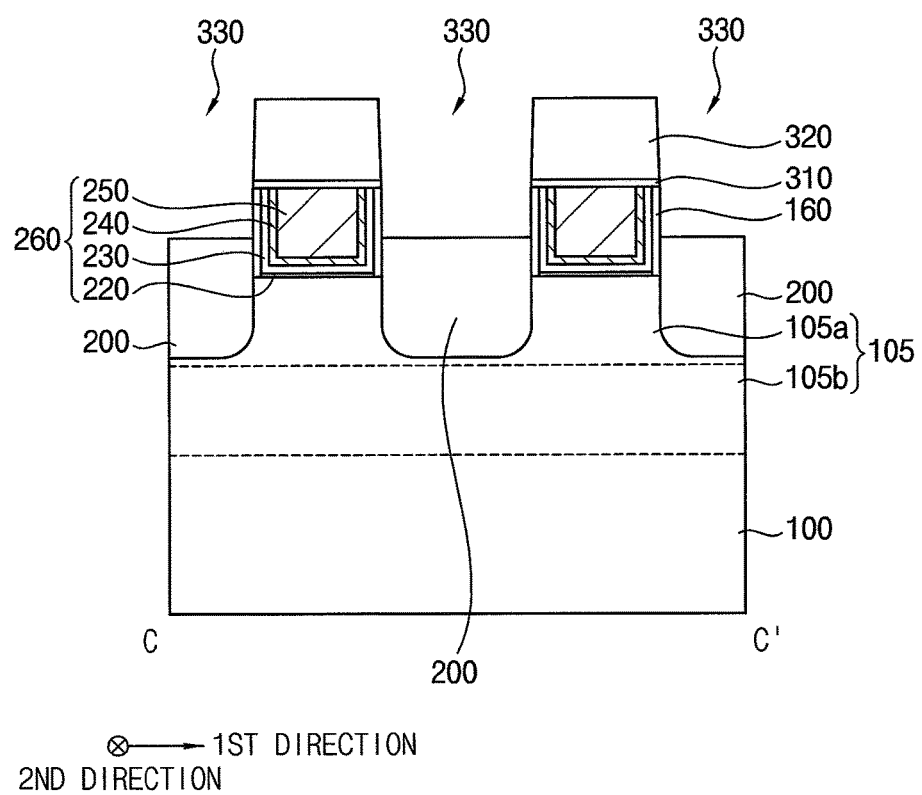

Referring to FIGS. 24 to 26, a capping layer 310 and a first insulating interlayer 320 may be sequentially formed on the insulation layer 210, the gate structure 260, and the gate spacer 160, and a second opening 330 may be formed through the insulation layer 210, the capping layer 310 and the first insulating interlayer 320 to expose an upper surface of the source/drain layer 200.

In certain embodiments, the capping layer 310 may be formed of a nitride, e.g., silicon nitride, silicon oxynitride, silicon carbonitride, silicon oxycarbonitride, etc., and the insulating interlayer 320 may be formed of silicon oxide, e.g., tetra ethyl ortho silicate (TEOS).

Figure 27:
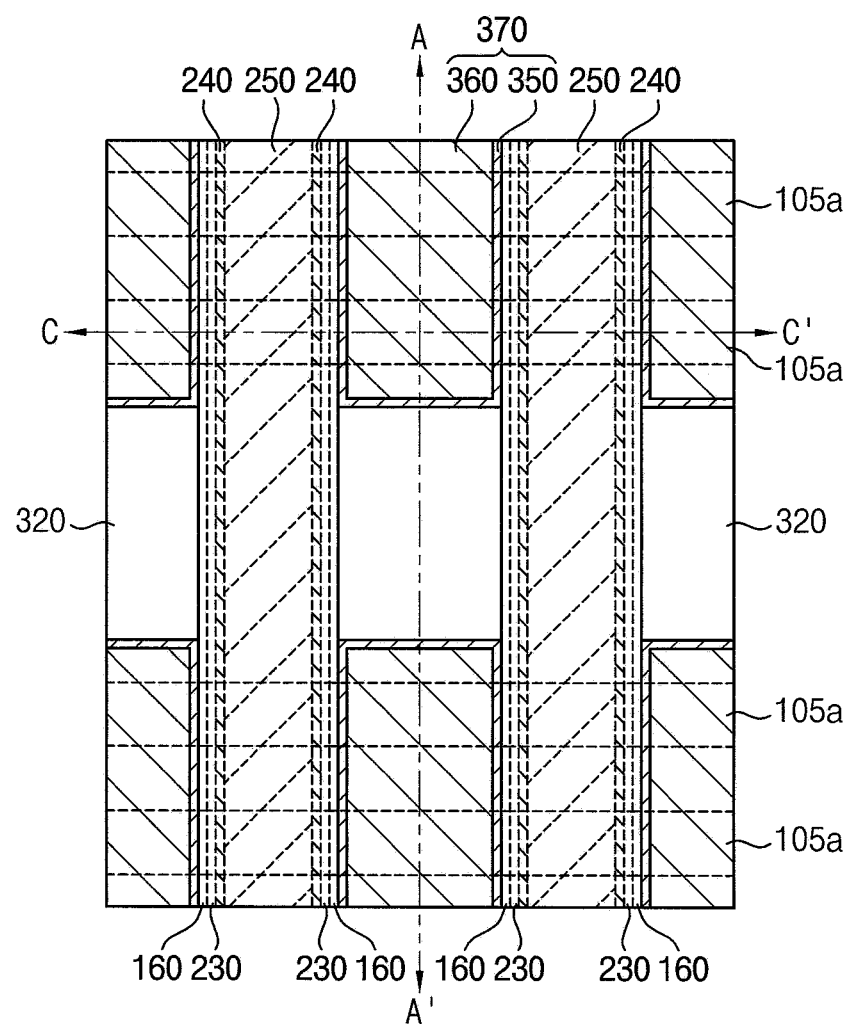
Figure 28:
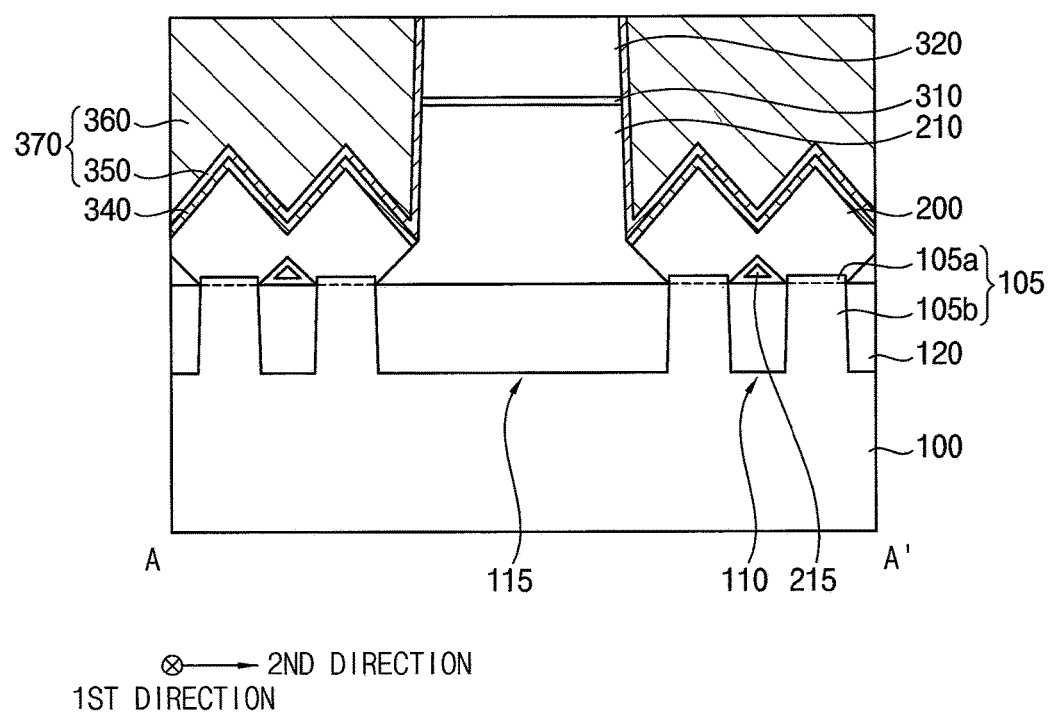
Figure 29:
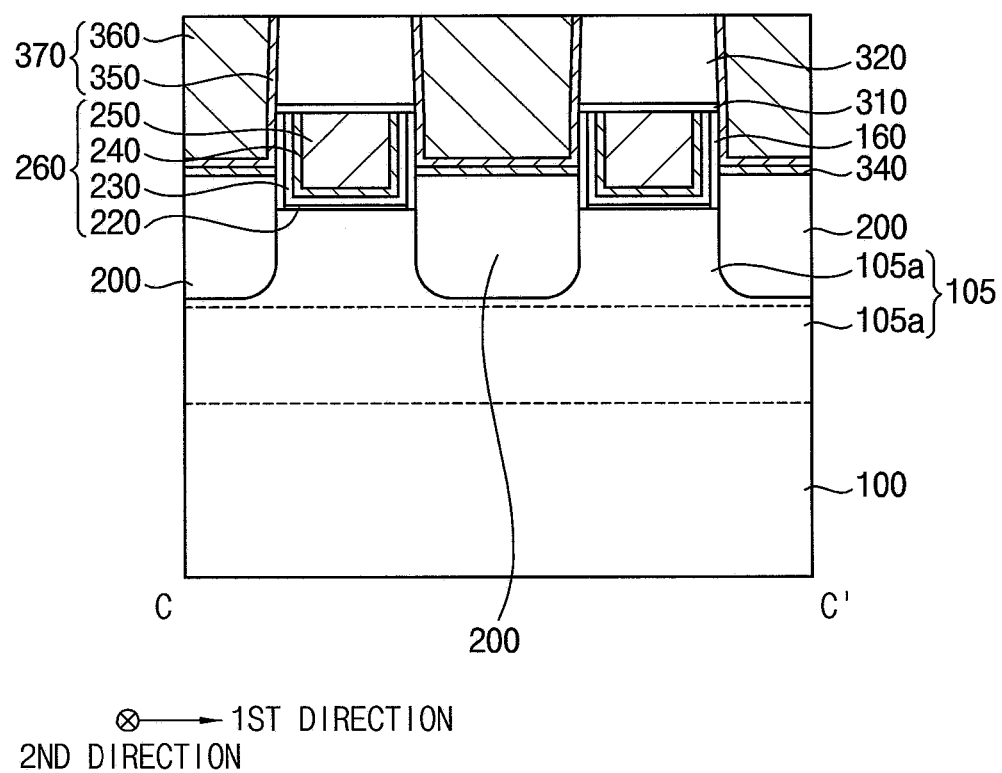
Figure 30:
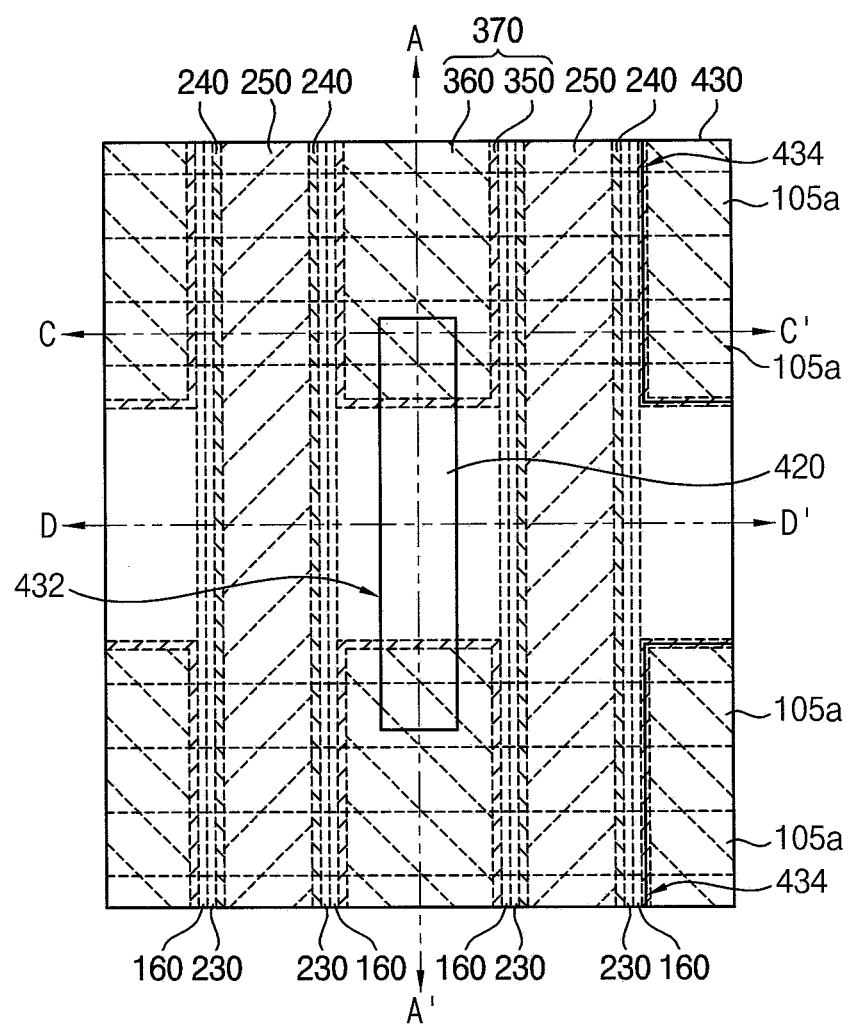
Figure 30:
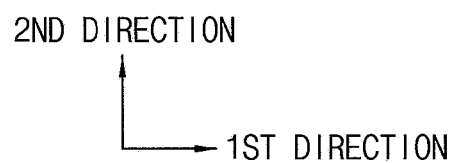
Figure 31:
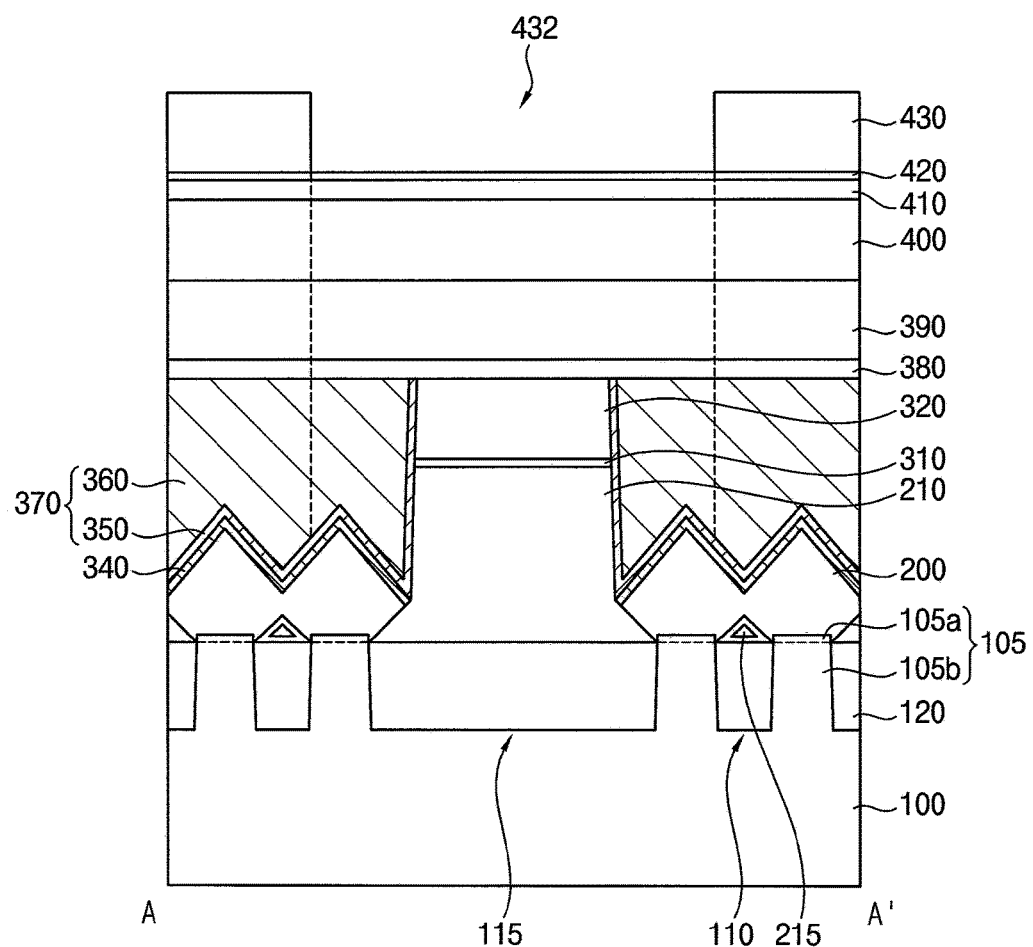
Figure 32:
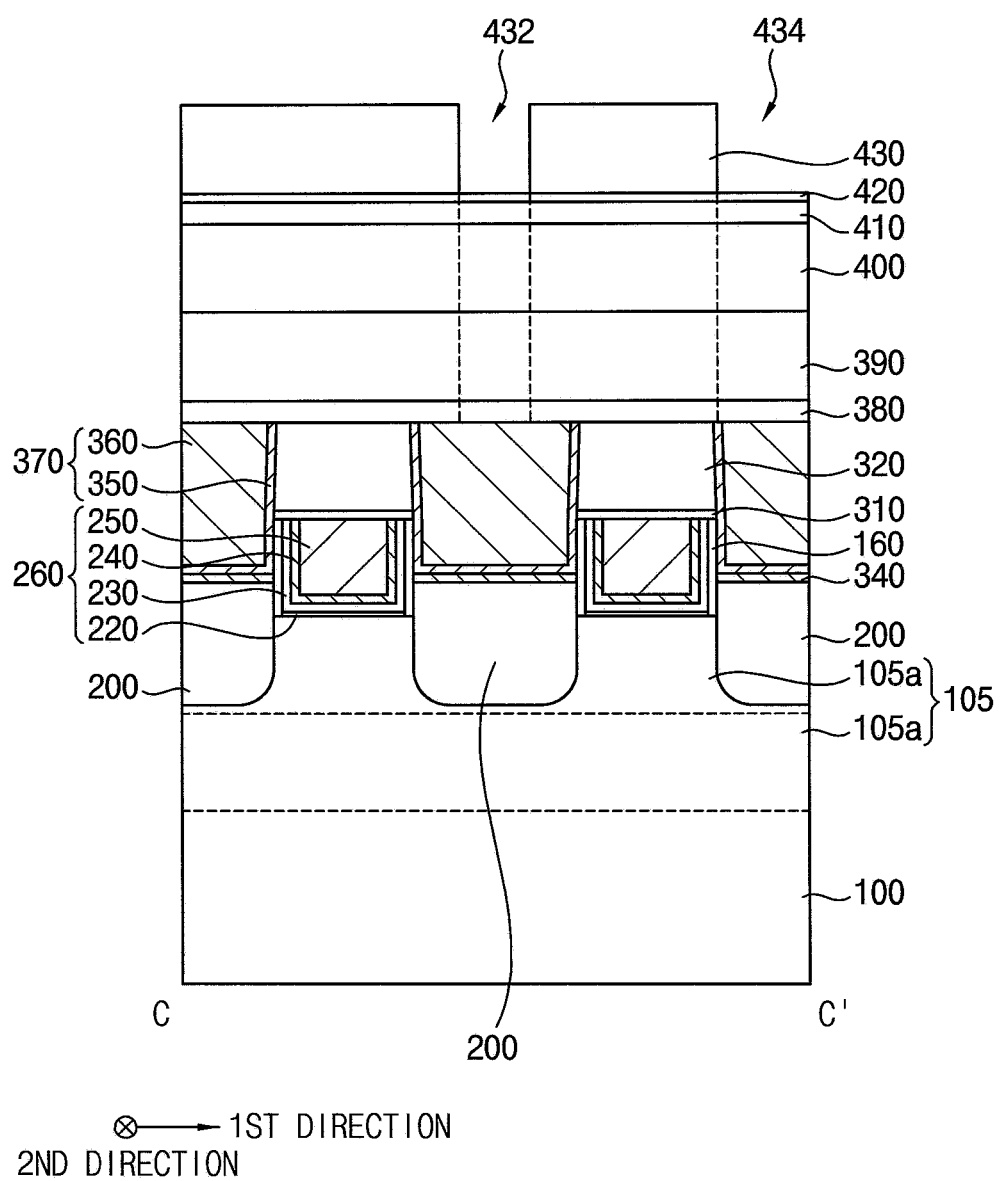
Figure 33:
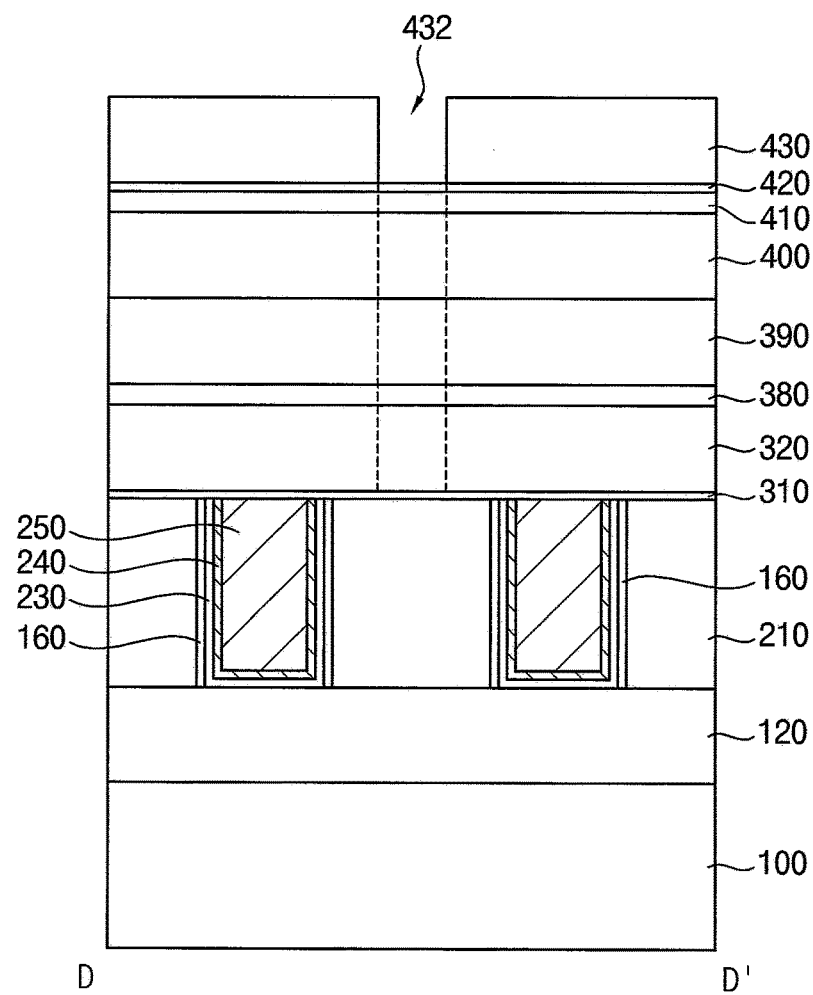
Figure 34:
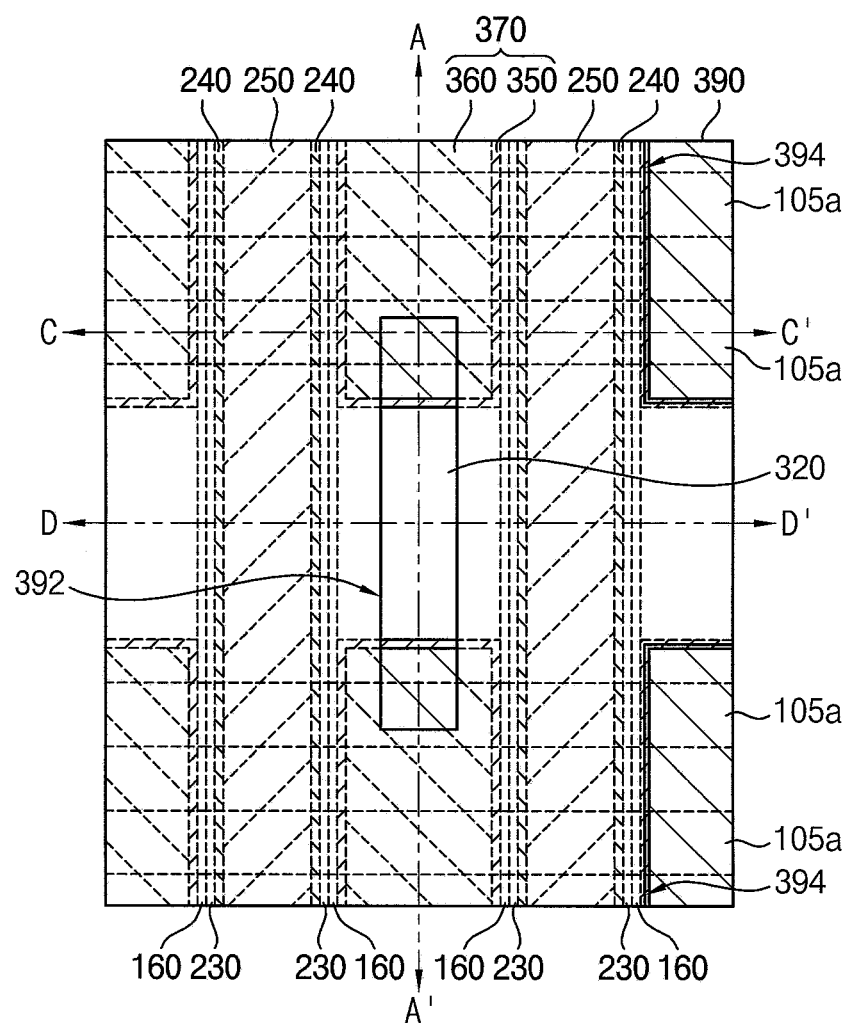
Figure 35:
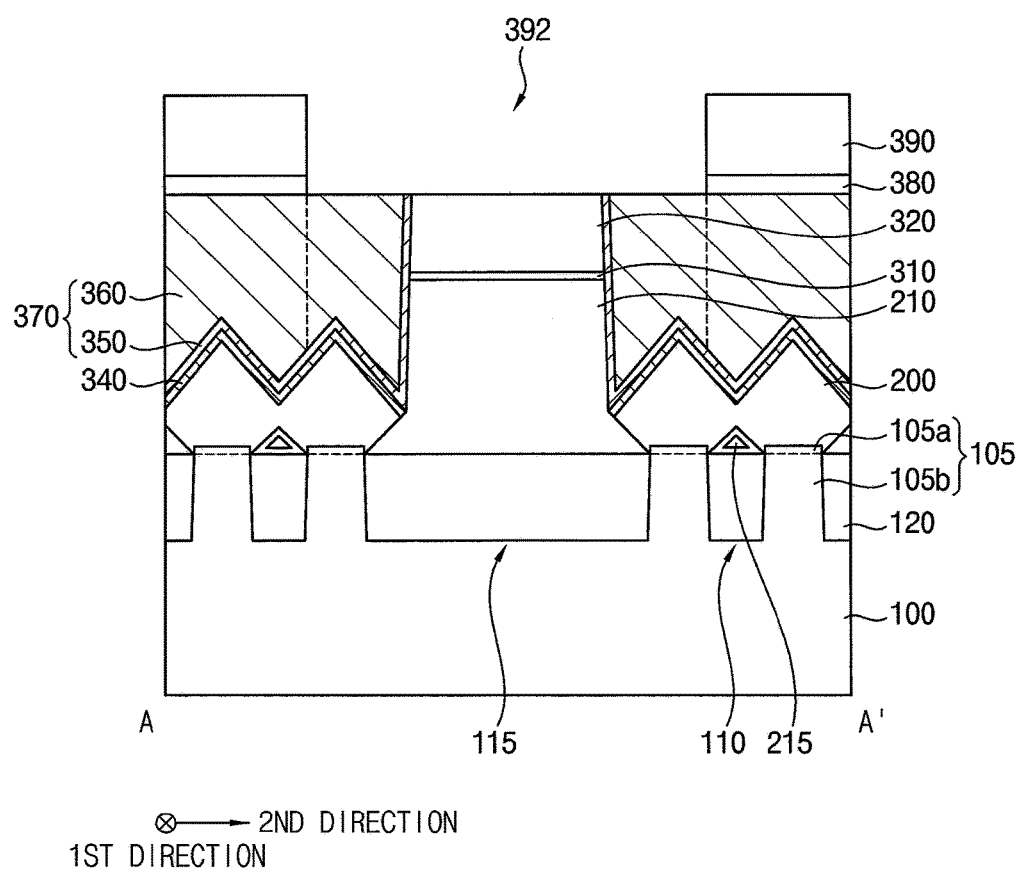
Figure 36:
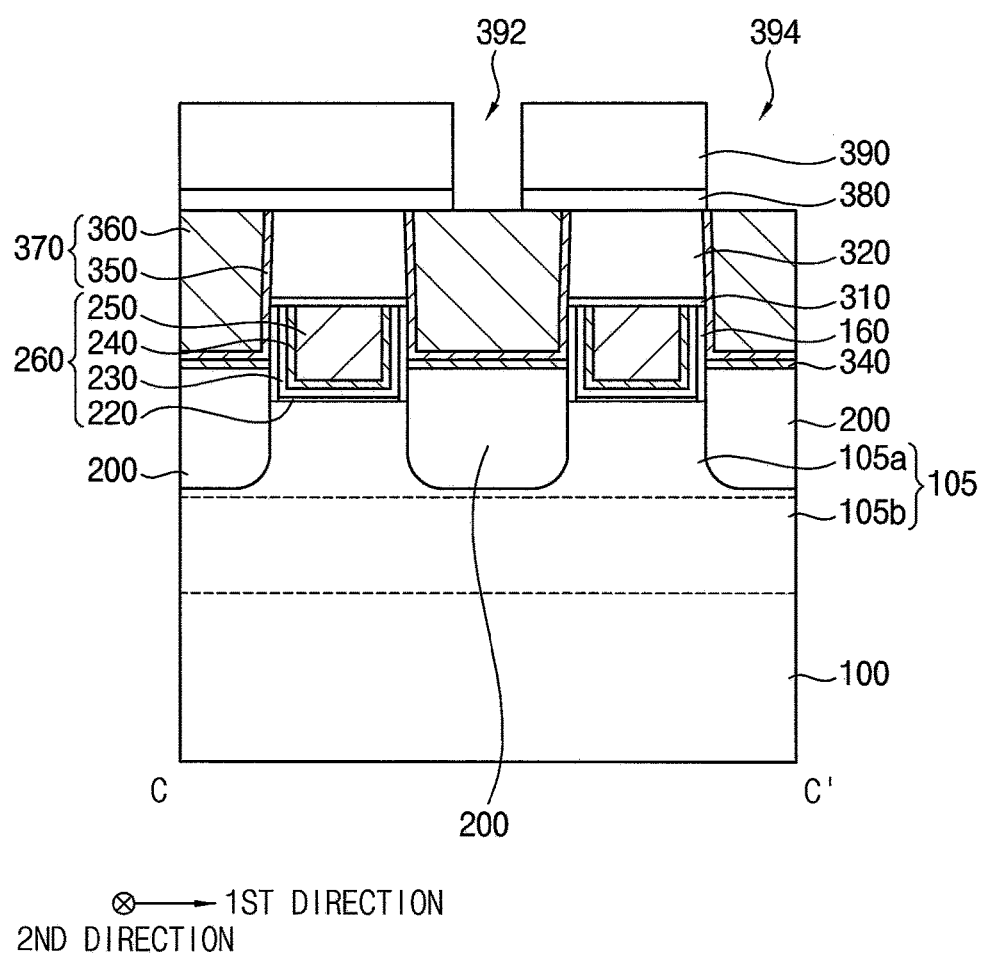
Figure 37:
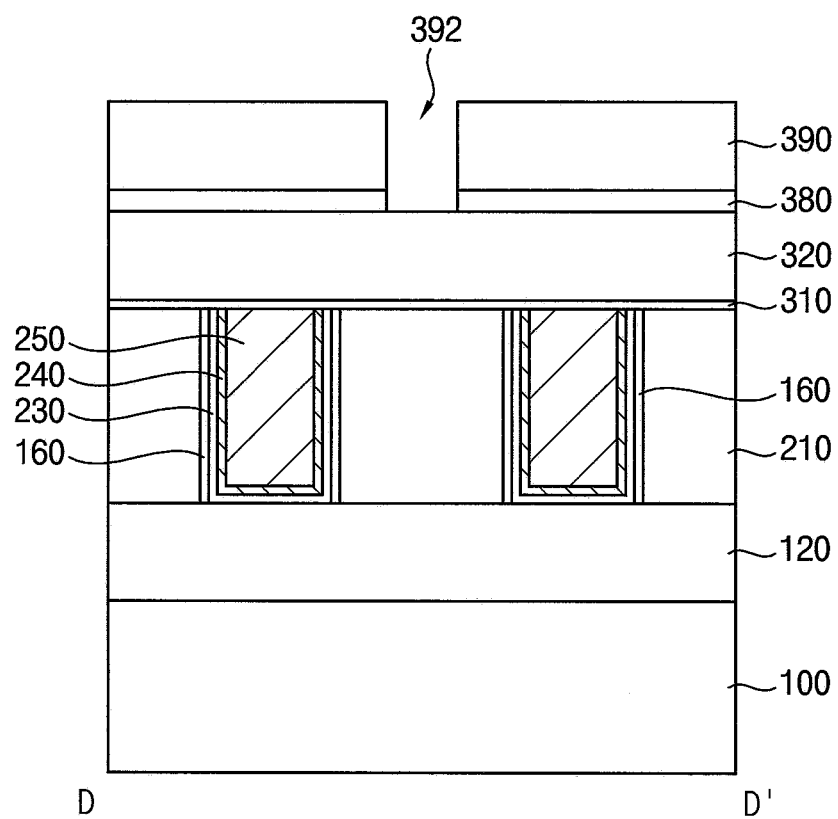
Figure 38:
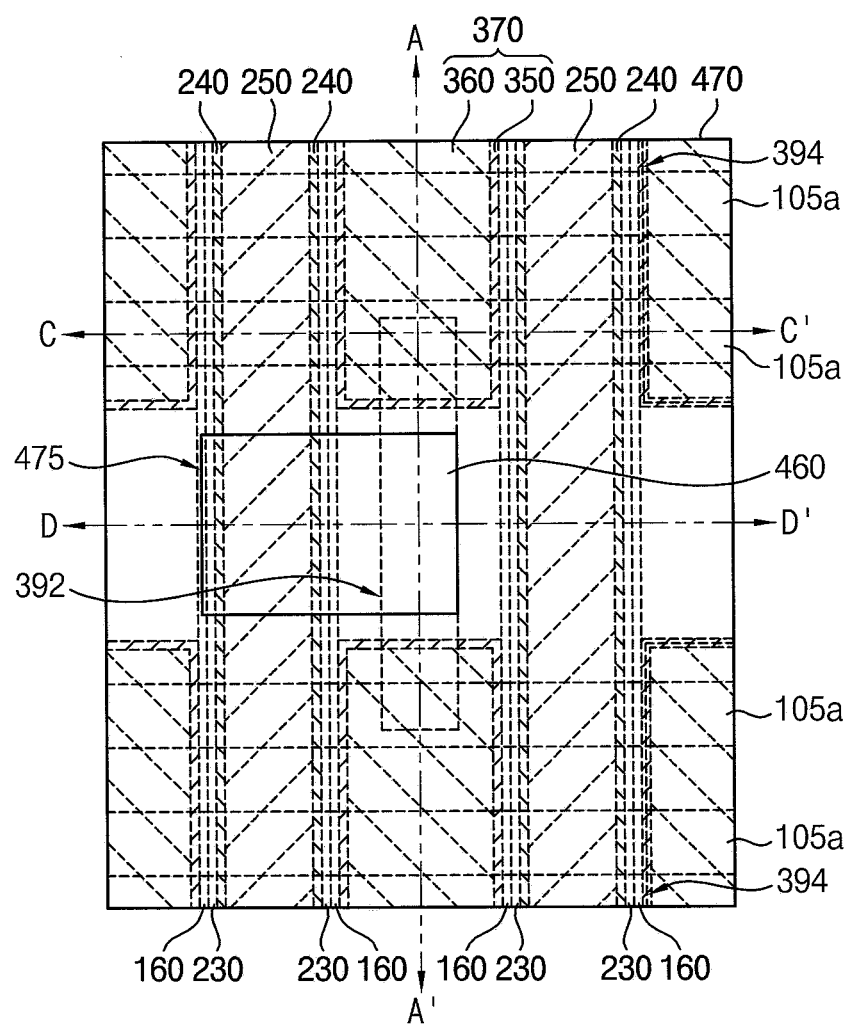
Figure 39:
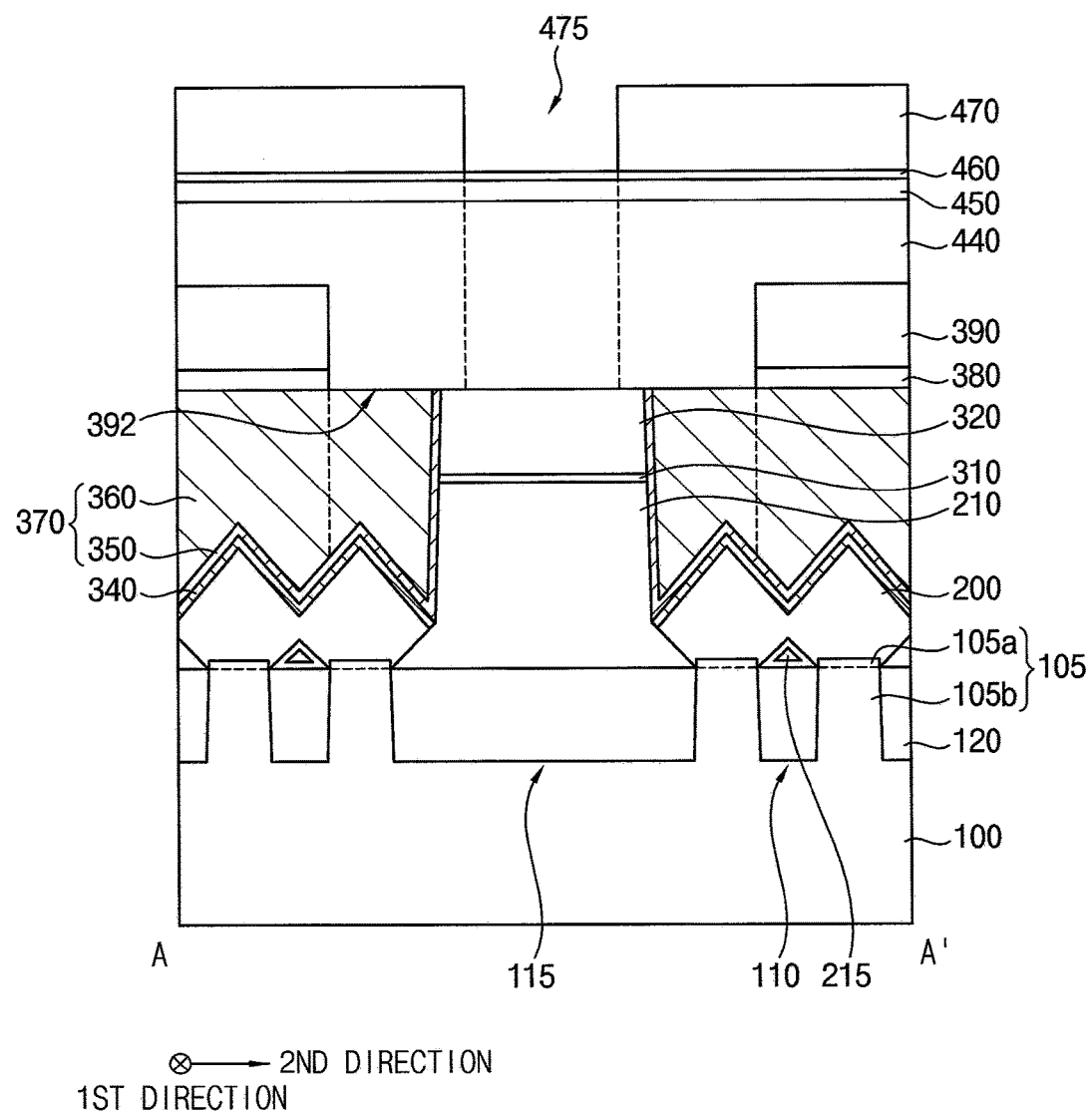
Figure 40:
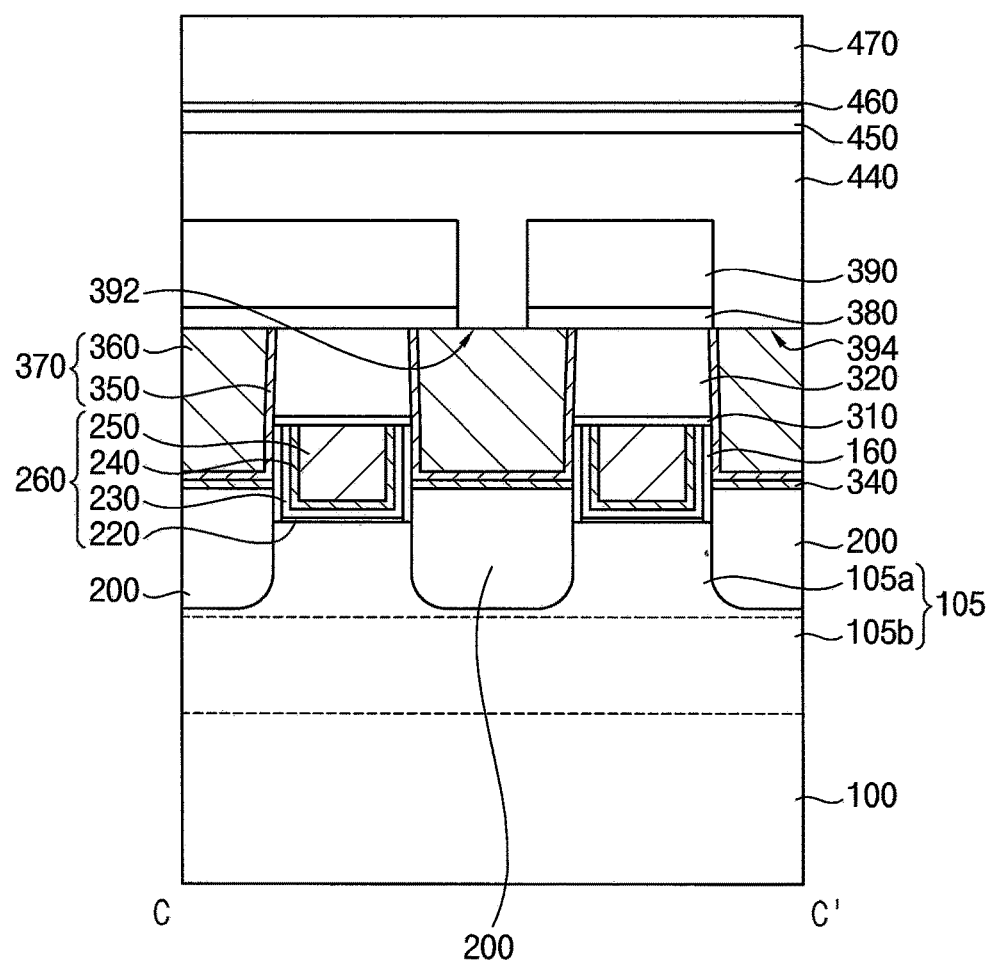
Figure 41:
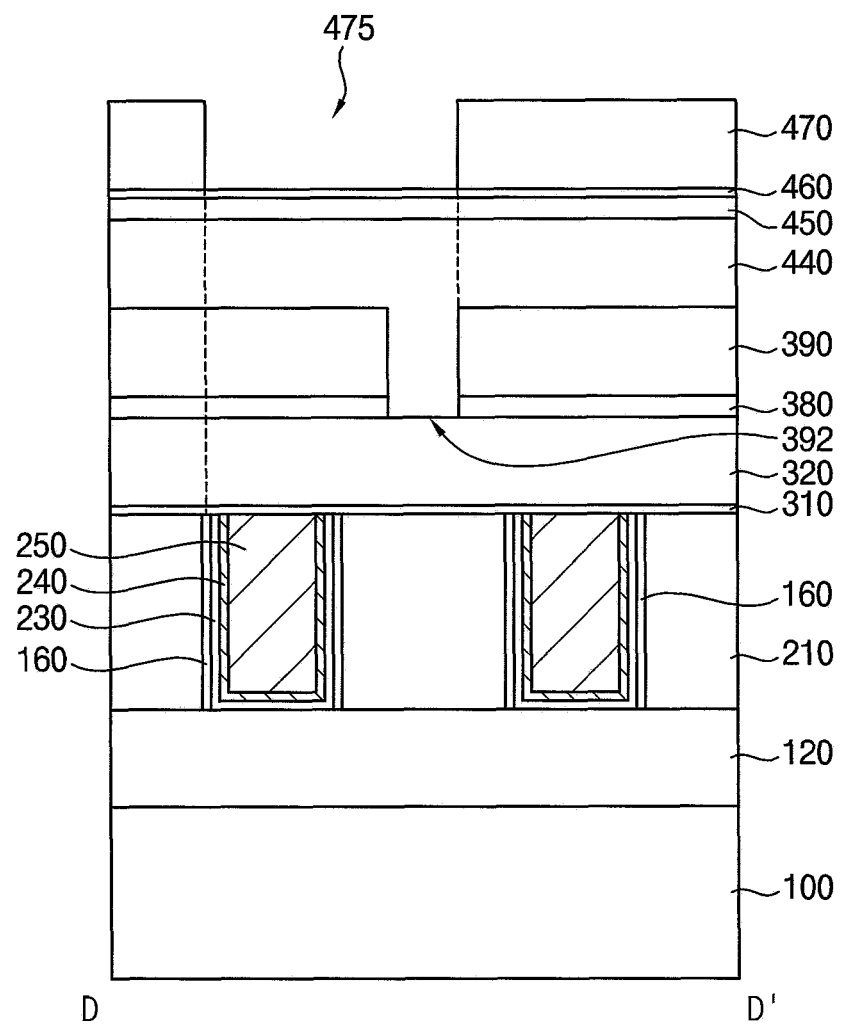

Referring to FIGS. 27 to 29, after forming a first metal layer on the exposed upper surface of the source/drain layer 200, a sidewall of the second opening 330, and an upper surface of the first insulating interlayer 320, a heat treatment process may be performed thereon to form a metal silicide pattern 340 on the source/drain layer 200. An unreacted portion of the first metal layer may be removed.

The first metal layer may be formed of a metal, e.g., titanium, cobalt, nickel, etc.

A first barrier layer may be formed on the metal silicide pattern 340, the sidewall of the second opening 330 and the upper surface of the first insulating interlayer 320, a second metal layer may be formed on the first barrier layer to fill the second opening 330, and the second metal layer and the first barrier layer may be planarized until the upper surface of the first insulating interlayer 320 may be exposed. Thus, a first contact plug 370 may be formed on the metal silicide pattern 340 to fill the second opening 330.

In example embodiments, the first contact plug 370 may be formed to be self-aligned with the gate spacer 160, however, the inventive concepts are not limited thereto.

The first barrier layer may be formed of a metal nitride, e.g., titanium nitride, tantalum nitride, tungsten nitride, etc., and the second metal layer may be formed of a metal, e.g., tungsten, copper, etc.

The first contact plug 370 may include a first metal pattern 360 and a first barrier pattern 350 covering a bottom and a sidewall thereof.

Referring to FIGS. 30 to 33, an etch stop layer 380, a second insulating interlayer 390, a first layer 400, a second layer 410, a third layer 420 and a third photoresist pattern 430 may be sequentially formed on the first insulating interlayer 320 and the first contact plug 370.

The etch stop layer 380 may be formed, for example, of a nitride, e.g., silicon nitride, silicon oxynitride, silicon carbonitride, silicon oxycarbonitride, etc., the second insulating interlayer 390 may be formed, for example, of silicon oxide, e.g., TEOS, the first layer 400 may be formed of, e.g., spin-on-hardmask (SOH), the second layer 410 may be formed of silicon oxynitride, e.g., plasma enhanced silicon oxynitride (PE-SION), and the third layer 420 may be formed of, e.g., bottom anti-reflective coating (BARC).

In example embodiments, the third photoresist pattern 430 may include third and fourth openings 432 and 434 each of which may extend in the second direction and expose an upper surface of the third layer 420. The third opening 432 may vertically overlap at least one of the first contact plugs 370 and a portion of the first insulating interlayer 320 adjacent thereto, and the fourth opening 434 may vertically overlap one of the first contact plugs 370.

FIGS. 30 to 33 show that the third opening 432 vertically overlaps neighboring two of the first contact plugs 370 in the second direction, however, the inventive concepts are not limited thereto. For example, when the third opening 432 vertically overlaps at least one of the first contact plugs 370 and a portion of the first insulating interlayer 320 adjacent thereto, it may be included within the scope of the inventive concepts. Thus, the third opening 320 may vertically overlap one or a plurality of first contact plugs 370.

Referring to FIGS. 34 to 37, a first etching process may be performed using the third photoresist pattern 430 as an etching mask to sequentially etch the third layer 420, the second layer 410 and the first layer 400, and the third photoresist pattern 430 and the third layer 420 may be removed in the first etching process.

After removing the second layer 410, a second etching process may be performed using the remaining first layer 400 as an etching mask to etch the second insulating interlayer 390 and the etch stop layer 380, and a fifth opening 392 exposing at least one of the first contact plugs 370 and a portion of the first insulating interlayer 320 adjacent thereto in the second direction, and a sixth opening 394 exposing one of the first contact plugs 370 may be formed through the second insulating interlayer 390 and the etch stop layer 380.

The fifth and sixth openings 392 and 394 may have shapes substantially the same as those of the second and third openings 432 and 434, respectively.

The remaining first layer 400 after the second etching process may be removed, for example, by an ashing process and/or a stripping process.

Referring to FIGS. 38 to 41, a fourth layer 440 may be formed on the exposed portion of the first insulating interlayer 320 and the second insulating interlayer 390 to fill the fifth and sixth openings 392 and 394, and a fifth layer 450, a sixth layer 460 and a fourth photoresist pattern 470 may be sequentially formed on the fourth layer 440.

For example, the fourth layer 440 may be formed of SOH, the fifth layer 450 may be formed of PE-SION, and the sixth layer 460 may be formed of BARC.

The fourth photoresist pattern 470 may include a seventh opening 475 extending in the first direction and exposing an upper surface of the sixth layer 460. In example embodiments, the seventh opening 475 may partially vertically overlap at least one of the gate structures 260 and the fifth opening 392. Particularly, the seventh opening 475 may at least partially vertically overlap the gate structure 260 and a portion of the fifth opening 392 exposing the first insulating interlayer 320.

FIGS. 38 to 41 show that the seventh opening 475 vertically overlaps one gate structure 260 extending in the second direction and a portion of the first insulating interlayer 320 adjacent thereto in the first direction, however, the inventive concepts are not limited thereto. For example, the seventh opening 475 vertically overlaps at least one of the gate structures 260 and a portion of the first insulating interlayer 320 adjacent thereto, and thus, the seventh opening 475 may vertically overlap one or a plurality of gate structures 260. The seventh opening 475, fifth opening 392, and third opening 432 may all be at different vertical levels. In addition, the vertical levels may not include any of the same heights above the substrate.

Figure 42:
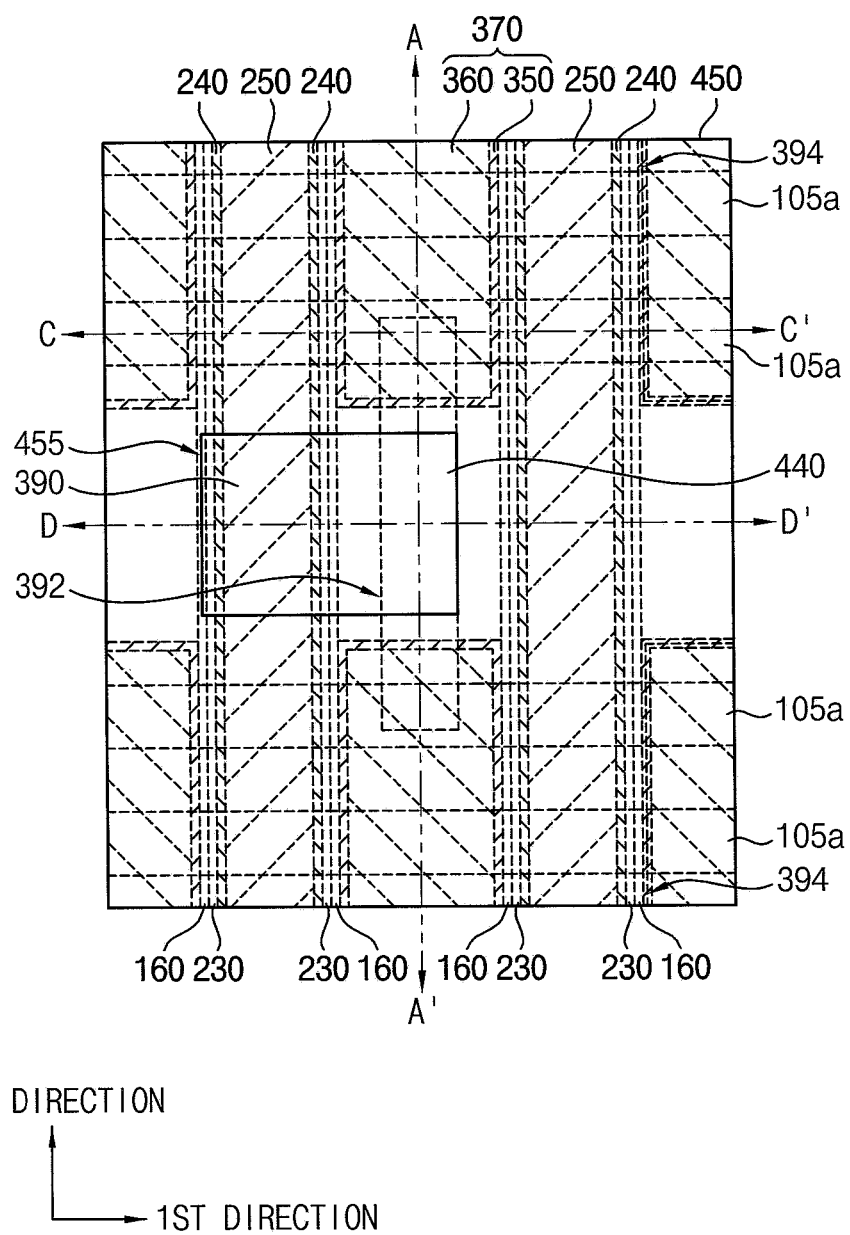
Figure 43:
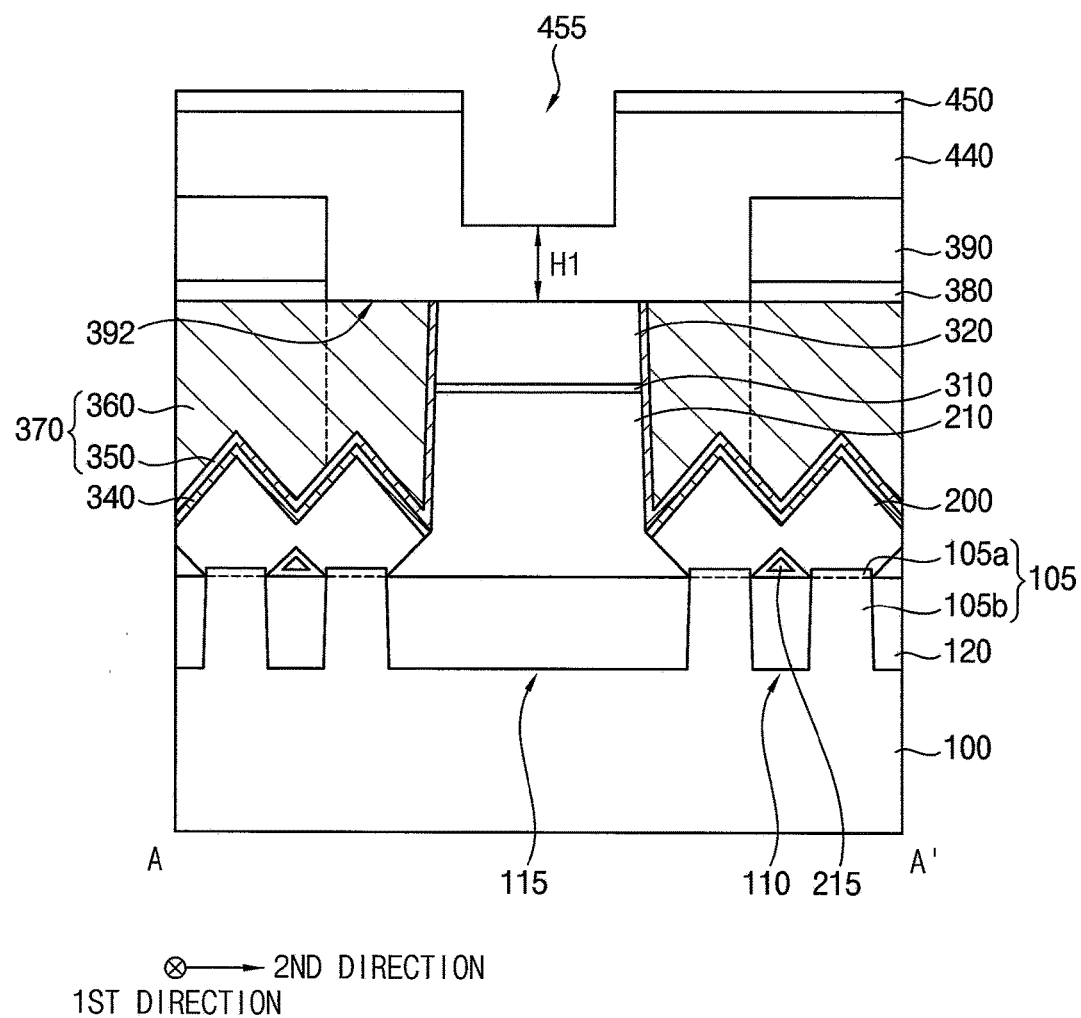
Figure 44:
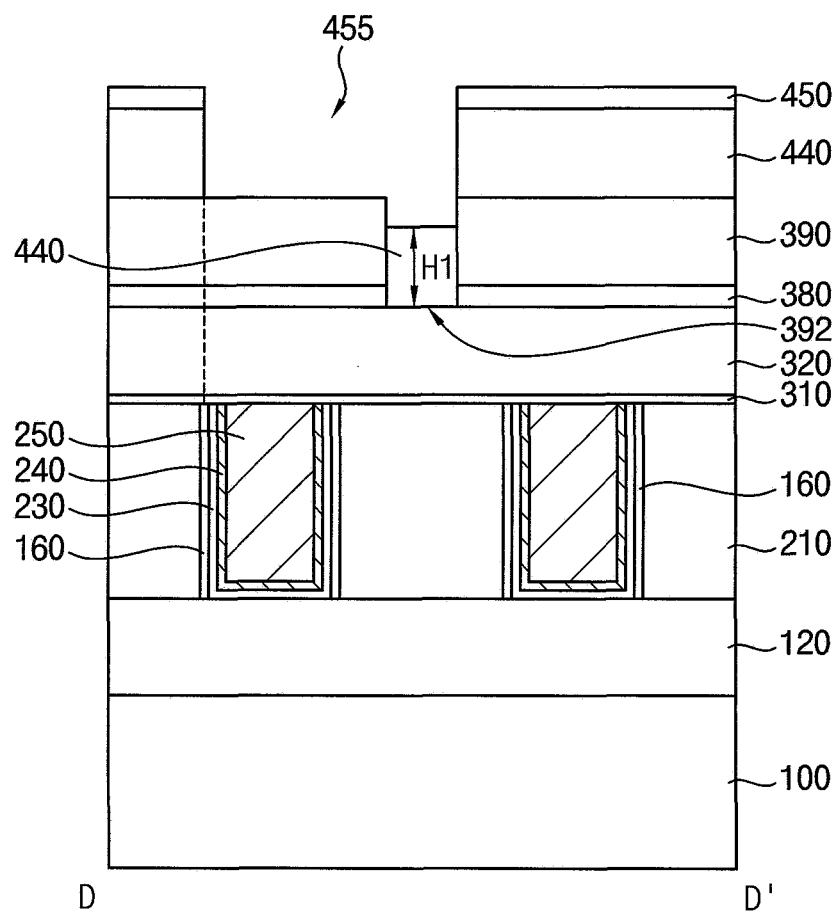

Referring to FIGS. 42 to 44, a third etching process may be performed using a fourth photoresist pattern 470 as an etching mask to sequentially etch the sixth layer 460, the fifth layer 450 and the fourth layer 440, and the fourth photoresist pattern 470 and the sixth layer 460 may be removed in the third etching process.

In example embodiments, the third etching process may be performed using an upper surface of the second insulating interlayer 390 as an etching endpoint. For example, the third etching process may be performed until the upper surface of the second insulating interlayer 390 is exposed, and thus an eighth opening 455 may be formed through the fifth layer 450 and an upper portion of the fourth layer 440. Like the seventh opening 475, the eighth opening 455 may vertically overlap at least one of the gate structures 260 and the portion of the fifth opening over the first insulating interlayer 320.

In example embodiments, a portion of the fourth layer 440 filling the fifth opening 392 on the first insulating interlayer 320 may be barely etched in the third etching process. Thus, after the third etching process, the portion of the fourth layer 440 in the fifth opening 392 on the first insulating interlayer 320 may fill at least a lower portion of the fifth opening 392.

FIGS. 42 to 44 show that a first height H1 from the upper surface of the first insulating interlayer 320 to an upper surface of the fourth layer 440 filling the fifth opening 392 on the first insulating interlayer 320 is about ⅔ of a height of the fifth opening 392, however, the inventive concepts are not limited thereto. In example embodiments, the first height H1 from the upper surface of the first insulating interlayer 320 to the upper surface of the fourth layer 440 filling the fifth opening 392 on the first insulating interlayer 320 may be equal to or more than about ¼ of the height of the fifth opening 392. In an example embodiment, the upper surface of the fourth layer 440 in the fifth opening 392 on the first insulating interlayer 320 may be higher than an upper surface of the etch stop layer 380.

Figure 45:
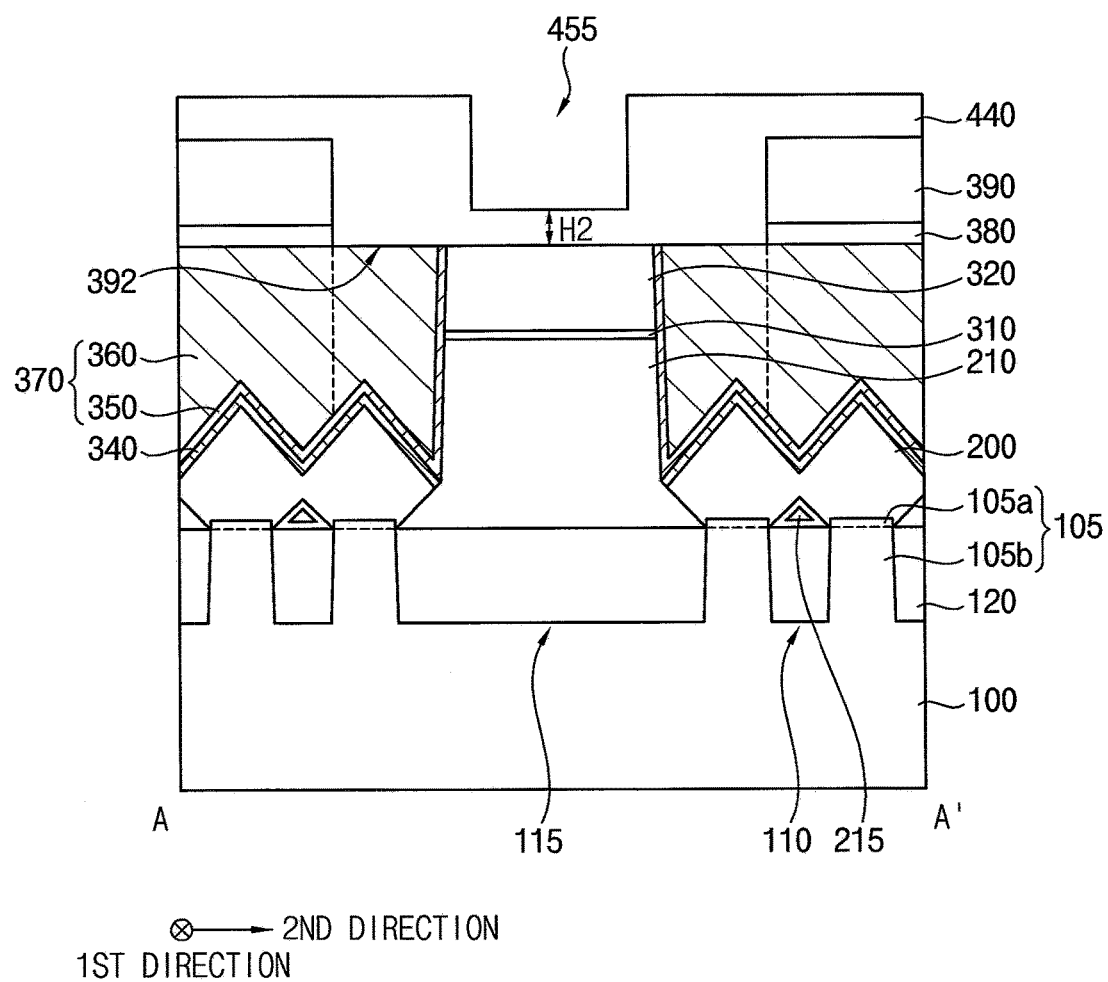
Figure 46:
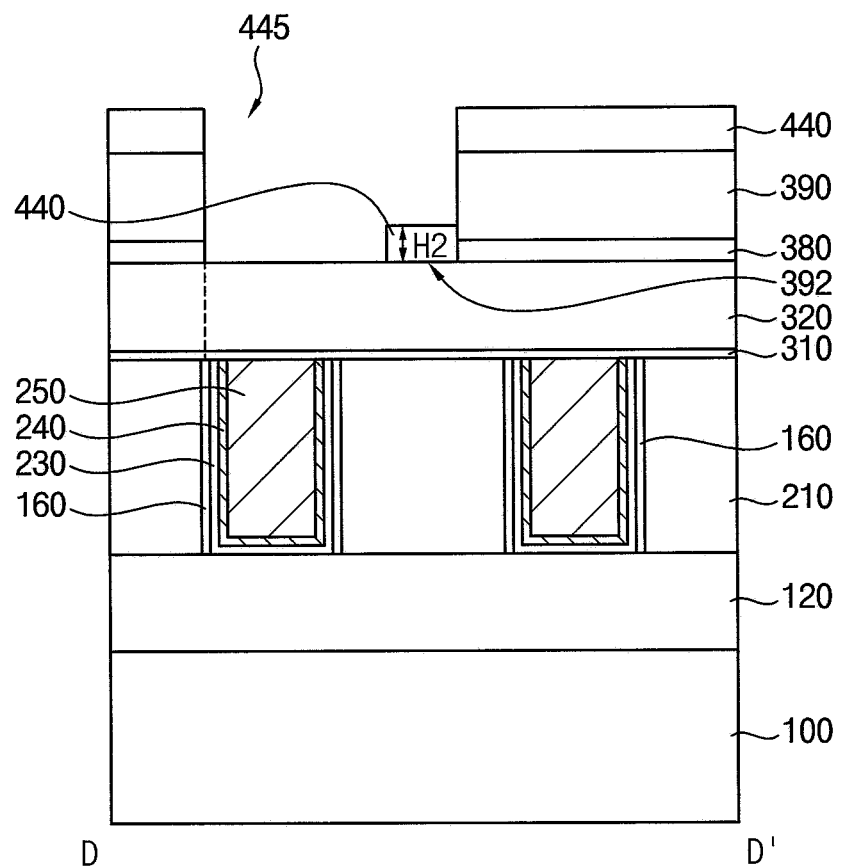

Referring to FIGS. 45 and 46, in one embodiment, after removing the fifth layer 450, a fourth etching process is performed using the remaining fourth layer 440 as an etching mask so that an exposed portion of the second insulating interlayer 390 and a portion of the etch stop layer 380 thereunder may be etched. Thus, a ninth opening 445 exposing an upper surface of the first insulating interlayer 320 may be formed through the second insulating interlayer 390 and the etch stop layer 380.

The ninth opening 445 may have a shape similar to that of the eighth opening 455, and thus may partially vertically overlap at least one of the gate structures 260 and the fifth opening 392.

In example embodiments, in the fourth etching process, the portion of the fourth layer 440 in the fifth opening 392 on the first insulating interlayer 320 may not be completely removed but may at least partially remain. Thus, FIGS. 45 to 46 show that an upper surface of the fourth layer 440 in the fifth opening 392 on the first insulating interlayer 320 is higher than the upper surface of the etch stop layer 380. The upper surface of the fourth layer 440 on the first insulating interlayer 320 in the fifth opening 392 may have a second height H2 from the upper surface of the first insulating interlayer 320.

Figure 47:
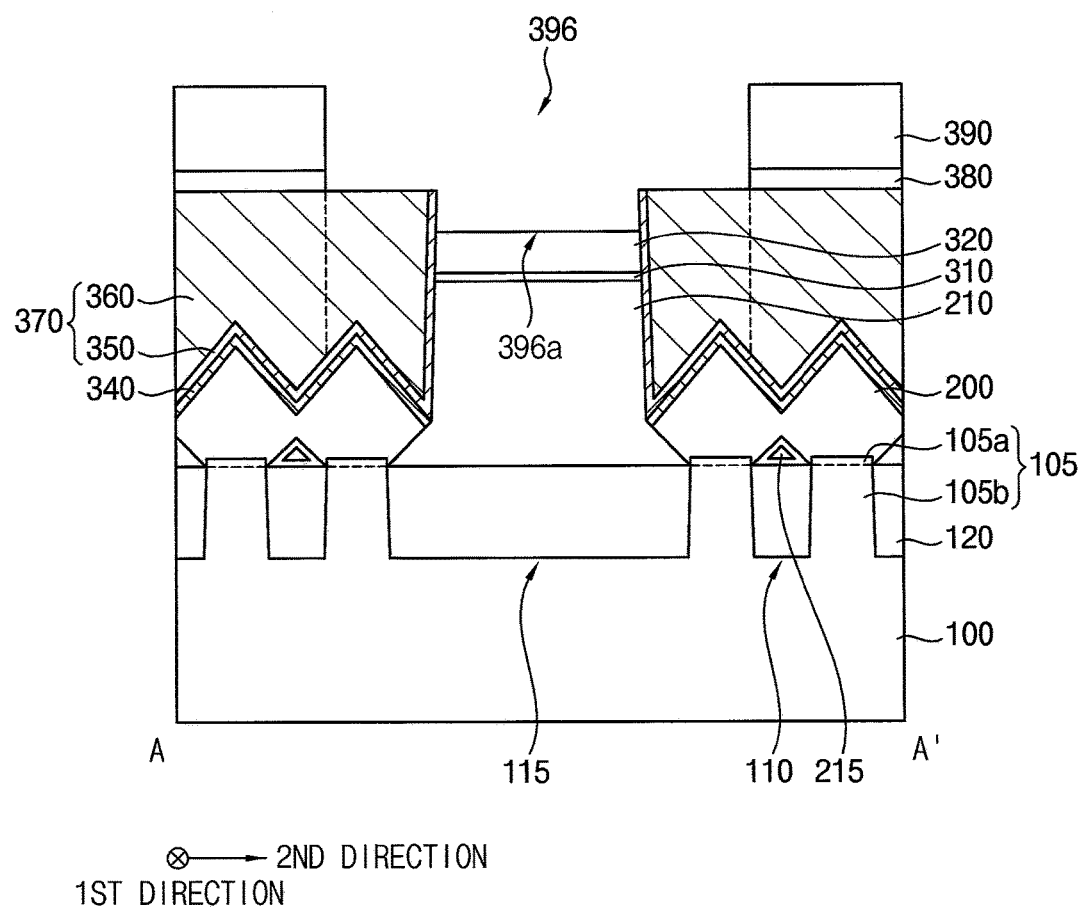
Figure 48:
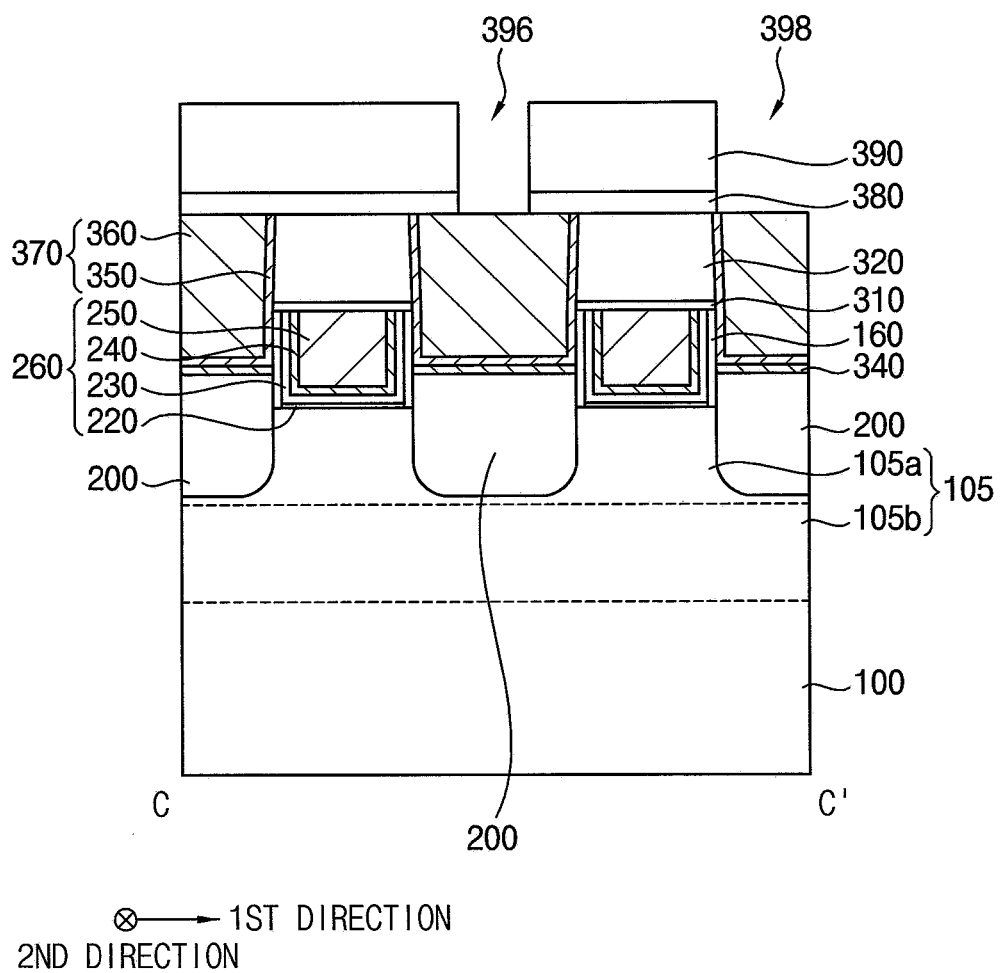
Figure 49:
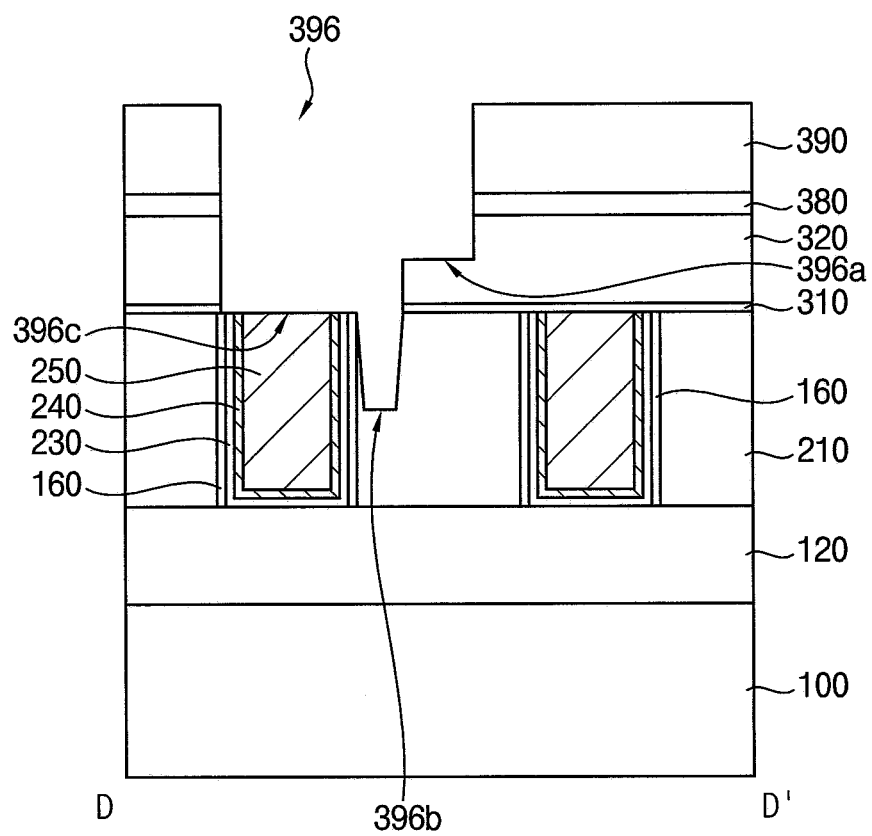
Figure 50:
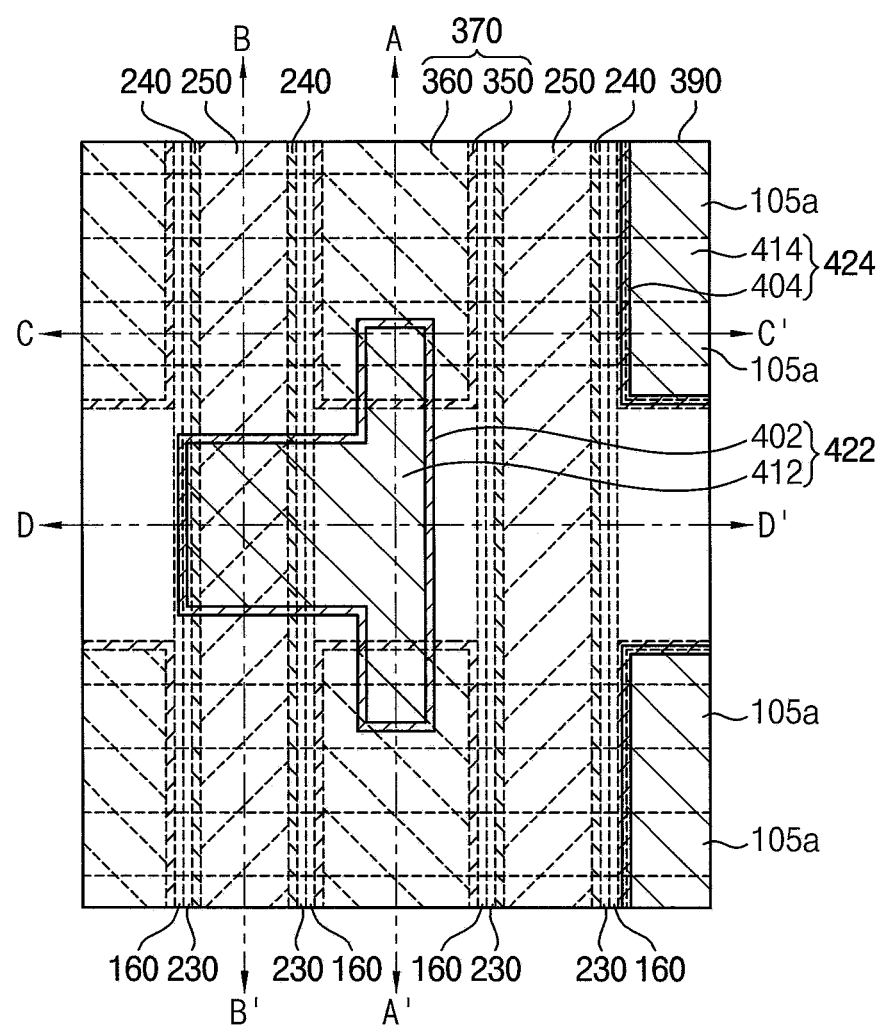

Referring to FIGS. 47 to 49, a fifth etching process may be performed using the remaining fourth layer 440 as an etching mask so that an exposed portion of the first insulating interlayer 320 and a portion of the capping layer 310 thereunder may be etched. Thus, a tenth opening 396 exposing an upper surface of at least one of the gate structures 260 and an upper surface of at least one of the first contact plugs 370 may be formed through the second insulating interlayer 390, the etch stop layer 380, the first insulating interlayer 320 and the capping layer 310, and an eleventh opening 398 exposing an upper surface of one of the first contact plugs 370 may be formed through the second insulating interlayer 390 and the etch stop layer 380. A top surface of the gate spacer 160 on the sidewall of the gate structure 260 may be also exposed by the tenth opening 396.

The fourth layer 440 may be removed by the fifth etching process. However, in the fifth etching process, the fourth layer 440 may prevent or delay the removal of a portion of the first insulating interlayer 320 thereunder, and thus the tenth opening 396 may have a step shape.

The fifth etching process may be performed on the first insulating interlayer 320 and the capping layer 310 until the upper surface of the gate structure 260 is exposed, and until the fourth layer 440 serving as the etching mask is completely removed. A portion of the first insulating interlayer 320 and a portion of the capping layer 310 under the fourth layer 440 may not be removed but may remain. Thus, a portion of the first insulating interlayer 320 commonly overlapping with the fifth and ninth openings 392 and 445 may not be completely removed but may remain, and a portion of the capping layer 310 thereunder may also remain.

FIG. 47, which is a cross-sectional view taken along the second direction, shows that the tenth opening 396 formed in the fifth etching process exposes an upper surface of the first contact plugs 370 and a portion of the first insulating interlayer 320 adjacent thereto to have a step shape.

FIG. 49, which is a cross-sectional view taken along the first direction, shows that the tenth opening 396 exposes an upper surface of the gate structures 260 and a portion of the first insulating interlayer 320 adjacent thereto to have a step shape. For example, a first portion 396a of the tenth opening 396 on the first insulating interlayer 320 may be higher than the upper surface of the gate structure 260, and thus, the first portion 396a together with a third portion 396c of the tenth opening 396 exposing the upper surface of the gate structure 260 may have a step shape.

Further, a second portion 396b of the tenth opening 396 adjacent the first portion 396a may be concave upward or convex downward. For example, the fifth etching process may be performed on the first insulating interlayer 320 and the capping layer 310 until the upper surface of the gate structure 260 is exposed, and thus a portion of the insulation layer 210 under a portion of the first insulating interlayer 320 not covered by the fourth layer 440 and adjacent the gate structure 260 may be also etched to form a protrusion of the tenth opening 396. Accordingly, the tenth opening 396 may have a step shape of the first and second portions 396a and 396b even in an area vertically overlapping with neither the gate structure 260 nor the first contact plug 370.

In example embodiments, in the second portion 396b of the tenth opening 396, a bottom of the protrusion of the tenth opening 396 may be higher than a bottom of the gate structure 260. Thus, a lowermost bottom of the tenth opening 396 may be lower than the upper surface of the gate structure 260 and higher than the bottom of the gate structure 260.

Referring to FIGS. 50, 51A, 52, 53 and 54, second and third contact plugs 422 and 424 may be formed to fill the tenth and eleventh openings 396 and 398, respectively.

Particularly, a second barrier layer may be formed on bottoms and sidewalls of the tenth and eleventh openings 396 and 398 and the upper surface (e.g., a top surface) of the second insulating interlayer 390, a third metal layer may be formed on the second barrier layer to fill remaining portions of the tenth and eleventh openings 396 and 398, and the third metal layer and the second barrier layer may be planarized until the upper surface of the second insulating interlayer 390 is exposed to form the second and third contact plugs 422 and 424. Thus, each of the second and third contact plugs 422 and 424 may be formed of a barrier layer and a metal layer formed directly on the barrier layer. The second and third contact plugs 422 and 424 may be referred to herein as conductive plugs.

The second barrier layer may be formed, for example, of a metal nitride, e.g., titanium nitride, tantalum nitride, tungsten nitride, etc., and/or a metal, e.g., titanium, tantalum, etc., and the third metal layer may be formed of a metal, e.g., tungsten, copper, etc.

The second contact plug 422 may include a second metal pattern 412 and a second barrier pattern 402 covering a bottom and a sidewall of the second metal pattern 412, and the third contact plug 424 may include a third metal pattern 414 and a third barrier pattern 404 covering a bottom and a sidewall of the third metal pattern 414.

Figure 54:
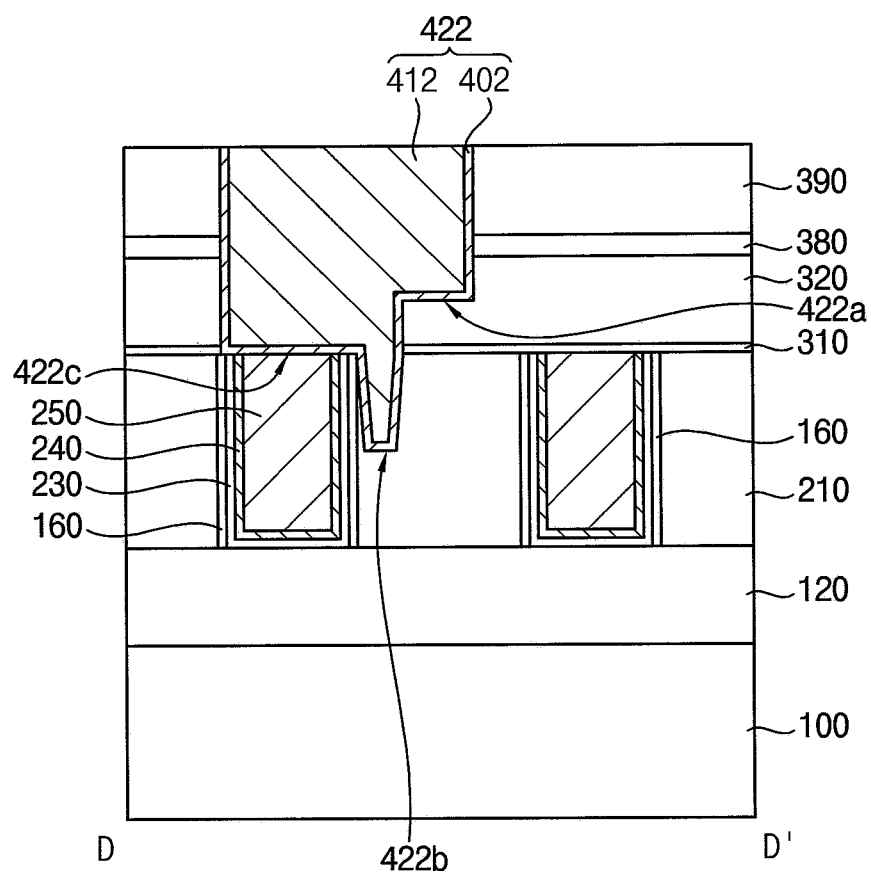

In example embodiments, the second contact plug 422 may include a first extension portion (e.g., as can be seen at least in the plan view shown in FIG. 50) extending in the second direction and contacting the upper surface (e.g., a top surface, such as a topmost surface) of the first contact plug 370 (see, e.g., FIG. 51A), and a second extension portion (e.g., as can be seen in at least the plan view shown in FIG. 50) extending in the first direction and contacting the upper surface (e.g., a top surface, such as a topmost surface) of the gate structure 260 (see, e.g., FIG. 54). The first and second extension portions of the second contact plug 422 may be integrally formed to be connected with each other. As discussed above, the first and second extension portions of the second contact plug 422 may be formed at the same time as part of the same step in the manufacturing process. The first and second extension portions of the second contact plug 422 may be thus formed of a single continuous piece without any breaks in continuity.

In an area at which the first and second extension portions meet each other, i.e., in an area vertically overlapping neither the gate structure 260 nor the first contact plug 370 but vertically overlapping the insulation layer 210, a first portion 422a of a bottom (e.g., bottom surface) of the second contact plug 422 may be higher than the upper surface (e.g., top surface, such as a topmost surface) of the gate structure 260. The capping layer 310 and the first insulating interlayer 320 sequentially stacked may be formed between the first portion 422a of the bottom of the second contact plug 422 and the insulation layer 210 surrounding the gate structure 260. In the area at which the first and second extension portions meet each other, a protrusion may be formed at a second portion 422b of the bottom (e.g., bottom surface) of the second contact plug 422, which may be formed between the first portion 422a of the bottom of the second contact plug 422 and the gate structure 260. The second portion 422b of the bottom of the second contact plug 422, e.g., a bottom surface of the protrusion, which may be described as a convex protruding portion, may be lower than the upper surface of the gate structure 260 and higher than the bottom (e.g., a bottom surface) of the gate structure 260.

As described here, a bottom surface of an element (e.g., the second plug) refers to any part of the lower-facing surface of the element. A bottom-most surface of the element refers to a portion of the bottom surface having a lowest vertical level among all portions of the bottom surface, or if the bottom surface is only at one level (e.g., horizontal and flat), refers to the entire bottom surface. Similarly, a top surface of an element refers to any part of the upper-facing surface of the element. A top-most surface of an element refers to a portion of the top surface having a highest vertical level among all portions of the top surface, or if the top surface is only at one level (e.g., horizontal and flat), refers to the entire top surface.

Terms such as "upper surface" or "lower surface" may be used to compare relative heights among different elements. As such, a first bottom surface may be described as a lower bottom surface, and a second bottom surface at a greater vertical height than the first bottom surface may be described as an upper bottom surface. The same can apply for top surfaces.

Accordingly, FIG. 54, which is a cross-sectional view taken along the first direction, shows that the bottom of the second contact plug 422 includes the first and second portions 422a and 422b and a third portion 422c contacting the upper surface of the gate structure 260 and has a step shape. As a result, the bottom of the second contact plug 422 may not have a constant height but varying height according to the position thereof. More specifically, a portion of the bottom surface of the second contact plug 422 that does not contact a top surface of the gate structure 260 may have varying height. Further, as can be seen in FIG. 54 as well as in various other embodiments, a bottom surface of the second contact plug 422 may include horizontal portions and in some cases may additionally include curved portions. As can be seen in these embodiments, the height among the horizontal portions and/or curved portions may vary.

For example, as shown in FIG. 54 and in various other embodiments, a gate structure 260 has a topmost surface at a first height and a bottom-most surface at a second height. A first portion of the bottom surface of the second contact plug 422 contacting neither the topmost surface of the gate structure 260 nor the top surface of the first contact plug 370 has a first bottom surface portion at a height equal to the first height or the second height or at a height between the first height or the second height, and has a second bottom surface portion at a height either greater than the first height or less than the second height. For example, as shown in FIG. 54, the first bottom surface portion is labeled 422b, which is at a height between the first height and the second height, and the second bottom surface portion is labeled 422a, which is at a height greater than the first height. Both the first bottom surface portion and the second bottom surface portion maybe above a top surface of the substrate 100.

As can be seen in the various figures, the second plug that contacts the top surface of the gate structure and the top surface of the first plug connected to a source/drain region of a transistor can have a shape that includes a top surface extending in a second direction between the first plug covering a first source/drain region and a third plug covering a second source/drain region. The second direction may be the same as the direction in which the gate structure extends. Below this top surface, a first portion of the bottom surface of the second plug may be at a first height. A second portion of the bottom surface of the second plug that contacts the top surface of the gate structure may have a second, different height. A third portion of the bottom surface of the second plug between the first portion and the second portion may be a height different from the first and second heights.

Referring to FIG. 51B, as illustrated with reference to FIG. 2B, each of the active fins 105 may have a width gradually increasing from a top toward a bottom thereof. Thus, a leakage current toward the lower active pattern 105b may decrease, and the semiconductor device including the active fins 105 may have enhanced performance.

As illustrated above, the fifth opening 392 exposing the first contact plug 370 and the first insulating interlayer 320 may be formed through the etch stop layer 380 and the second insulating interlayer 390, and the fourth layer 440 may be formed on the second insulating interlayer 390 to fill the fifth opening 392. When the fourth layer 440 is partially etched to form the eighth opening 455 partially vertically overlapping the gate structure 260 and the fifth opening 392, the portion of the fourth layer 440 in the fifth opening 392 may be barely etched.

Thus, in the etching process for the second insulating interlayer 390, the etch stop layer 380, the first insulating interlayer 320 and the capping layer 310 using the fourth layer 440 as an etching mask, the fourth layer 440 may not be removed for a while, and a portion of the first insulating interlayer 320 thereunder may not be removed.

As a result, the tenth opening 396 formed in the etching process may have a bottom of which a lowermost portion may be higher than the bottom of the gate structure 260 so as not to expose an upper surface of the substrate 100, and the second contact plug 422 filling the tenth opening 396 and commonly contacting the upper surface of the gate structure 260 and the upper surface of the first contact plug 370 may not contact the upper surface of the substrate 100. Accordingly, in the semiconductor device manufactured by the above processes, the electrical failure that may be generated by the leakage current due to the contact of the second contact plug 422 to the upper surface of the substrate 100 may be prevented or reduced.

Up to now, the semiconductor device includes the third contact plug 424 electrically connected to the first contact plug 370 on the source/drain layer 200, and the second contact plug 370 commonly electrically connected to the gate structure 260 and the first contact plug 370, however, the inventive concepts not limited thereto. The semiconductor device may further include a contact plug (not shown) electrically connected to the gate structure 260 only in addition to the first to third contact plugs 370, 422 and 424. The semiconductor device may further include vias (not shown) and wirings (not shown) electrically connected to the second and third contact plugs 422 and 424.

FIGS. 55 to 62 are cross-sectional views illustrating stages of a method of manufacturing a semiconductor device in accordance with a comparative example. FIGS. 55, 57, 59 and 61 are cross-sectional views taken along lines A-A' of corresponding plan views, respectively, and FIGS. 56, 58, 60 and 62 are cross-sectional views taken along lines D-D' of corresponding plan views, respectively.

This method may include processes substantially the same as or similar to those illustrated with reference to FIGS. 1 to 50, 51A, 51B, and 52 to 54. Thus, like reference numerals refer to like elements, and detailed descriptions thereon are omitted herein.

Processes substantially the same as or similar to those illustrated with reference to FIGS. 1 to 41 may be performed.

Figure 55:
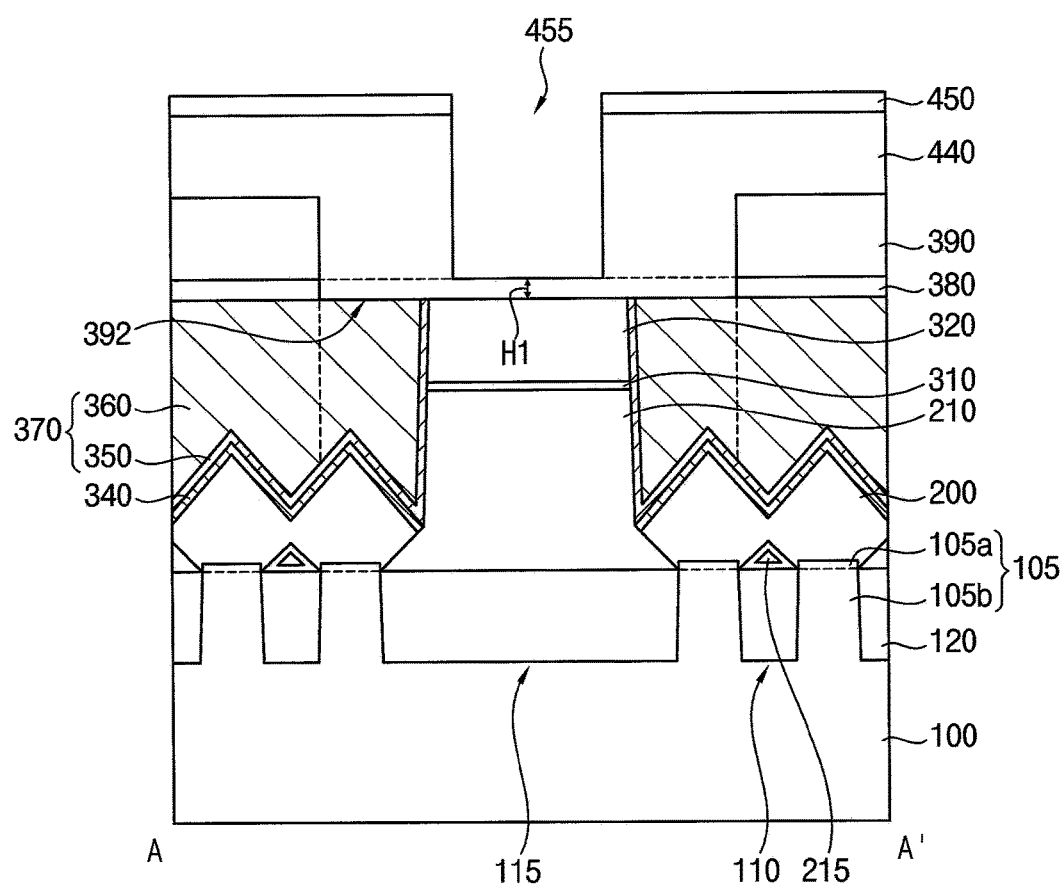
FIGS. 55 to 62 are cross-sectional views illustrating stages of a method of manufacturing a semiconductor device in accordance with a comparative example.
Figure 56:
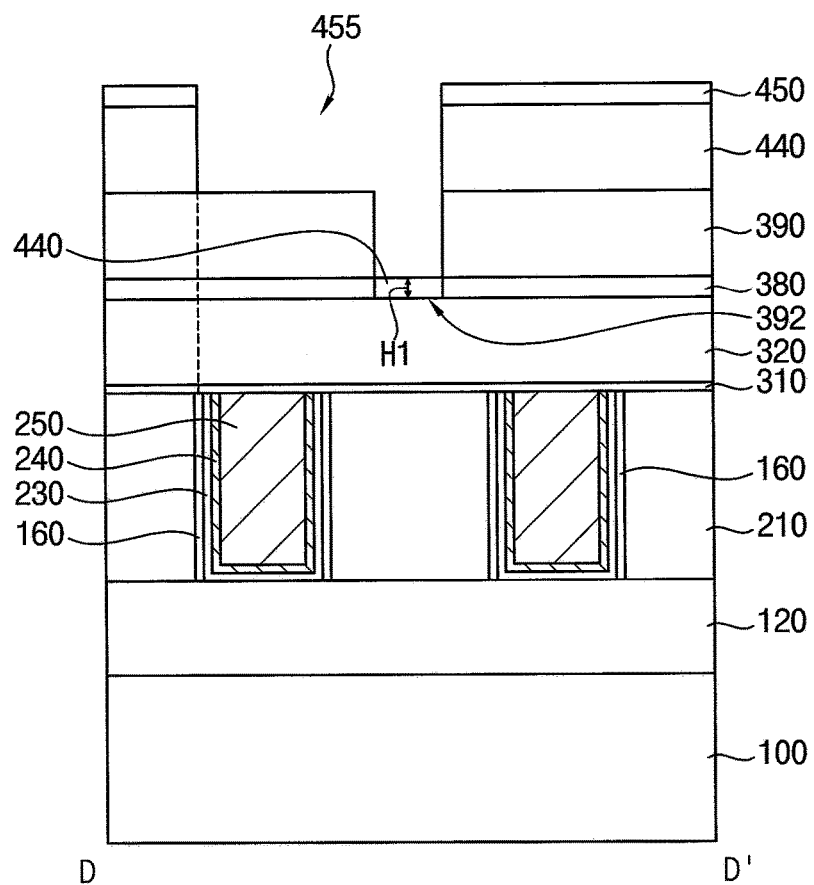

Referring to FIGS. 55 and 56, a process substantially the same as or similar to that illustrated with reference to FIGS. 42 to 44 may be performed.

Thus, the third etching process may be performed using the fourth photoresist pattern 470 as an etching mask to sequentially etch the sixth layer 460, the fifth layer 450 and the fourth layer 440, and the fourth photoresist pattern 470 and the sixth layer 460 may be removed in the third etching process.

Unlike that illustrated with reference to FIGS. 42 to 44, the third etching process may not be performed using the second insulating interlayer 390 as an etching endpoint, and may be performed until a portion of the fourth layer 440 filling the fifth opening 392 is sufficiently removed.

Thus, after the third etching process, the portion of the fourth layer 440 in the fifth opening 392 on the first insulating interlayer 320 may be almost or completely removed. For example, the first height H1 of the upper surface of the portion of the fourth layer 440 in the fifth opening 392 from the upper surface of the first insulating interlayer 320 may be very small, and for example, the upper surface of the portion of the fourth layer 440 in the fifth opening 392 may be substantially coplanar with or lower than the upper surface of the etch stop layer 380.

Figure 57:
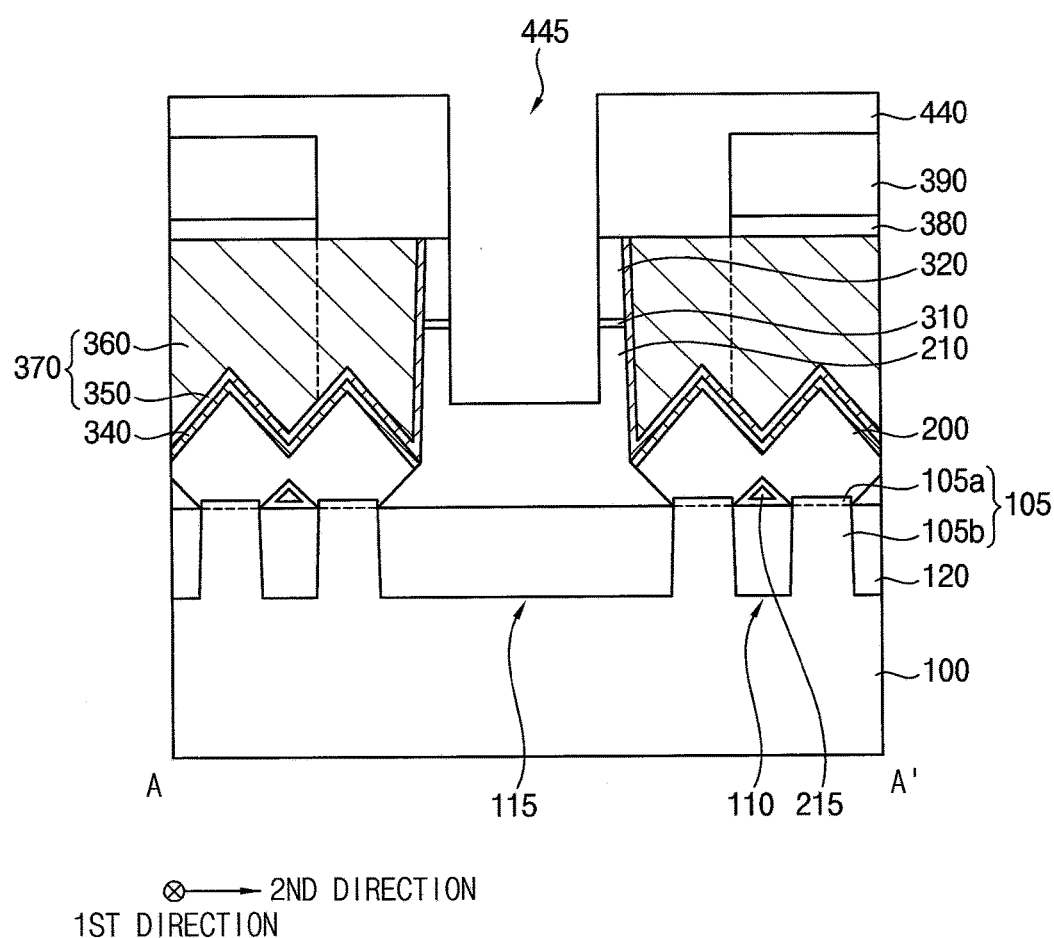
Figure 58:
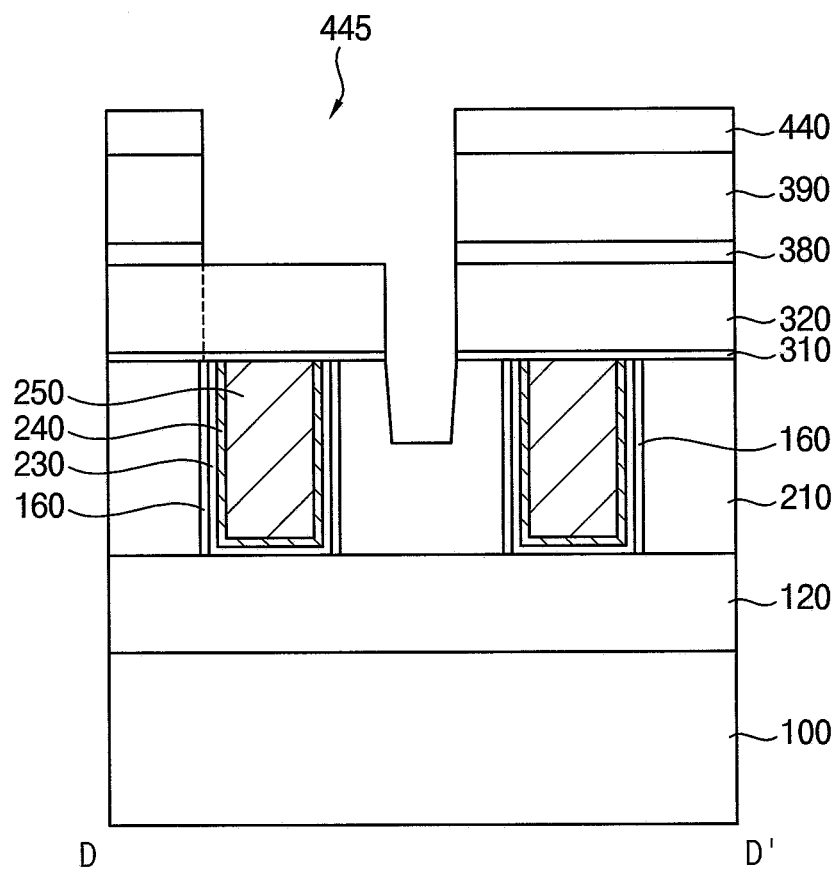

Referring to FIGS. 57 and 58, a process substantially the same as or similar to that illustrated with reference to FIGS. 45 and 46 may be performed.

Particularly, after removing the fifth layer 450, the fourth etching process may be performed using the remaining fourth layer 440 as an etching mask to etch an exposed portion of the second insulating interlayer 390 and a portion of the etch stop layer 380 thereunder, and thus the ninth opening 445 exposing an upper surface of the first insulating interlayer 320 may be formed through the second insulating interlayer 390 and the etch stop layer 380.

However, the fourth layer 440 may be completely removed or a very small portion thereof may remain in the fifth opening 392 on the first insulating interlayer 320, and thus, when the fifth layer 450 is removed, a portion of the first insulating interlayer 320 under the fifth opening 392 may be also removed. In the fourth etching process, the portion of the first insulating interlayer 320 under the fifth opening 392 may be further etched, and portions of the capping layer 310 and the insulation layer 210 thereunder may be also partially etched. Accordingly, a lowermost portion of a bottom of the ninth opening 445 may be lower than an upper surface of the gate structure 260.

Figure 59:
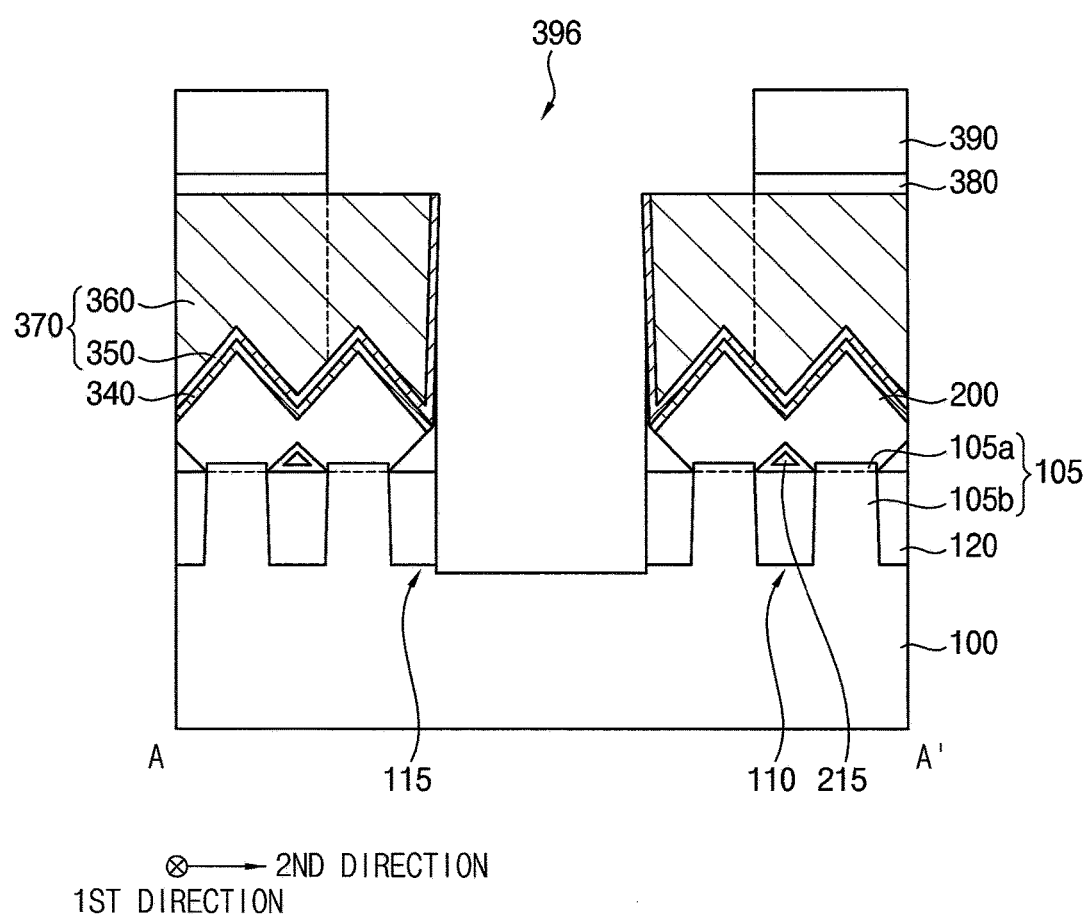
Figure 60:
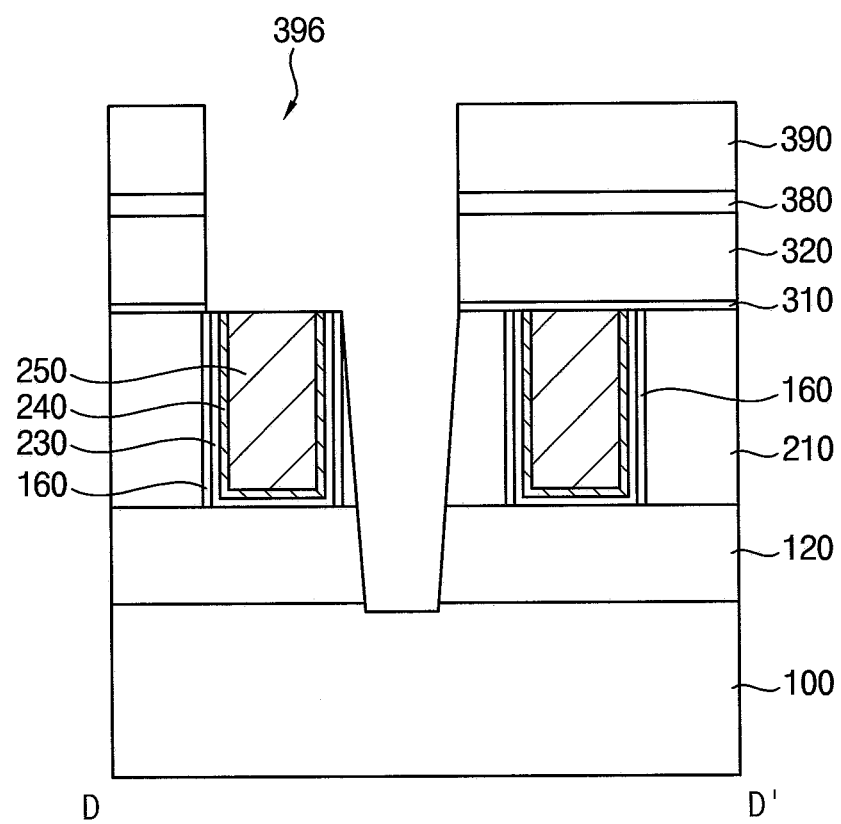

Referring to FIGS. 59 and 60, a process substantially the same as or similar to that illustrated with reference to FIGS. 47 to 49 may be performed.

For example, the fifth etching process may be performed using the fourth layer 440 as an etching mask to etch an exposed portion of the first insulating interlayer 320 and a portion of the capping layer 310 thereunder. Thus, the tenth opening 396 commonly exposing upper surfaces of the gate structure 260 and the first contact plug 370 may be formed through the second insulating interlayer 390, the etch stop layer 380, the first insulating interlayer 320 and the capping layer 310. A top surface of the gate spacer 160 on a sidewall of the gate structure 260 may be also exposed by the tenth opening 396.

Unlike the process illustrated with reference to FIGS. 47 to 49, the fourth layer 440 may not prevent the first insulating interlayer 320 and/or the insulation layer 210 from being etched in the fifth etching process, and thus portions of the insulation layer 210 and the isolation pattern 120 under the ninth opening 445 may be etched to expose an upper surface of the substrate 100. Further, the exposed portion of the substrate 100 may be partially etched.

Figure 61:
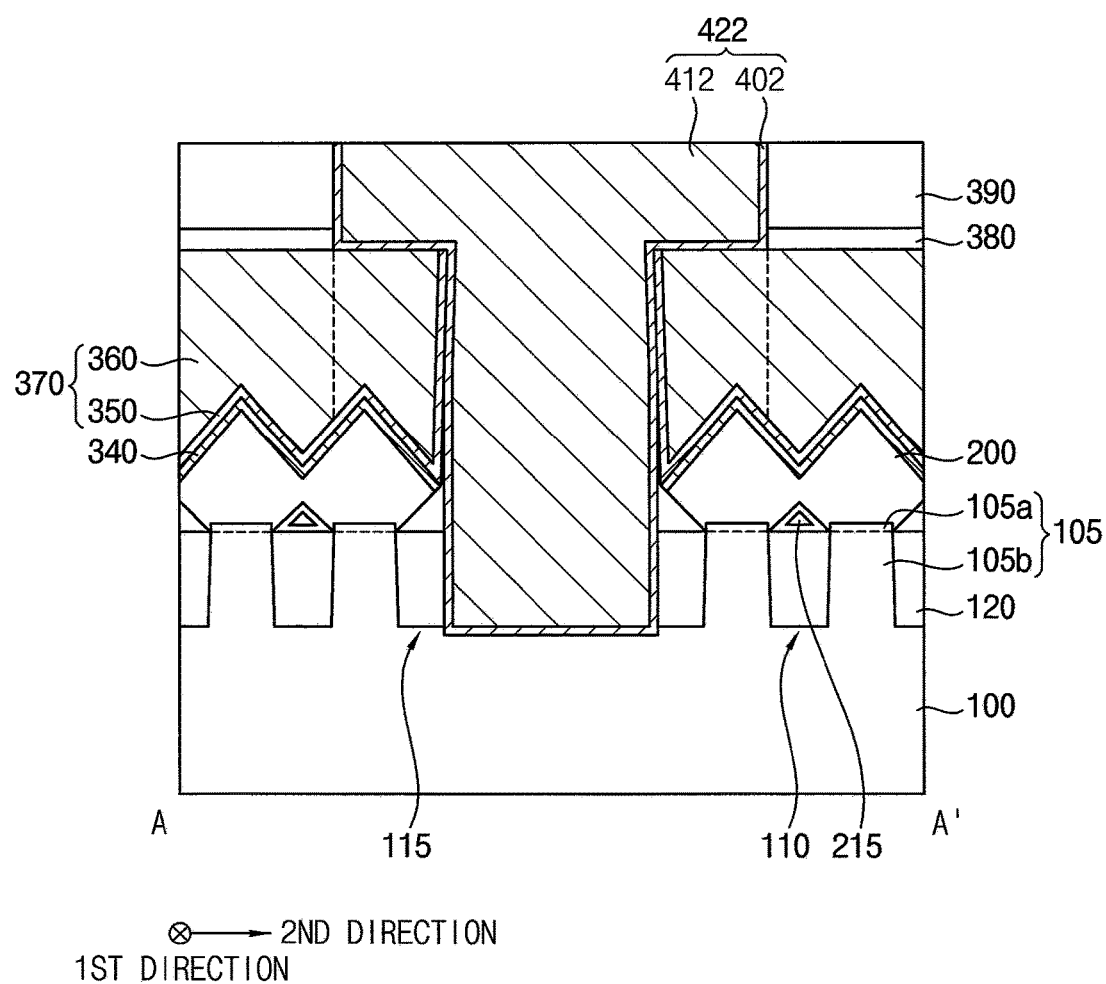
Figure 62:
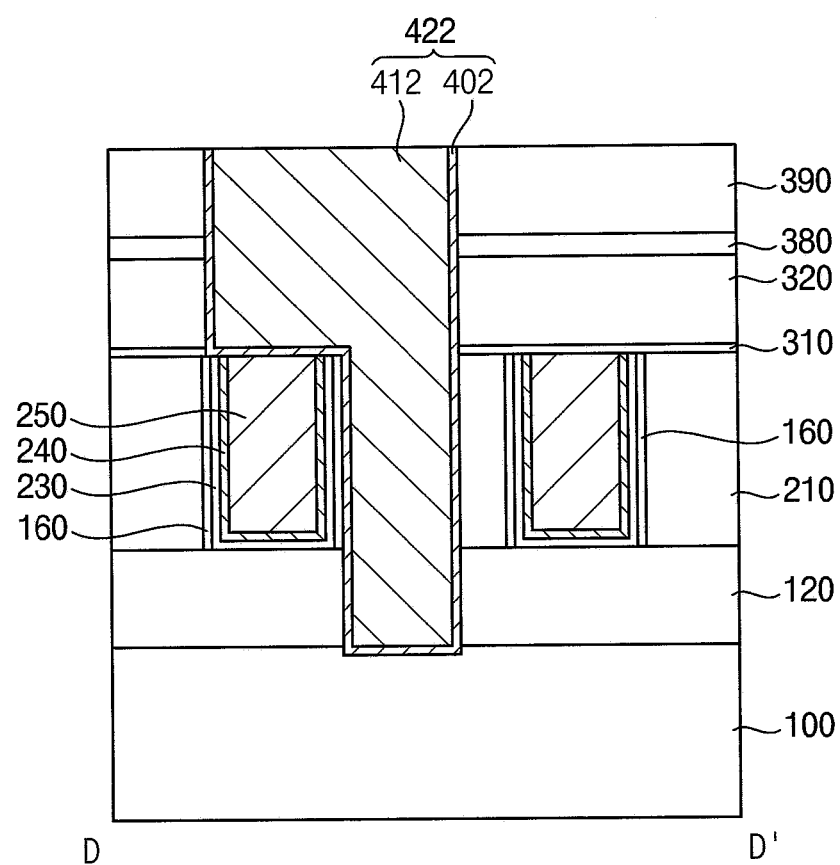

Referring to FIGS. 61 and 62, a process substantially the same as or similar to that illustrated with reference to FIGS. 50 to 54 may be performed.

Thus, the second contact plug 422 may be formed to fill the tenth opening 396, and the second contact plug 422 may be formed to contact the upper surface of the substrate 100. Accordingly, in the semiconductor device including the second contact plug 422, a leakage current may flow from the second contact plug 422 into the substrate 100 so as to generate electrical failure.

In the method of manufacturing the semiconductor device in accordance with the comparative example, the third etching process may be performed not using the upper surface of the second insulating interlayer 390 as an etching endpoint but until the portion of the fourth layer 440 filling the fifth opening 392 is sufficiently removed. Thus, in the fourth and fifth etching processes, the portions of the first insulating interlayer 320 and/or the insulation layer 210 under the fourth layer 440 may not be prevented from being etched, and thus the upper surface of the substrate 100 may be exposed by the tenth opening 396, and electrical failure may be generated by the second contact plug 422 filling the tenth opening 396.

Figure 63:
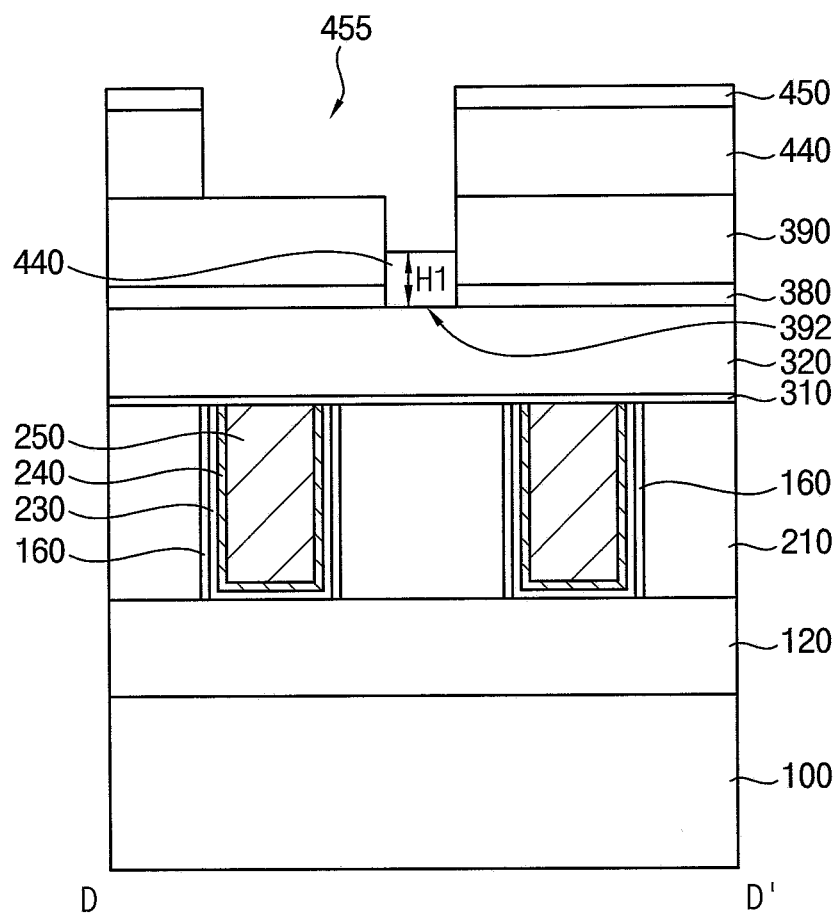
FIGS. 63 to 66 are cross-sectional views illustrating stages of a method of manufacturing a semiconductor device in accordance with example embodiments.
Figure 64:
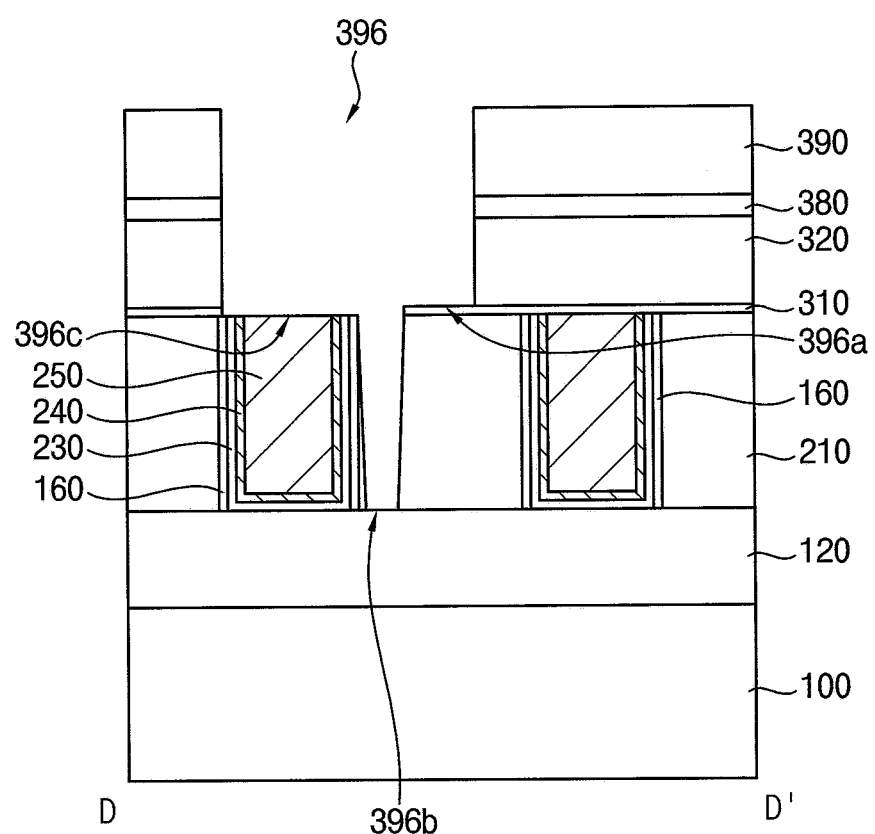
Figure 65:
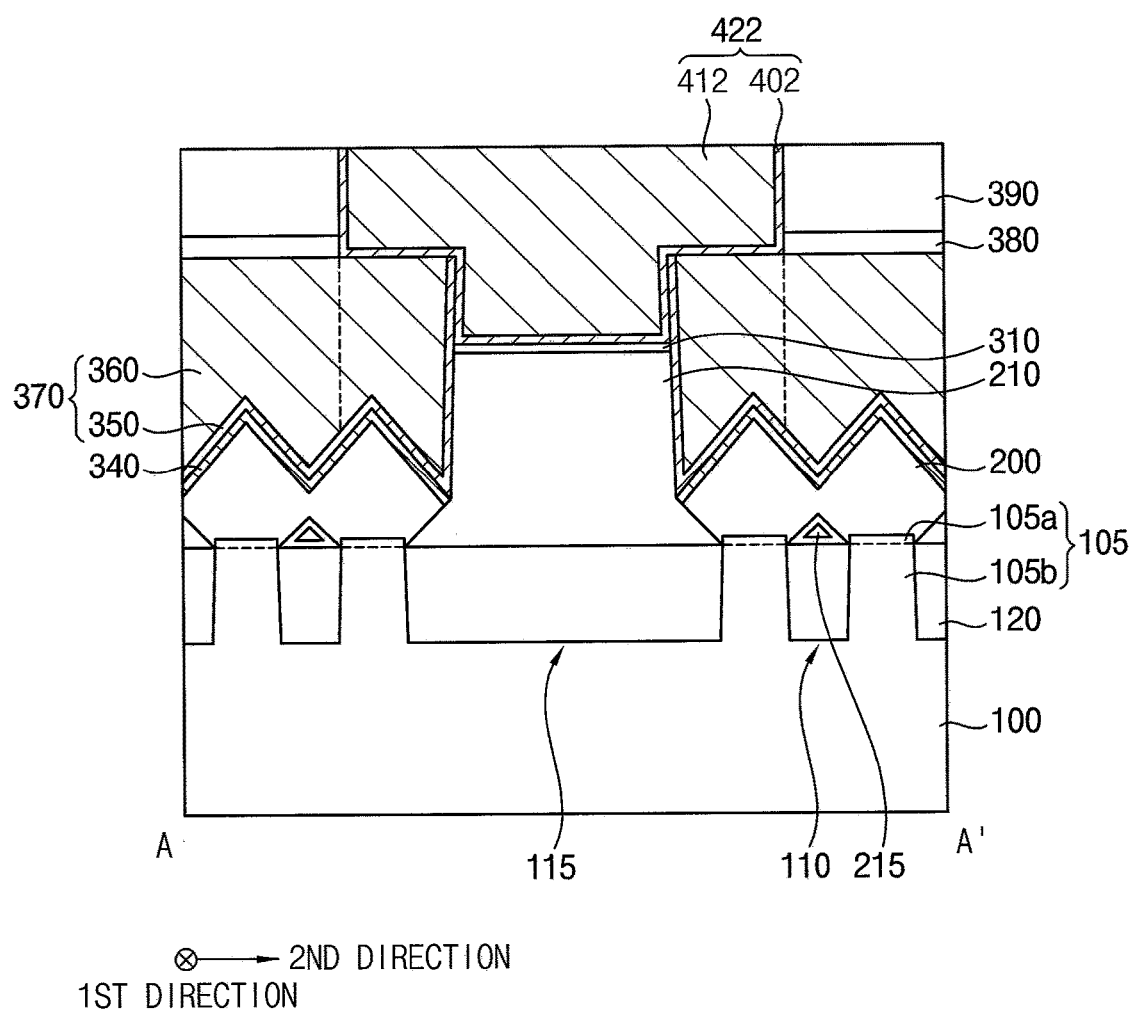
Figure 66:
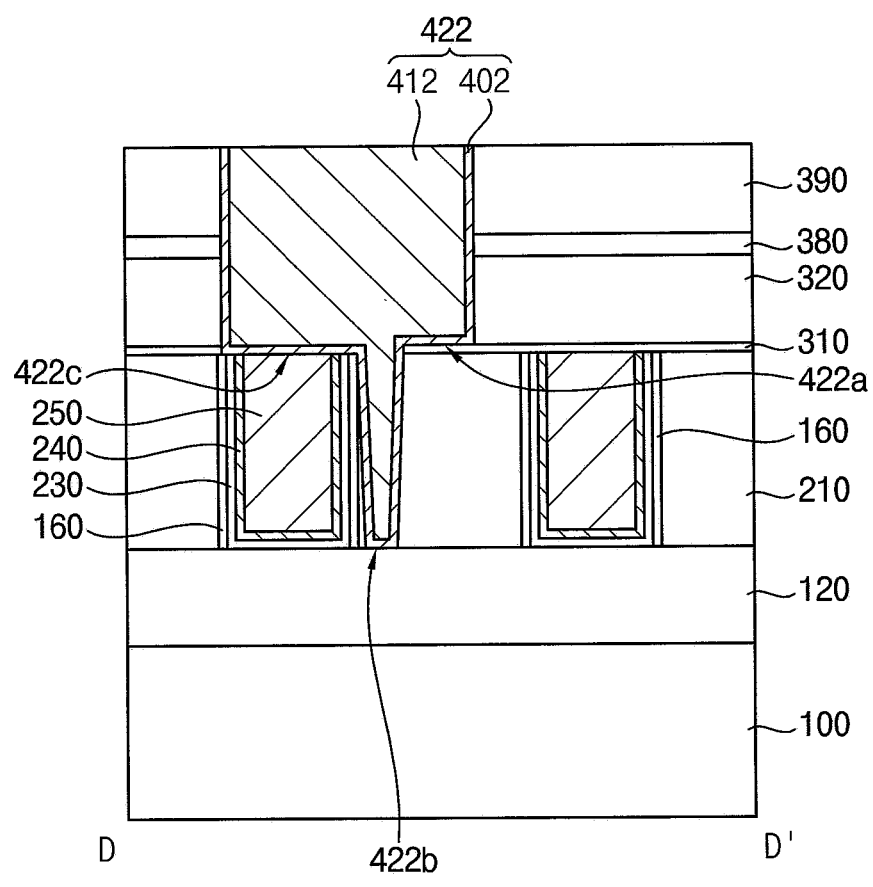

FIGS. 63 to 66 are cross-sectional views illustrating stages of a method of manufacturing a semiconductor device in accordance with example embodiments. FIGS. 63, 64 and 66 are cross-sectional views taken along lines D-D' of corresponding plan views, respectively, and FIG. 65 is a cross-sectional view taken along a line A-A' of a corresponding plan view.

This method may include processes substantially the same as or similar to those illustrated with reference to FIGS. 1 to 50, 51A, 52A, 53, and 54. Thus, like reference numerals refer to like elements, and detailed descriptions thereon are omitted herein.

Processes substantially the same as or similar to those illustrated with reference to FIGS. 1 to 41 may be performed.

Referring to FIG. 63, a process substantially the same as or similar to that illustrated with reference to FIGS. 42 to 44 may be performed.

Thus, the third etching process may be performed using the fourth photoresist pattern 470 as an etching mask to sequentially etch the sixth layer 460, the fifth layer 450 and the fourth layer 440, and the fourth photoresist pattern 470 and the sixth layer 460 may be removed in the third etching process.

However, in the third etching process, the portion of the fourth layer 440 in the fifth opening 392 on the first insulating interlayer 320 may be removed more than that of the fourth layer 440 illustrated with reference to FIGS. 42 to 44. Thus, FIG. 63 shows that the first height H1 of the remaining portion of the fourth layer 440 in the fifth opening 392 on the first insulating interlayer 320 from the upper surface of the first insulating interlayer 320 is about half of the height of the fifth opening 392, however, the inventive concepts are not limited thereto.

Referring to FIG. 64, processes substantially the same as or similar to those illustrated with reference to FIGS. 45 and 49 may be performed.

Thus, the tenth opening 396 commonly exposing upper surfaces of the gate structure 260 and the first contact plug 370 may be formed through the second insulating interlayer 390, the etch stop layer 380, the first insulating interlayer 320 and the capping layer 310. A top surface of the gate spacer 160 on a sidewall of the gate structure 260 may be also exposed by the tenth opening 396.

However, the fourth layer 440 in the fifth opening 392 on the first insulating interlayer 320 may have the first height H1 lower than that of the fourth layer 440 illustrated with reference to FIGS. 45 to 49, and thus the fourth layer 440 may prevent the first insulating interlayer 320 from being etched in the fourth and fifth etching processes for a time shorter than that of FIGS. 45 to 49 so that a portion of the first insulating interlayer 320 under the fifth opening 392 may be removed to expose an upper surface of the capping layer 310. Additionally, a portion of the insulation layer 210 adjacent the gate structure 260 may be removed to expose an upper surface of the isolation pattern 120.

That is, the first portion 396a of the bottom of the tenth opening 396 may be substantially coplanar with the upper surface of the capping layer 310, and the second portion 396b of the bottom of the tenth opening 396 may be substantially coplanar with the upper surface of the isolation pattern 120. According to etching conditions, the second portion 396b of the bottom of the tenth opening 396 may be higher or lower than the upper surface of the isolation pattern 120.

Referring to FIGS. 65 and 66, a process substantially the same as or similar to that illustrated with reference to FIGS. 50 to 54 may be performed, so that the second contact plug 422 may be formed to fill the tenth opening 396.

The first portion 422a of the bottom of the second contact plug 422 may contact the upper surface of the capping layer 310 so as to be higher than the upper surface of the gate structure 260, the second portion 422b of the bottom of the second contact plug 422 may contact the upper surface of the isolation pattern 120, and the third portion 422c of the bottom of the second contact plug 422 may contact the upper surface of the gate structure 260. Accordingly, the lowermost bottom of the second contact plug 422 may not contact the upper surface of the substrate 100 so that the electrical failure due the leakage from the second contact plug 422 may be prevented.

Figure 67:
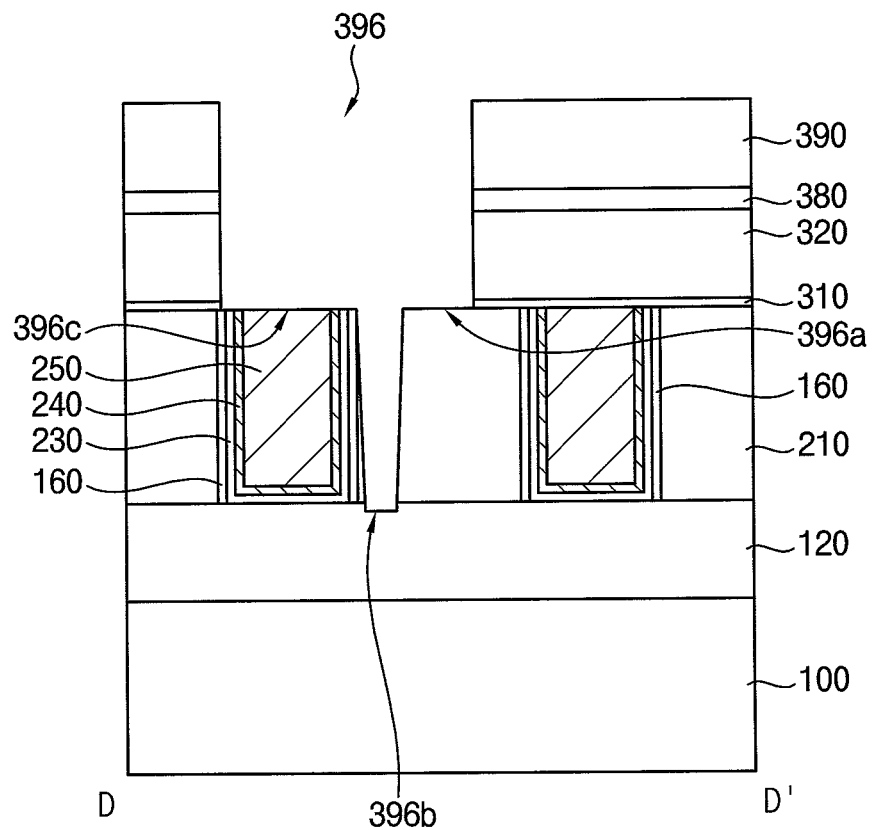
FIGS. 67 to 69 are cross-sectional views illustrating stages of a method of manufacturing a semiconductor device in accordance with example embodiments.
Figure 68:
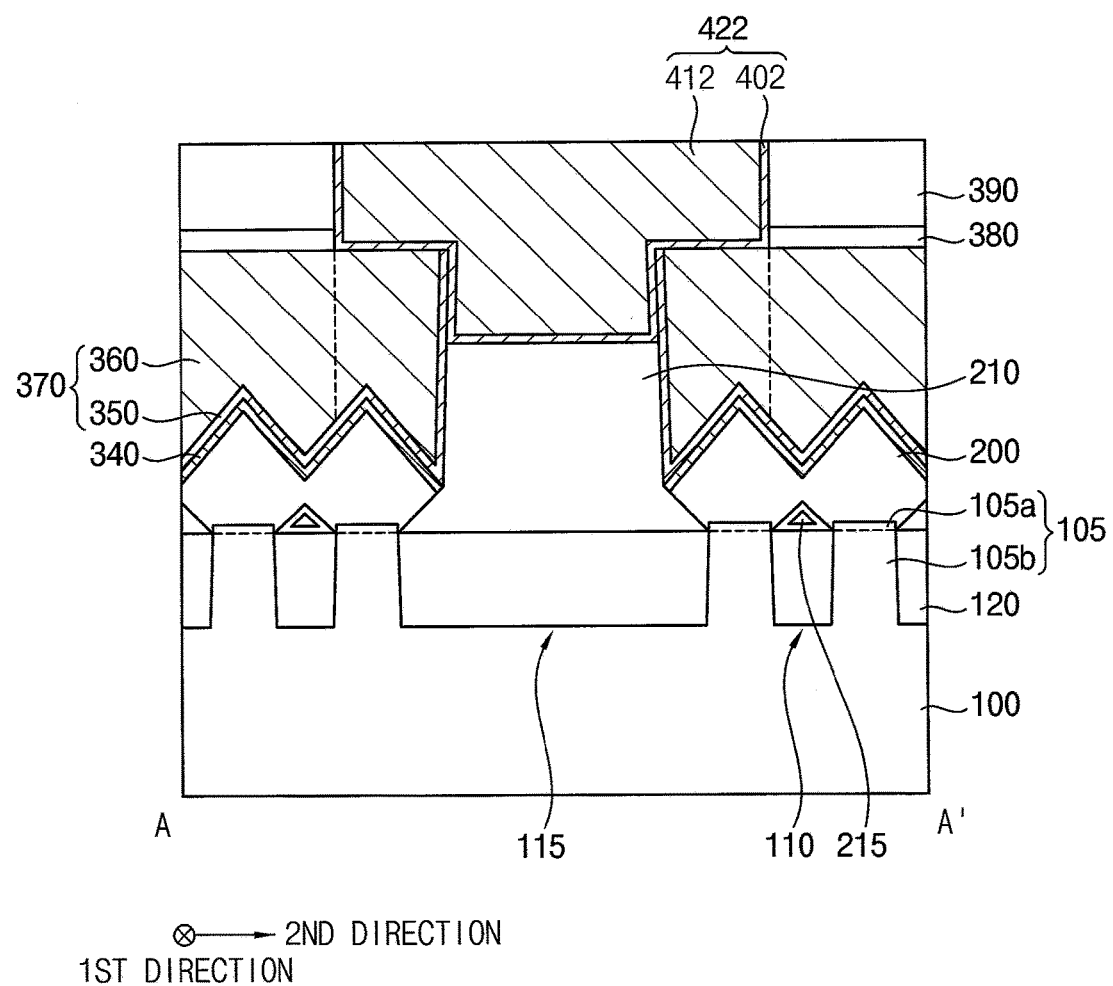
Figure 69:
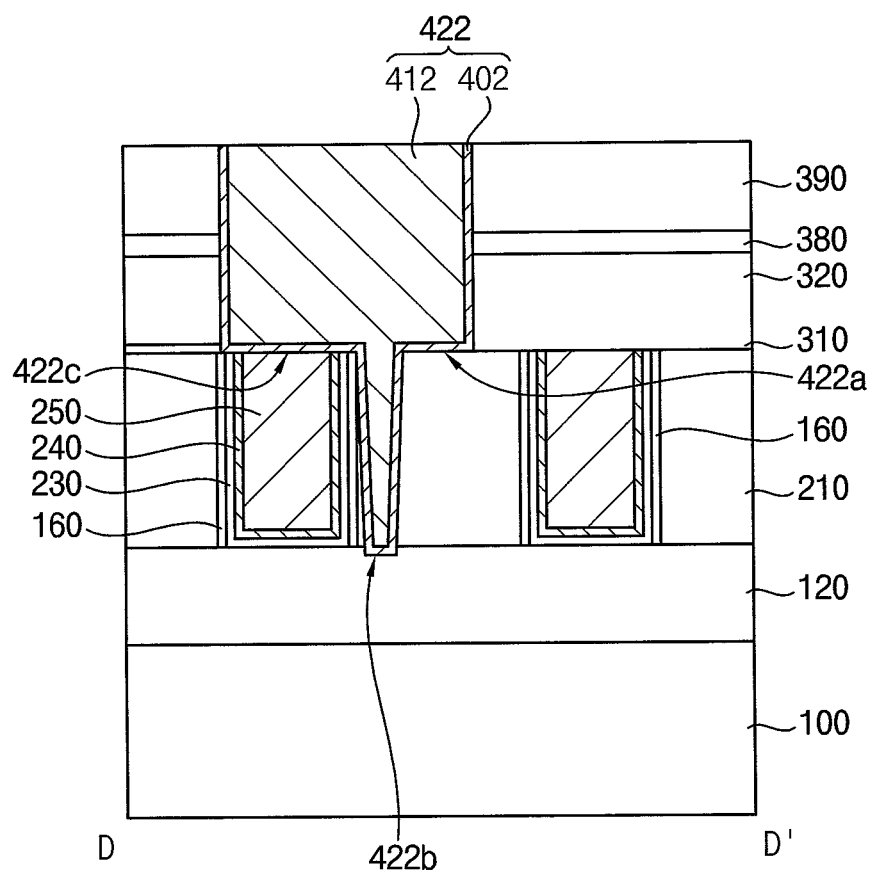

FIGS. 67 to 69 are cross-sectional views illustrating stages of a method of manufacturing a semiconductor device in accordance with example embodiments. FIGS. 67 and 69 are cross-sectional views taken along lines D-D' of corresponding plan views, respectively, and FIG. 68 is a cross-sectional view taken along a line A-A' of a corresponding plan view.

This method may include processes substantially the same as or similar to those illustrated with reference to FIGS. 1 to 50, 51A, 51B, and 52 to 54. Additionally, this method may be same as or similar to those illustrated with reference to FIGS. 63 to 66, except for the amount of the fourth layer 440 removed in the third etching process. Thus, like reference numerals refer to like elements, and detailed descriptions thereon are omitted herein.

Processes substantially the same as or similar to those illustrated with reference to FIGS. 1 to 41 may be performed.

A process substantially the same as or similar to that illustrated with reference to FIGS. 42 to 44 may be performed, however, in the third etching process, the portion of the fourth layer 440 in the fifth opening 392 on the first insulating interlayer 320 may be removed more than that of the fourth layer 440 illustrated with reference to FIG. 63. For example, the first height H1 of the remaining portion of the fourth layer 440 in the fifth opening 392 on the first insulating interlayer 320 from the upper surface of the first insulating interlayer 320 may be about ¼ to about ⅓ of the height of the fifth opening 392, however, the inventive concepts may not be limited thereto.

Referring to FIG. 67, processes substantially the same as or similar to those illustrated with reference to FIGS. 45 and 49 may be performed.

The bottom of the tenth opening 396 may be slightly lower than that of FIG. 64. Particularly, the first portion 396a of the bottom of the tenth opening 396 may be substantially coplanar with the upper surface of the insulation layer 210, and the second portion 396b of the bottom of the tenth opening 396 may be lower than the upper surface of the isolation pattern 120 and higher than the upper surface of the substrate 100. According to etching conditions, the second portion 396b of the bottom of the tenth opening 396 may be higher than or substantially coplanar with the upper surface of the isolation pattern 120.

Referring to FIGS. 68 and 69, a process substantially the same as or similar to that illustrated with reference to FIGS. 50 to 54 may be performed to form the second contact plug 422 filling the tenth opening 396.

The first portion 422a of the bottom of the second contact plug 422 may contact the upper surface of the insulation layer 210 so as to be substantially coplanar with the upper surface of the gate structure 260. The second portion 422b of the bottom of the second contact plug 422 may be lower than the upper surface of the isolation pattern 120 and higher than the upper surface of the substrate 100. The third portion 422c of the bottom of the second contact plug 422 may contact the upper surface of the gate structure 260. Thus, a lowermost portion of the bottom of the second contact plug 422 may not contact the upper surface of the substrate 100, so that the electrical failure due to the leakage current from the second contact plug 422 may be prevented.

Figure 70:
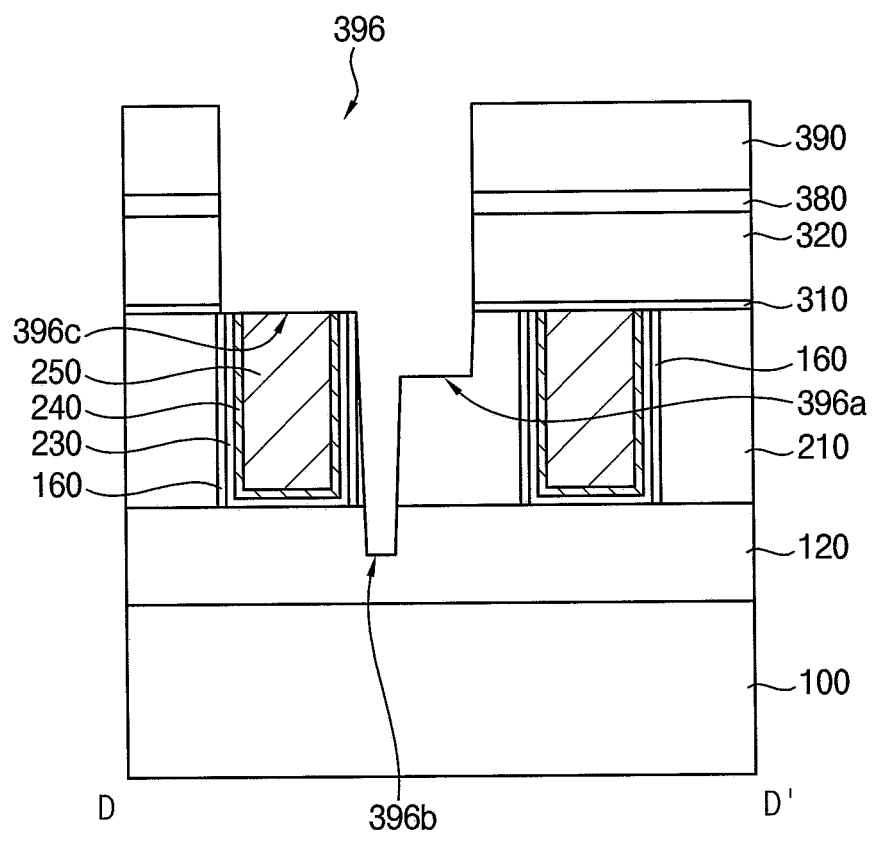
FIGS. 70 to 72 are cross-sectional views illustrating stages of a method of manufacturing a semiconductor device in accordance with example embodiments.
Figure 71:
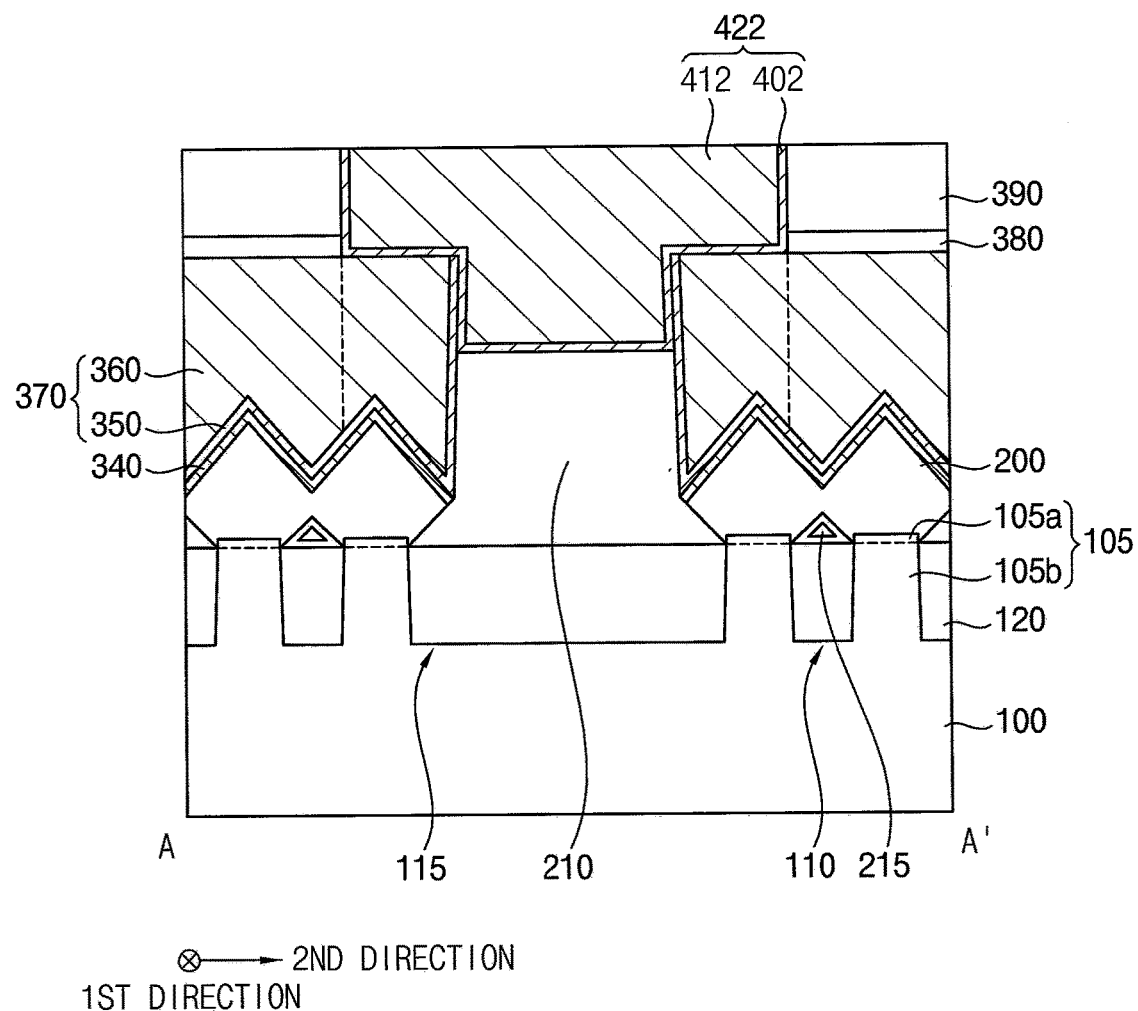
Figure 72:
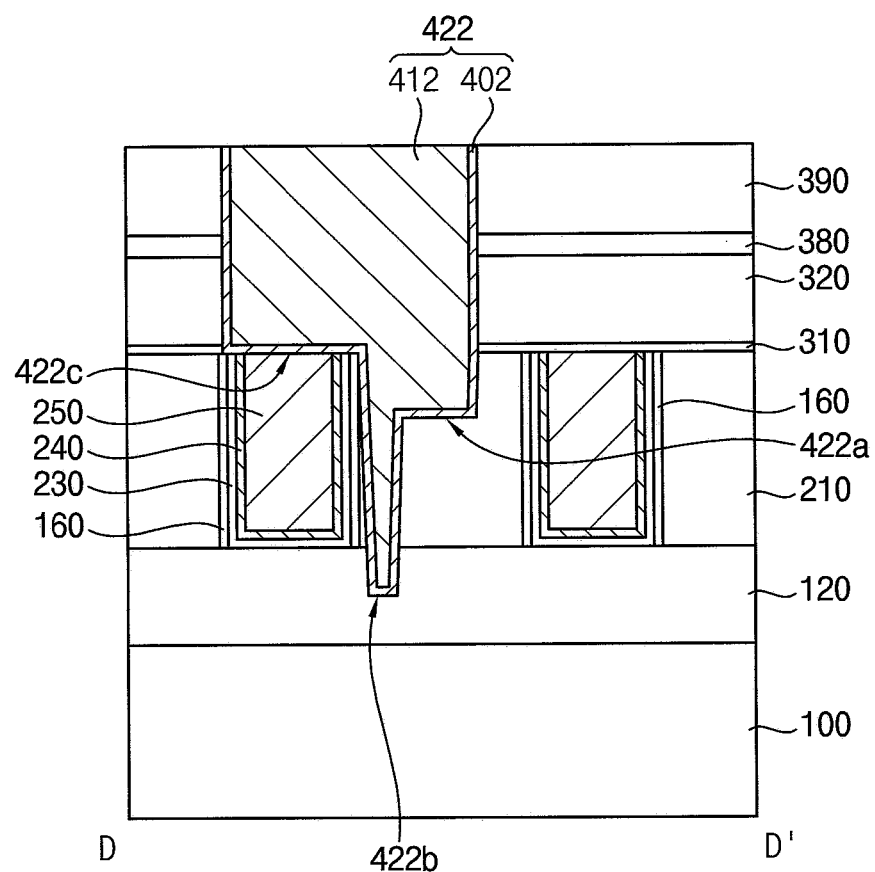

FIGS. 70 to 72 are cross-sectional views illustrating stages of a method of manufacturing a semiconductor device in accordance with example embodiments. FIGS. 70 and 72 are cross-sectional views taken along lines D-D' of corresponding plan views, respectively, and FIG. 71 is a cross-sectional view taken along a line A-A' of a corresponding plan view.

This method may include processes substantially the same as or similar to those illustrated with reference to FIGS. 1 to 54. Additionally, this method may be same as or similar to those illustrated with reference to FIGS. 63 to 66 or those illustrated with reference to FIGS. 67 to 69, except for the amount of the fourth layer 440 removed in the third etching process. Thus, like reference numerals refer to like elements, and detailed descriptions thereon are omitted herein.

First, processes substantially the same as or similar to those illustrated with reference to FIGS. 1 to 41 may be performed.

A process substantially the same as or similar to that illustrated with reference to FIGS. 42 to 44 may be performed, however, in the third etching process, the portion of the fourth layer 440 in the fifth opening 392 on the first insulating interlayer 320 may be etched more than that in the third etching process illustrated with reference to FIG. 67. For example, after the third etching process, the first height H1 of the fourth layer 440 in the fifth opening 392 from the upper surface of the first insulating interlayer 320 may be about ¼ to about ⅓, however, the inventive concepts may not be limited thereto.

Referring to FIG. 70, a process substantially the same as or similar to that illustrated with reference to FIGS. 45 to 49 may be performed.

Thus, the bottom of the tenth opening 396 may be lower than that of FIG. 67. Particularly, the first portion 396a of the bottom of the tenth opening 396 may be lower than the upper surface of the insulation layer 210, and the second portion 396b of the bottom of the tenth opening 396 may be lower than the upper surface of the isolation pattern 120 and higher than the upper surface of the substrate 100.

Referring to FIGS. 71 and 72, a process substantially the same as or similar to that illustrated with reference to FIGS. 50 to 54 may be performed, so that the second contact plug 422 may be formed to fill the tenth opening 396.

The first portion 422a of the bottom of the second contact plug 422 may be lower than the upper surface of the insulation layer 210 so as to be lower than the upper surface of the gate structure 260, the second portion 422b of the bottom of the second contact plug 422 may be lower than the upper surface of the isolation pattern 120 and higher than the upper surface of the substrate 100, and the third portion 422c of the bottom of the second contact plug 422 may contact the upper surface of the gate structure 260. Accordingly, the lowermost bottom of the second contact plug 422 may not contact the upper surface of the substrate 100 so that the electrical failure due the leakage from the second contact plug 422 may be prevented.

Figure 73:
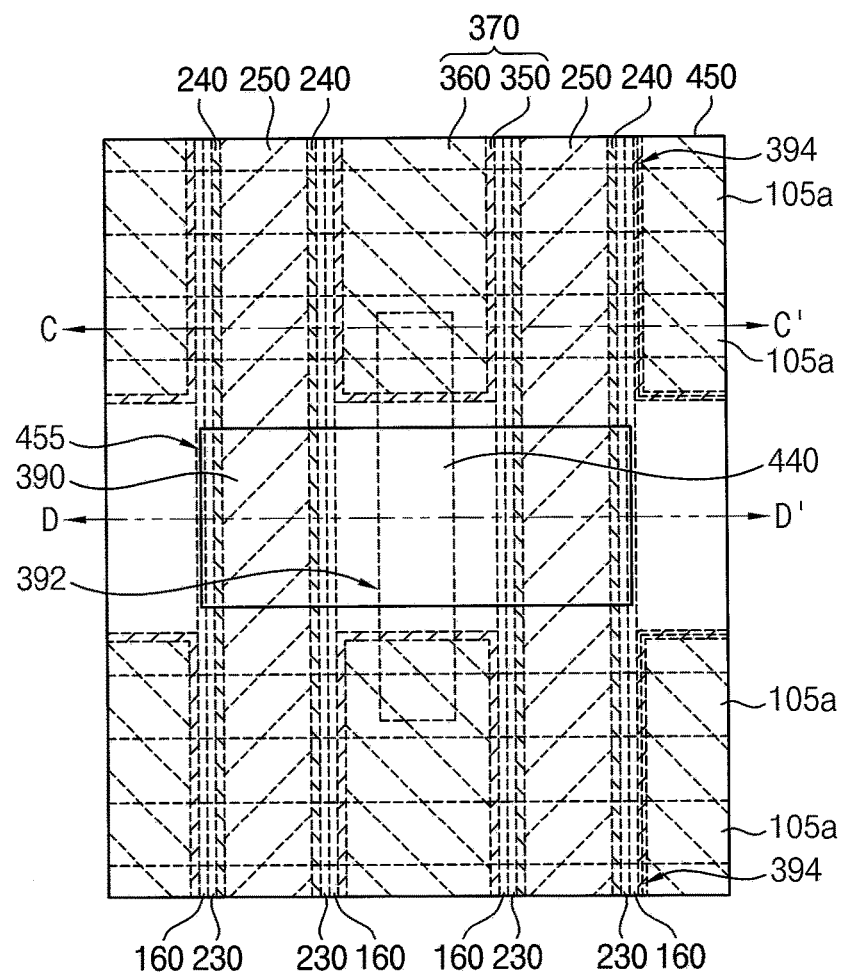
FIGS. 73 to 76 are plan views and cross-sectional views illustrating stages of a method of manufacturing a semiconductor device in accordance with example embodiments.
Figure 73:
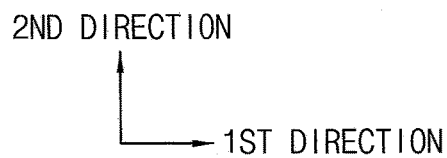
Figure 74:
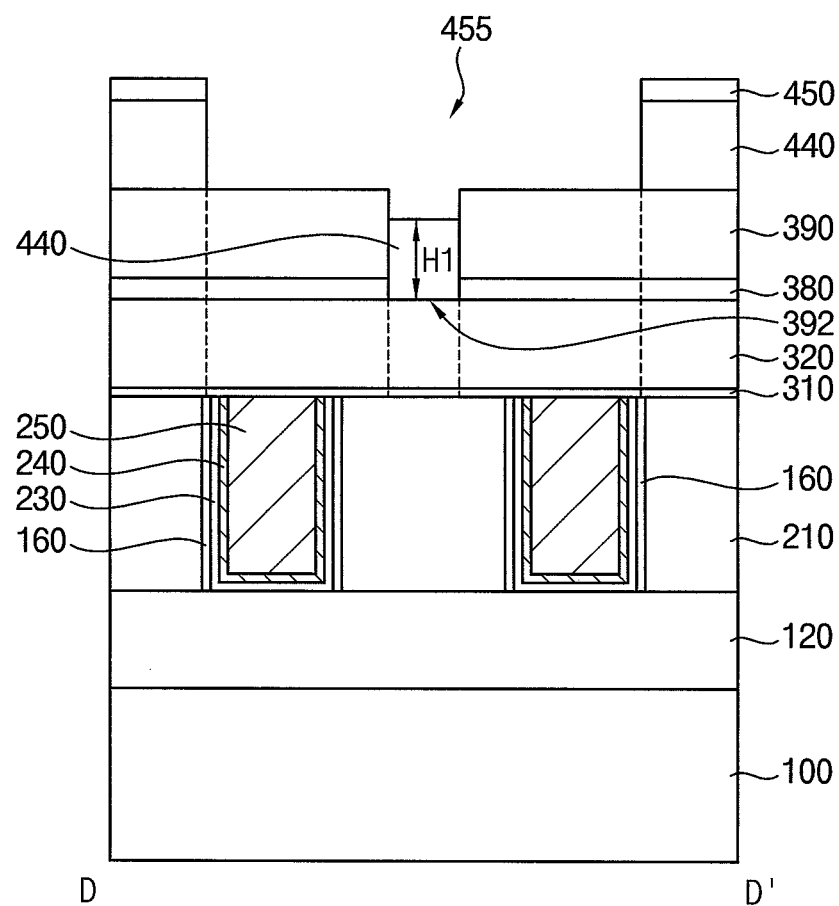
Figure 75:
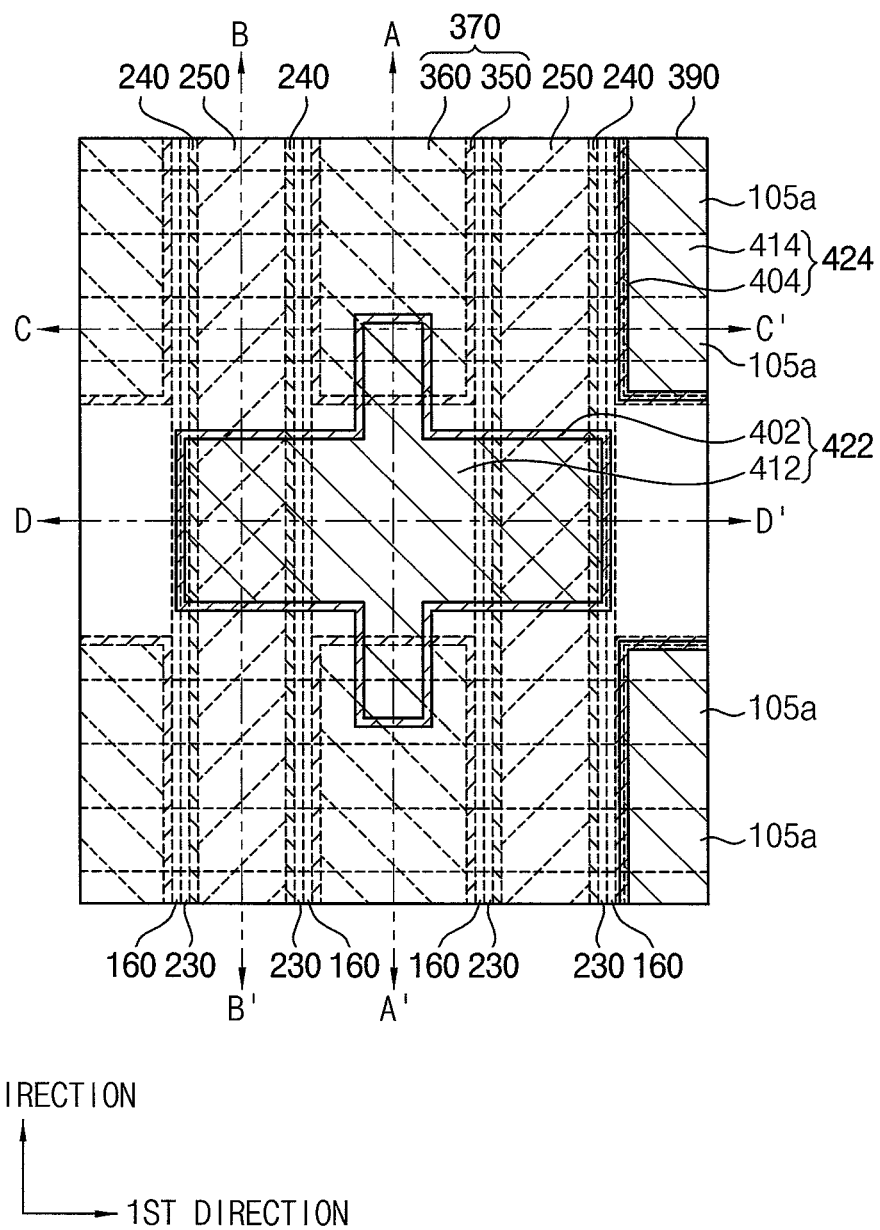
Figure 76:
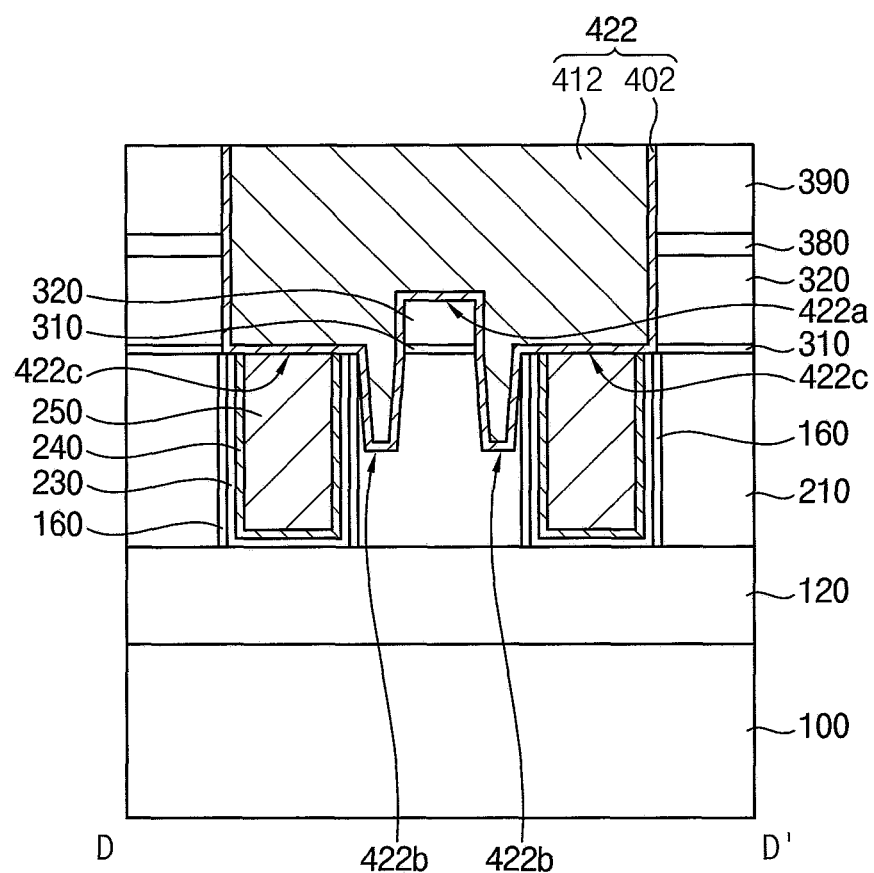

FIGS. 73 to 76 are plan views and cross-sectional views illustrating stages of a method of manufacturing a semiconductor device in accordance with example embodiments. FIGS. 73 and 75 are plan views, and FIGS. 74 and 76 are cross-sectional views. Particularly, FIGS. 74 and 76 are cross-sectional views taken along lines D-D' of FIGS. 73 and 75, respectively.

This method may include processes substantially the same as or similar to those illustrated with reference to FIGS. 1 to 54. Thus, like reference numerals refer to like elements, and detailed descriptions thereon are omitted herein.

Processes substantially the same as or similar to those illustrated with reference to FIGS. 1 to 41 may be performed.

Referring to FIGS. 73 and 74, a process substantially the same as or similar to those illustrated with reference to FIGS. 42 and 44 may be performed.

However, while the eighth opening 455 may be formed to vertically overlap one of the gate structures 260 and a portion of the first insulating interlayer 320 adjacent thereto in the first direction in the process illustrated with reference to FIGS. 42 to 44, the eighth opening 455 may be formed to vertically overlap two of the gate structures 260 and a portion of the first insulating interlayer 320 therebetween in the process illustrated with reference to FIGS. 73 and 74.

Referring to FIGS. 75 and 76, processes substantially the same as or similar to those illustrated with reference to FIGS. 45 to 54 may be performed, so that the second and third contact plugs 422 and 424 may be formed.

The first portion 422a of the bottom (e.g., bottom surface) of the second contact plug 422 may be formed in the first insulating interlayer 320 so as to be higher than the upper surface of the gate structure, the second portions 422b of the bottom (e.g., bottom surface) of the second contact plug 422 may be formed in the insulation layer 210 so as to be lower than the upper surface of the gate structure 260, and the third portion 422c of the bottom of the second contact plug 422 may contact the upper surface of the gate structure 260.

The bottom of the second contact plug 422 may have a concave portion with the first portion 422a of the bottom of the second contact plug 422 as an upper surface, and also have a convex portion (e.g., it may include two convex portions) with the second portion 422b of the bottom of the second contact plug 422 as a lower surface. In example embodiments, the concave portion may be filled with an insulation layer structure including the insulation layer 210, the capping layer 310 and the first insulating interlayer 320 sequentially stacked. In example embodiments, the insulation layer 210, the capping layer 310 and the first insulating interlayer 320 may include an oxide, a nitride and an oxide, respectively, and thus the insulation layer structure may include a first oxide layer, a nitride layer and a second oxide layer sequentially stacked.

A lowermost bottom of the second contact plug 422, i.e., the lowest surface of the convex portion of the bottom of the second contact plug 422, may not contact the upper surface of the substrate 100, and thus the electrical failure due to the leakage current from the contact plug 422 to the substrate 100 may be prevented.

FIGS. 77 to 81 are cross-sectional views illustrating semiconductor devices, respectively, in accordance with example embodiments. FIGS. 77 to 81 are cross-sectional views taken along lines D-D' of corresponding plan views, respectively. The semiconductor devices may be substantially the same as or similar to those manufactured by the above methods, except for the shape of the second contact plug. Thus, like reference numerals refer to like elements, and detailed descriptions thereon are omitted herein.

Figure 77:
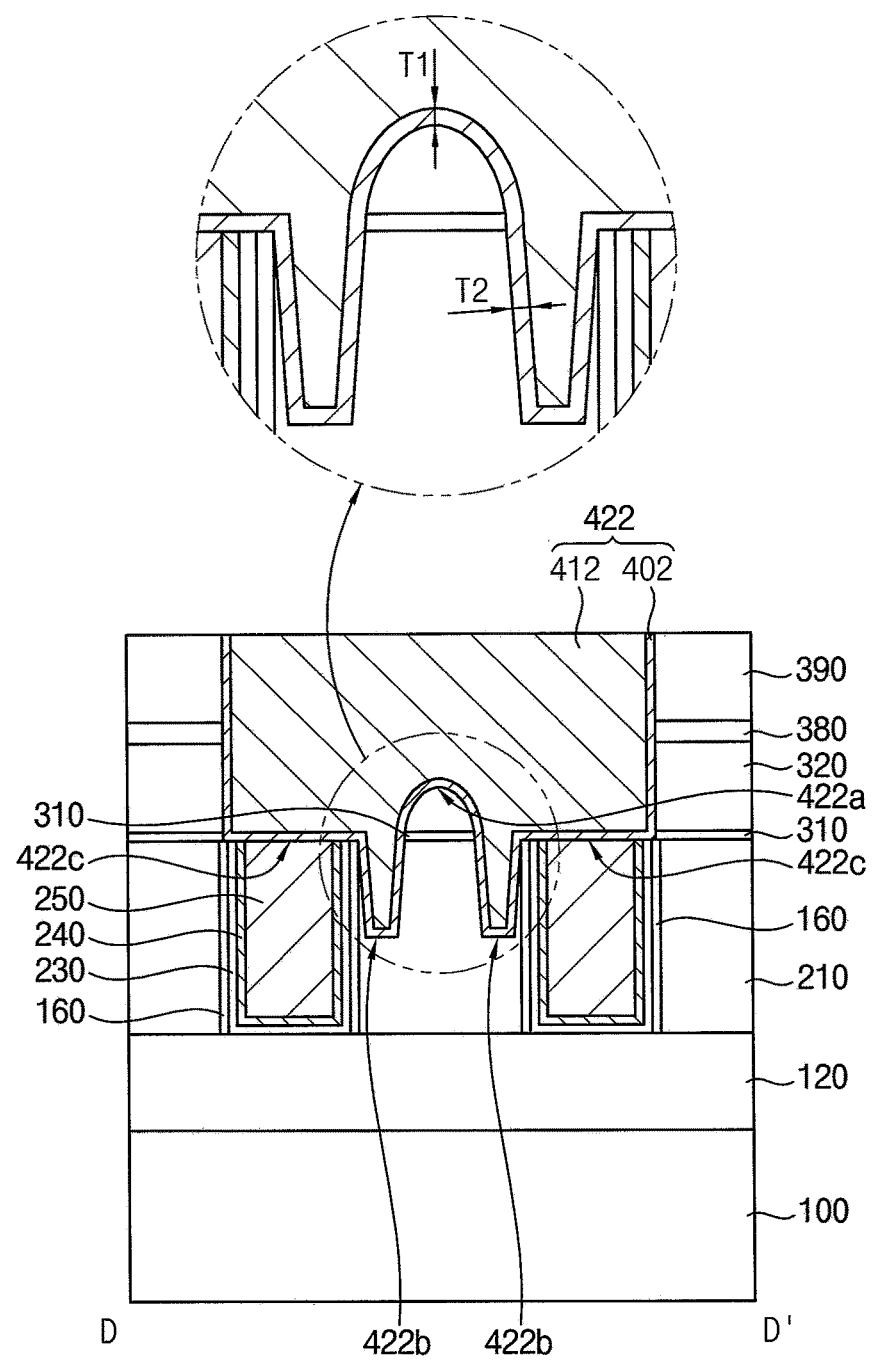
FIGS. 77 to 81 are cross-sectional views illustrating semiconductor devices, respectively, in accordance with example embodiments.

Referring to FIG. 77, the semiconductor device may be substantially the same as or similar to that of FIGS. 75 and 76, except for the shape of the second contact plug 422.

In example embodiments, the concave portion of the bottom of the second contact plug 422 at the first portion 422a thereof may have a width (e.g., in a first direction) gradually decreasing from a bottom toward a top thereof. The concave portion may have a curved shape, such as an arc shape, or a hump shape.

Figure 78:
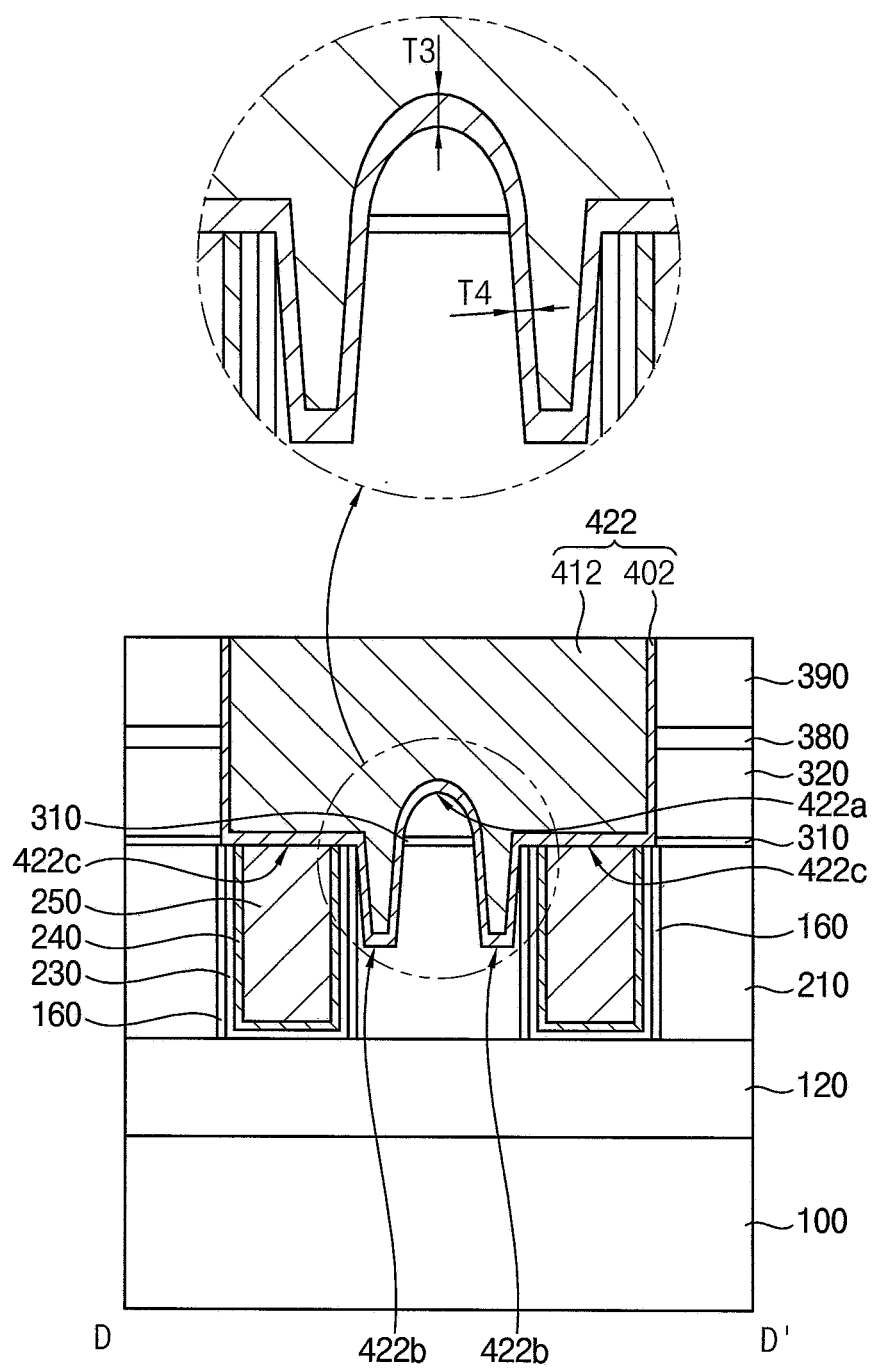

Referring to FIG. 78, the semiconductor device may be substantially the same as or similar to that of FIG. 77, except for the thickness of the second barrier pattern 402 of the second contact plug 422.

Particularly, the second barrier pattern 402 shown in FIG. 77 may have a first thickness T1 at an uppermost portion of the concave portion of the bottom of the second contact plug 422, and may have a second thickness T2 at a sidewall of the concave portion or at a sidewall of the convex portion thereof. The first and second thicknesses T1 and T2 may be substantially the same as each other.

The second barrier pattern 402 shown in FIG. 78 may have a third thickness T3 at an uppermost portion of the concave portion of the bottom of the second contact plug 422, and may have a fourth thickness T4 at a sidewall of the concave portion or at a sidewall of the convex portion thereof. The third thickness T3 may be greater than the fourth thickness T4.

Figure 79:
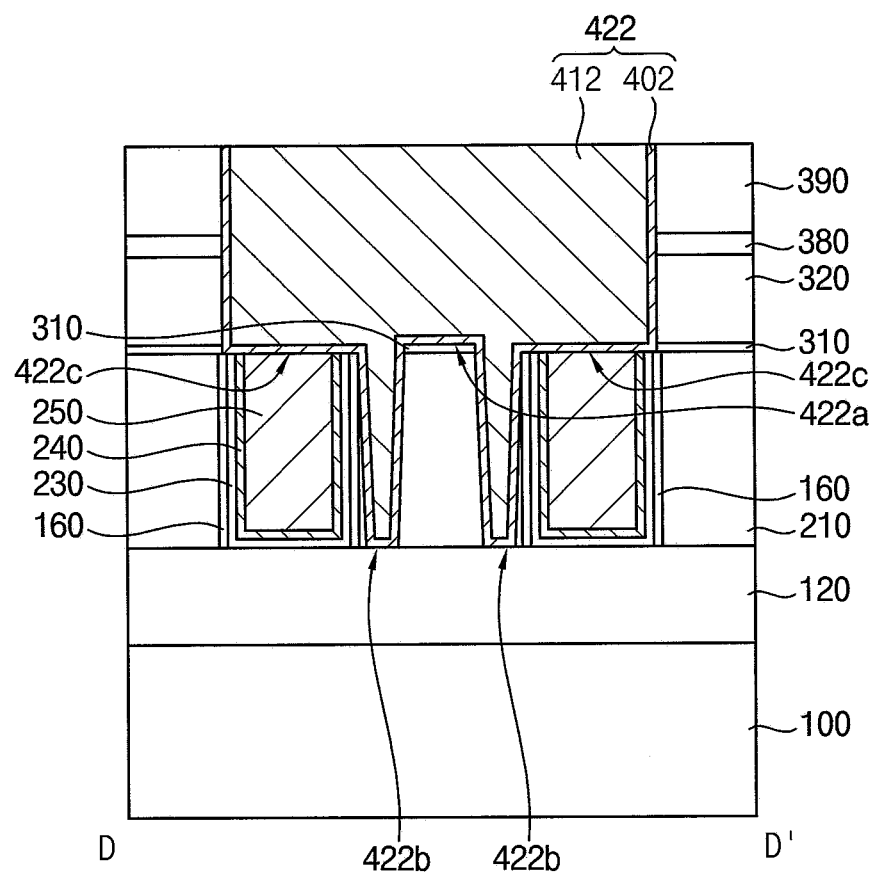

Referring to FIG. 79, the semiconductor device may be substantially the same as or similar to that of FIG. 76, except for the shape of the second contact plug 422.

In example embodiments, an upper surface of the concave portion of the bottom of the second contact plug 422 at the first portion 422*a* of the bottom of the second contact plug 422 may be higher than the upper surface of the insulation layer 210 or the upper surface of the gate structure 260, and the capping layer 310 may be formed between the upper surface of the concave portion and the insulation layer 210.

In example embodiments, a lower surface of the convex portion of the bottom of the second contact plug 422 at the second portion 424*a* of the bottom of the second contact plug 422 may be coplanar with, or lower or higher than the upper surface of the isolation pattern 120, and at least higher than the upper surface of the substrate 100.

Figure 80:
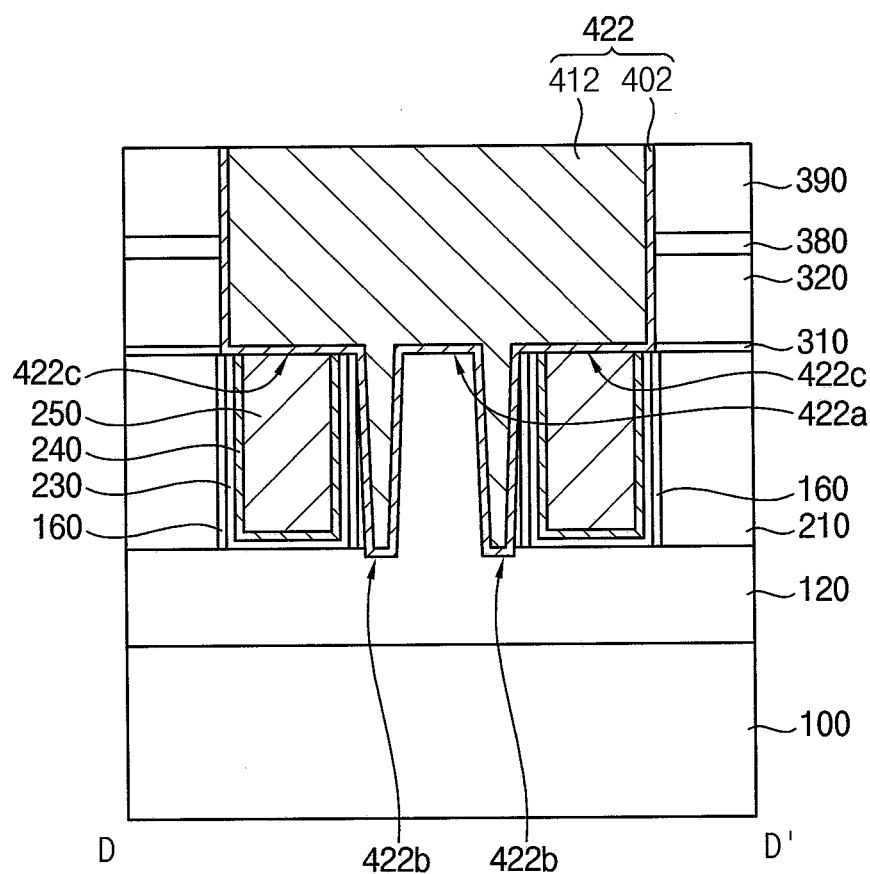

Referring to FIG. 80, the semiconductor device may be substantially the same as or similar to that of FIG. 76, except for the shape of the second contact plug 422.

In example embodiments, the first portion 422*a* of the bottom of the second contact plug 422 may contact the upper surface of the insulation layer 210 so as to be coplanar with the upper surface of the gate structure 260.

In example embodiments, a lower surface of the convex portion of the bottom of the second contact plug 422 at the second portion 424*a* of the bottom of the second contact plug 422 may be coplanar with, or lower or higher than the upper surface of the isolation pattern 120, and at least higher than the upper surface of the substrate 100.

Figure 81:
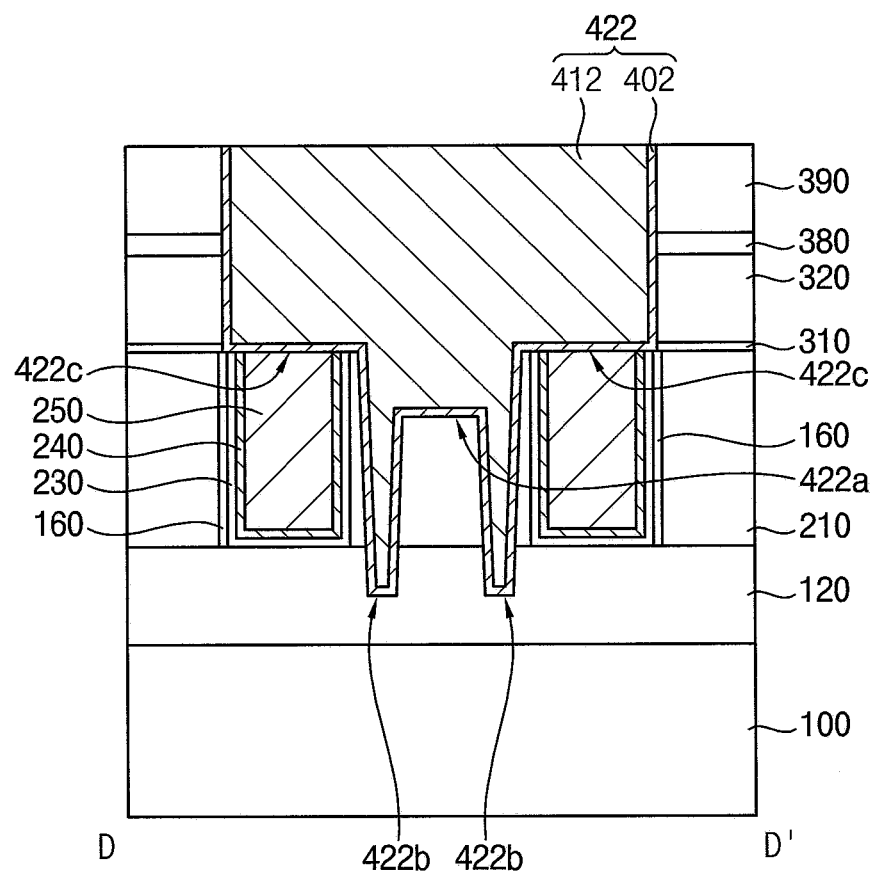

Referring to FIG. 81, the semiconductor device may be substantially the same as or similar to that of FIG. 76, except for the shape of the second contact plug 422.

In example embodiments, an upper surface of the concave portion of the bottom of the second contact plug 422 at the first portion 422*a* of the bottom of the second contact plug 422 may be lower than the upper surface of the insulation layer 210, and thus may be lower than the upper and lower surfaces of the gate structure 260. The concave portion may be filled with the isolation pattern 120 and the insulation layer 210 sequentially stacked.

In example embodiments, a lower surface of the convex portion of the bottom of the second contact plug 422 at the second portion 424*a* of the bottom of the second contact plug 422 may be lower than the upper surface of the isolation pattern 120 but higher than the upper surface of the substrate 100.

Figure 82:
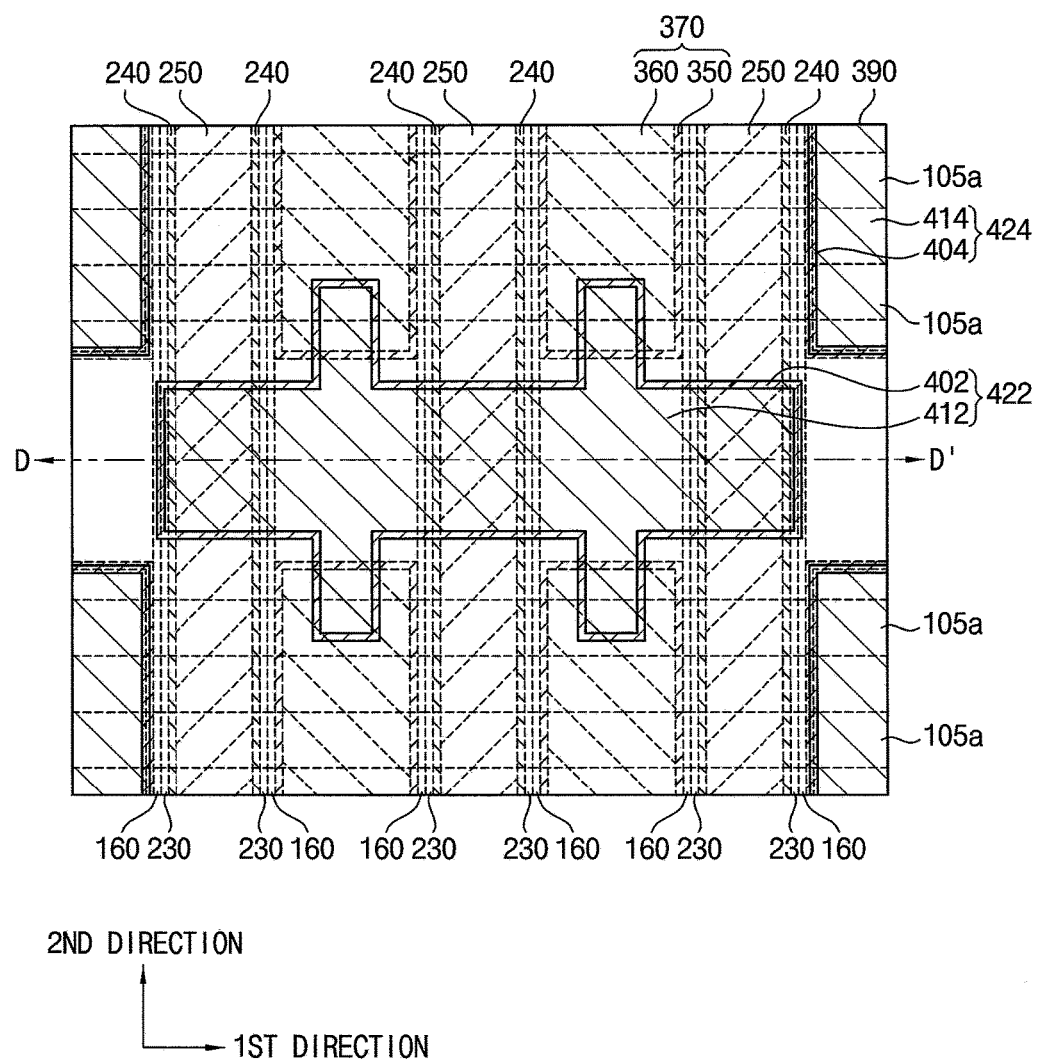
FIGS. 82 and 83 are a plan view and a cross-sectional view illustrating a semiconductor device in accordance with example embodiments.
Figure 83:
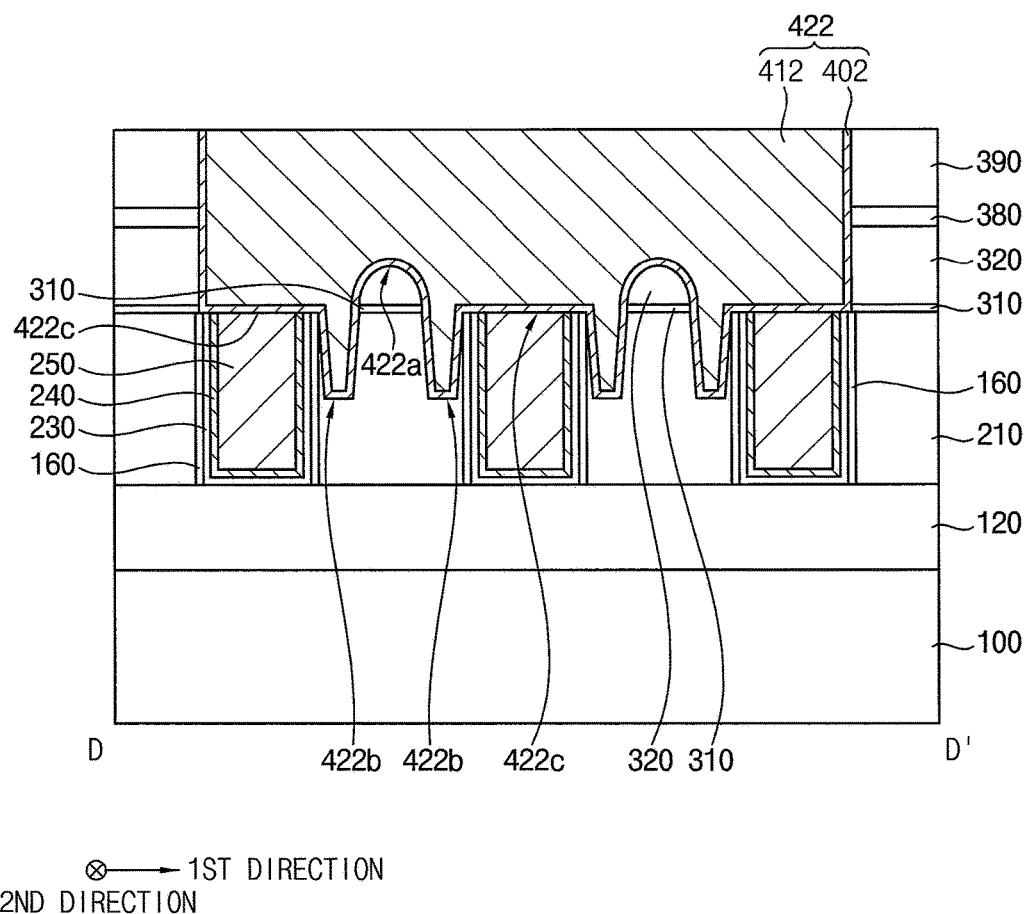

FIGS. 82 and 83 are a plan view and a cross-sectional view illustrating a semiconductor device in accordance with example embodiments. FIG. 83 is a cross-sectional view taken along a line D-D' of FIG. 82.

The semiconductor devices may be substantially the same as or similar to that of FIG. 77, except for the shape of the second contact plug. Thus, like reference numerals refer to like elements, and detailed descriptions thereon are omitted herein.

Referring to FIGS. 82 and 83, the second contact plug 422 may include a first extension portion and a second extension portion. The first extension portion may extend in the second direction, and may contact an upper surface of the first contact plug 370. The second extension portion may extend in the first direction, and may contact an upper surface of the gate structure 260.

In example embodiments, a plurality of first extension portions may be formed in the first direction, and the second extension portion may contact upper surfaces of ones of the gate structures 260. FIGS. 82 and 83 show that the second extension portion contacts upper surfaces of two of the gate structures 260, however, the inventive concepts is not limited thereto.

In example embodiments, at an area in which the first and second extension portions meet each other, a concave portion may be formed at the first portion 422*a* of the bottom of the second contact plug 422, and a convex portion may be formed at the second portion 422*b* of the bottom of the second contact plug 422.

Figure 84:
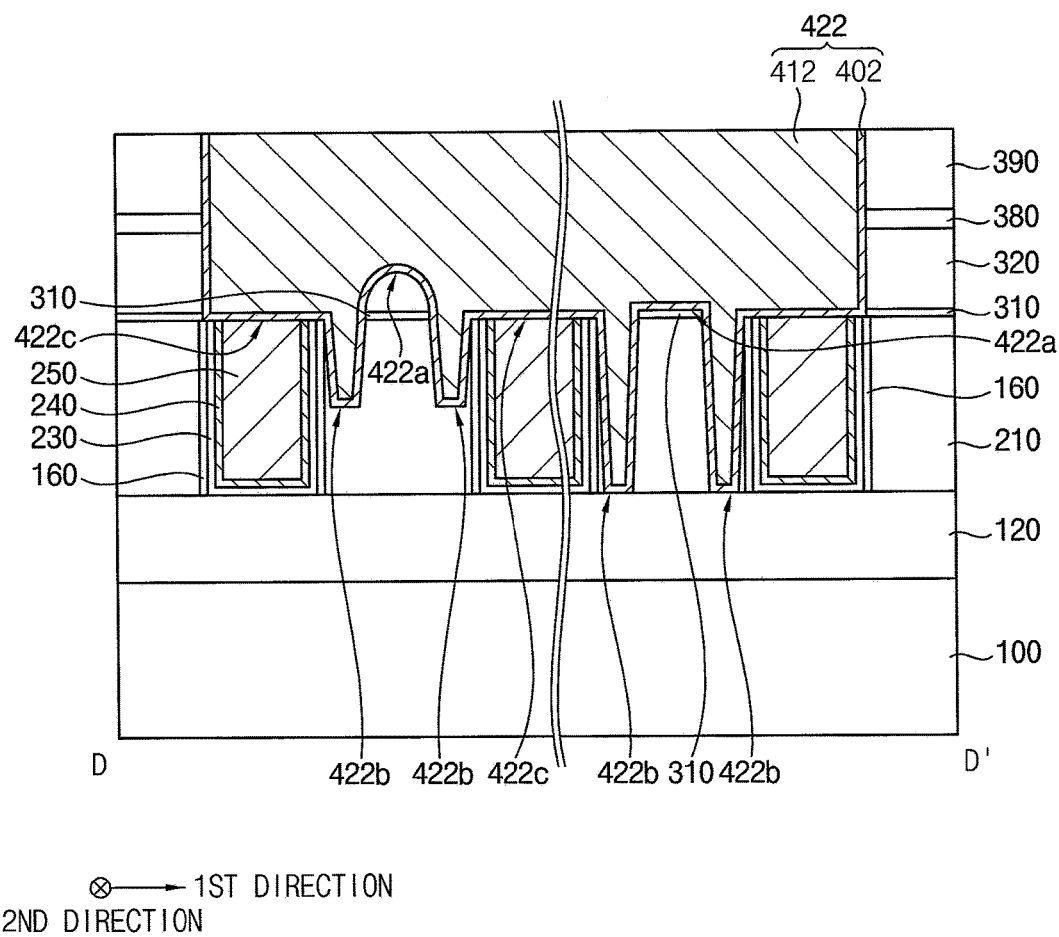
FIGS. 84 to 86 are cross-sectional views illustrating semiconductor devices, respectively, in accordance with example embodiments.
Figure 85:
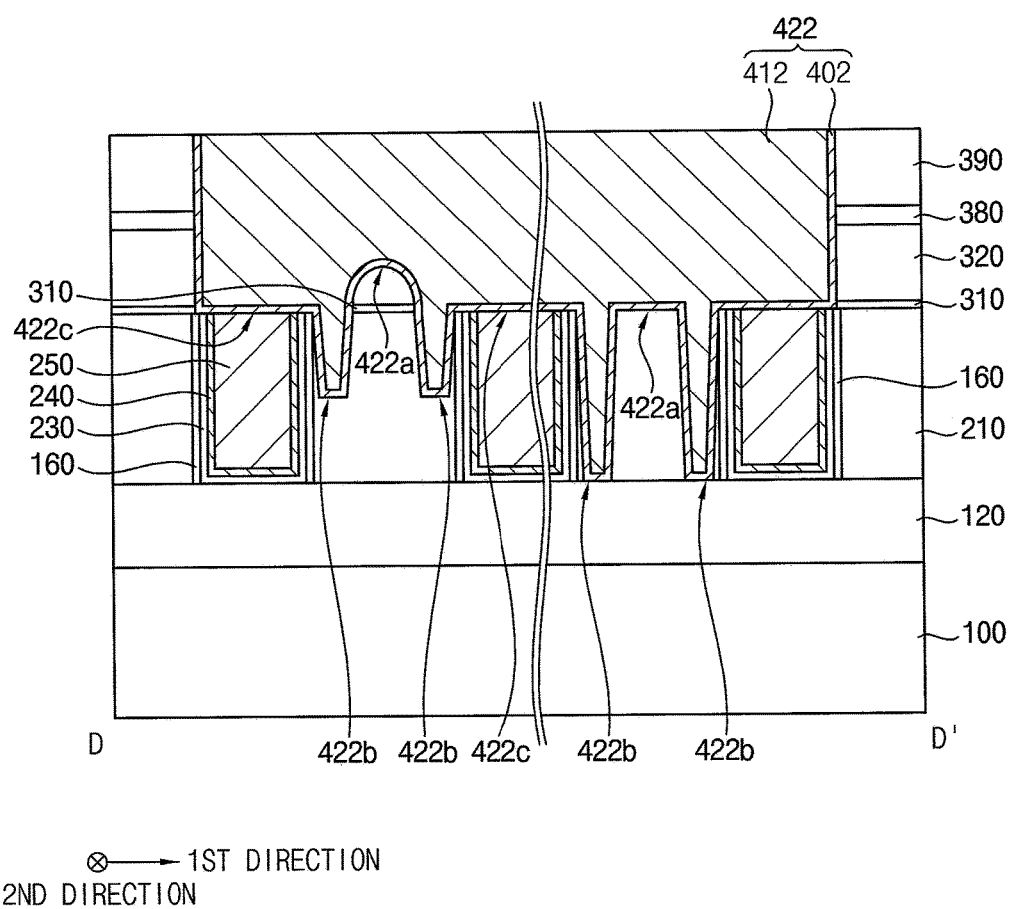
Figure 86:
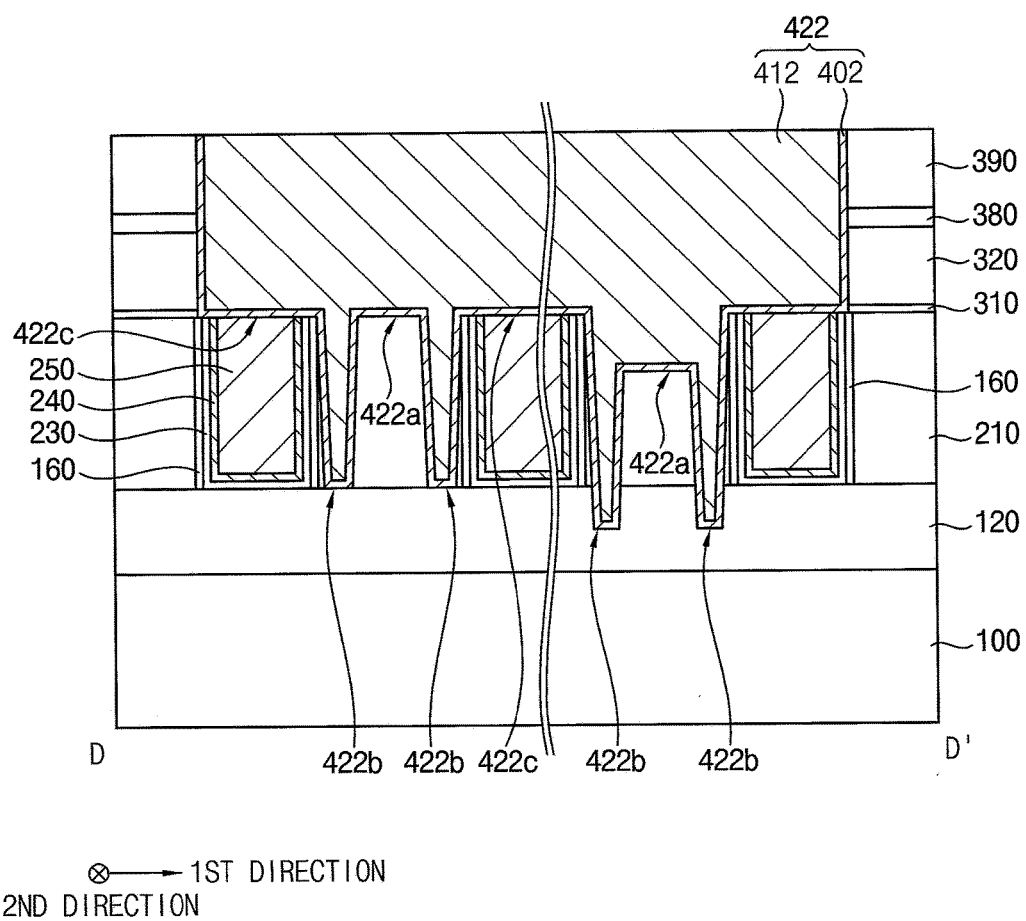

FIGS. 84 and 86 are cross-sectional views illustrating semiconductor devices, respectively, in accordance with example embodiments. FIGS. 84 to 86 are cross-sectional views taken along a line D-D' of FIG. 82.

The semiconductor devices may be substantially the same as or similar to that of FIGS. 82 and 83, except for the shape of the second contact plug. Thus, like reference numerals refer to like elements, and detailed descriptions thereon are omitted herein.

Referring to FIGS. 84 and 86, the bottom of the second contact plug 422 of each semiconductor device may include a plurality of first portions 422*a* and a plurality of second portions 422*b*, and may have the shapes shown in FIGS. 77 and 79 to 81, respectively.

In the method of manufacturing the semiconductor device illustrated with reference to FIGS. 1 to 54, a plurality of fifth openings 392 may be formed, and the eighth openings 455 vertically overlapping the fifth openings 392 at a plurality of areas, respectively, may be formed by the third etching process. The third etching process may be performed using the upper surface of the second insulating interlayer 390 as an etching endpoint, and the portion of the fourth layer 440 in the fifth opening 392 may be etched to a given amount. However, when the plurality of fifth openings 392 is formed, the portions of the fourth layer 440 remaining in the fifth openings 392, respectively, may not be etched to the same amount, and thus the shape of the bottom of the second contact plug 422 may be different according to positions thereof.

For example, FIG. 84 shows that the bottom of the second contact plug 422 including both of the first portion 422*a* having the shape of FIG. 77 and the first portion 422*a* having the shape of FIG. 79. FIG. 85 shows that the bottom of the second contact plug 422 including both of the first portion 422*a* having the shape of FIG. 77 and the first portion 422*a* having the shape of FIG. 80. FIG. 86 shows that the bottom of the second contact plug 422 including both of the first portion 422*a* having the shape of FIG. 80 and the first portion 422*a* having the shape of FIG. 81.

Figure 87:
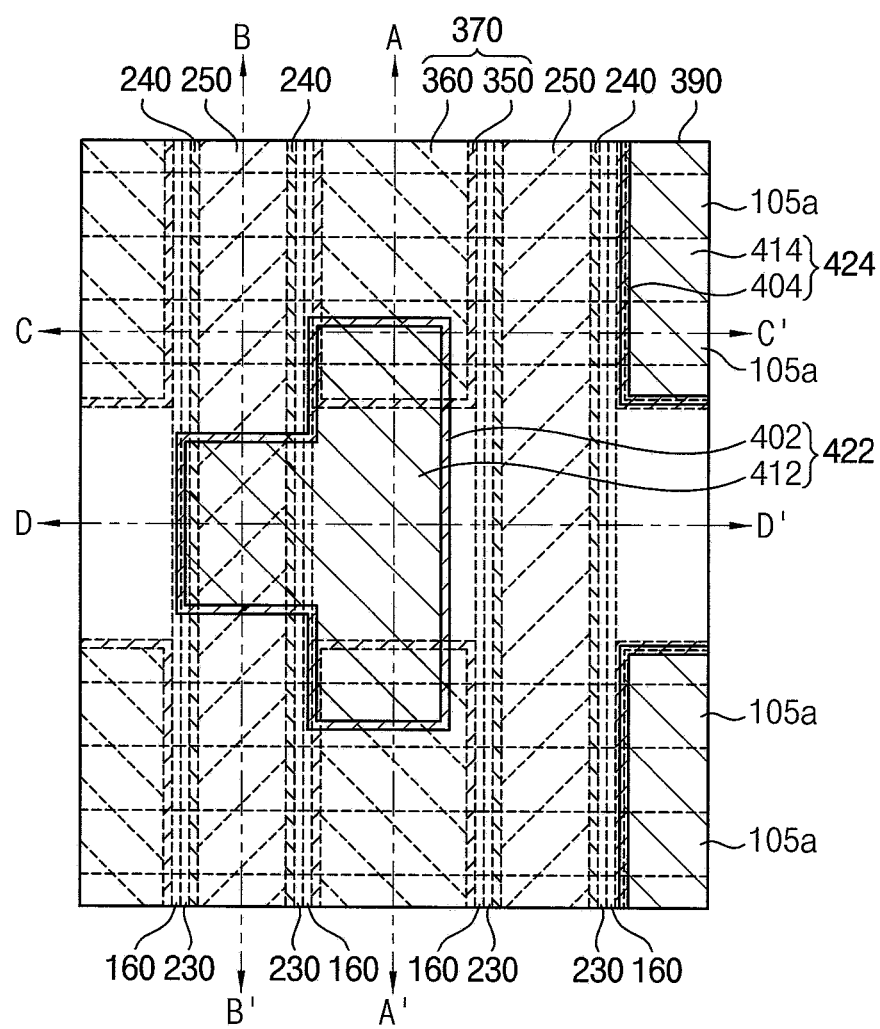
FIGS. 87 to 91 are plan views and cross-sectional views illustrating semiconductor devices, respectively, in accordance with example embodiments.
Figure 87:
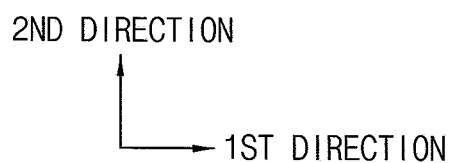

FIGS. 87 to 91 are plan views and cross-sectional views illustrating semiconductor devices, respectively, in accordance with example embodiments. FIG. 87 is a plan view, and FIGS. 88 to 91 are cross-sectional views taken along a line D-D' of FIG. 87.

The semiconductor devices may be substantially the same as or similar to those previously illustrated, except for the shape of the second contact plug. Thus, like reference numerals refer to like elements, and detailed descriptions thereon are omitted herein.

Figure 88:
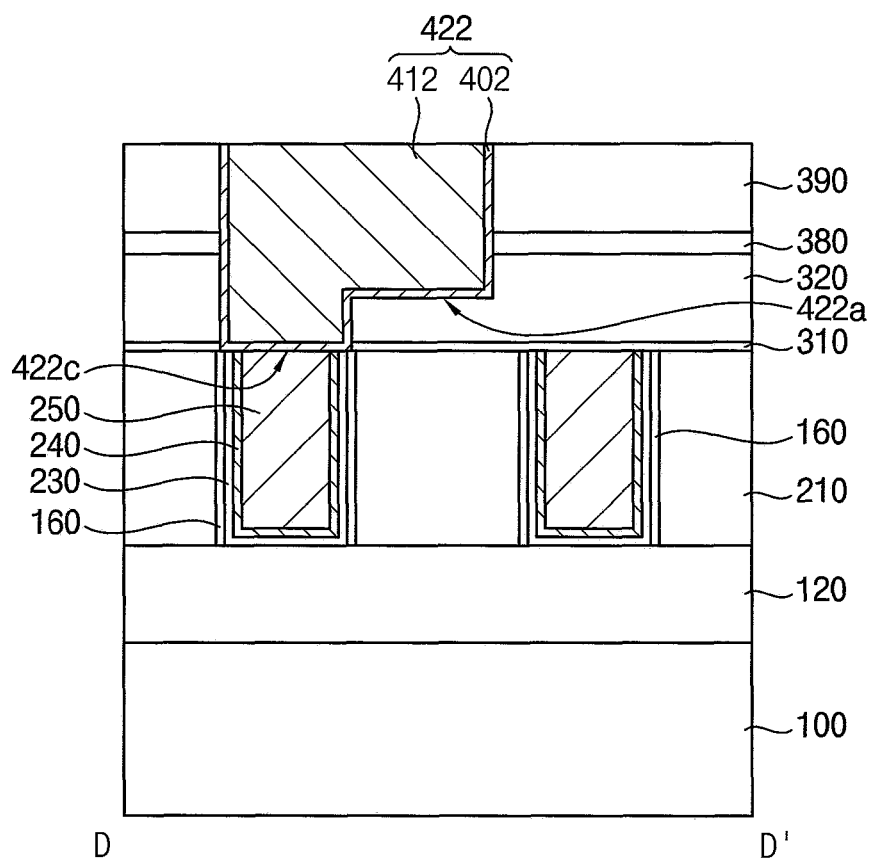

Referring to FIGS. 87 and 88, the second contact plug 422 include a first extension portion extending in the second direction and contacting the upper surface of the first contact plug 370, and a second extension portion extending in the first direction and contacting the upper surface of the gate structure 260. In example embodiments, the first extension portion may also vertically overlap the gate spacer 160 on the sidewall of the gate structure 260. The first and second extension portions of the second contact plug 422 may be integrally formed to be connected with each other.

The fifth opening 392 formed by the process illustrated with reference to FIGS. 34 to 37 may be formed to vertically overlap the first contact plug 370 and the gate spacer 160 adjacent thereto, and the fourth layer 440 may fill the fifth opening 392. Accordingly, when the tenth opening 396 is formed by the process illustrated with reference to FIGS. 47 to 49, the remaining portion of the fourth layer 440 in the fifth opening 392 may cover a portion of the insulation layer 210 adjacent the gate spacer 160, and there may be no second portion 422b or a convex portion lower than the upper surface of the gate structure 260 at the bottom of the second contact plug 422 filling the tenth opening 396.

As a result, the bottom of the second contact plug 422 may include the first portion 422a higher than the upper surface of the gate structure 260, and the third portion 422c contacting the upper surface of the gate structure 260, which may form a step shape.

Figure 89:
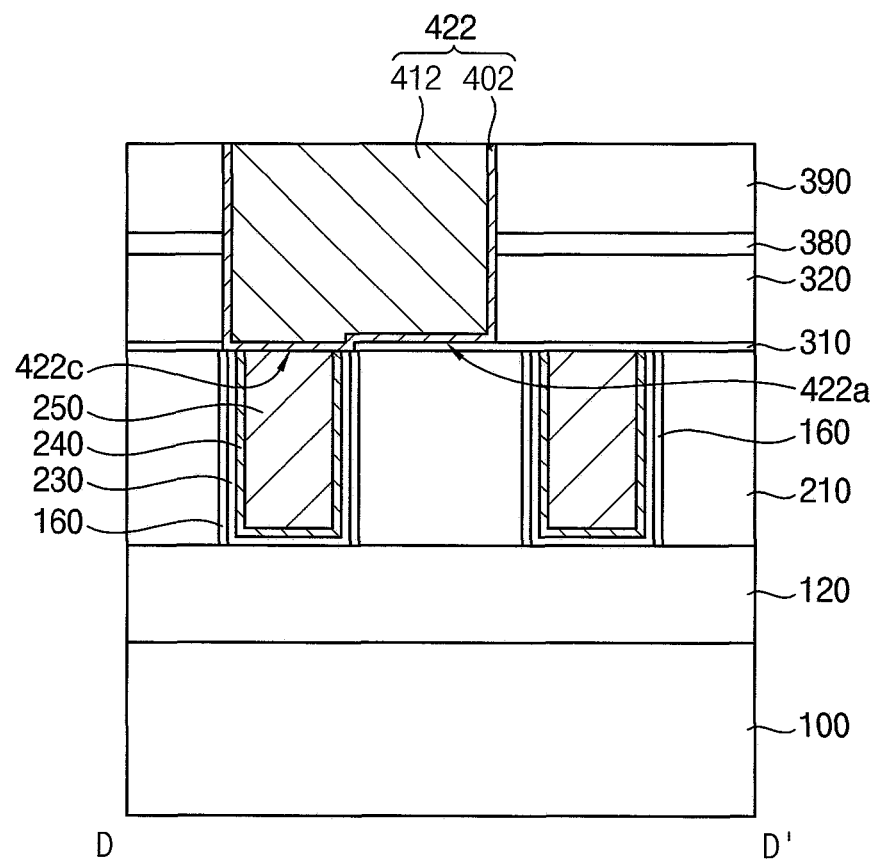
Figure 90:
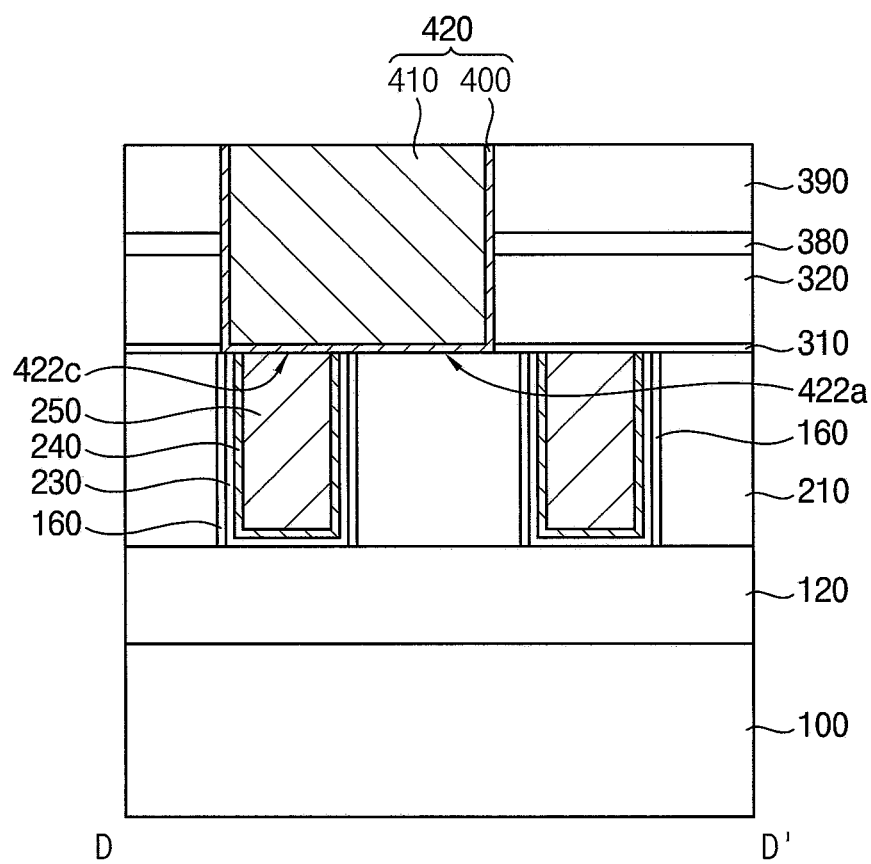
Figure 91:
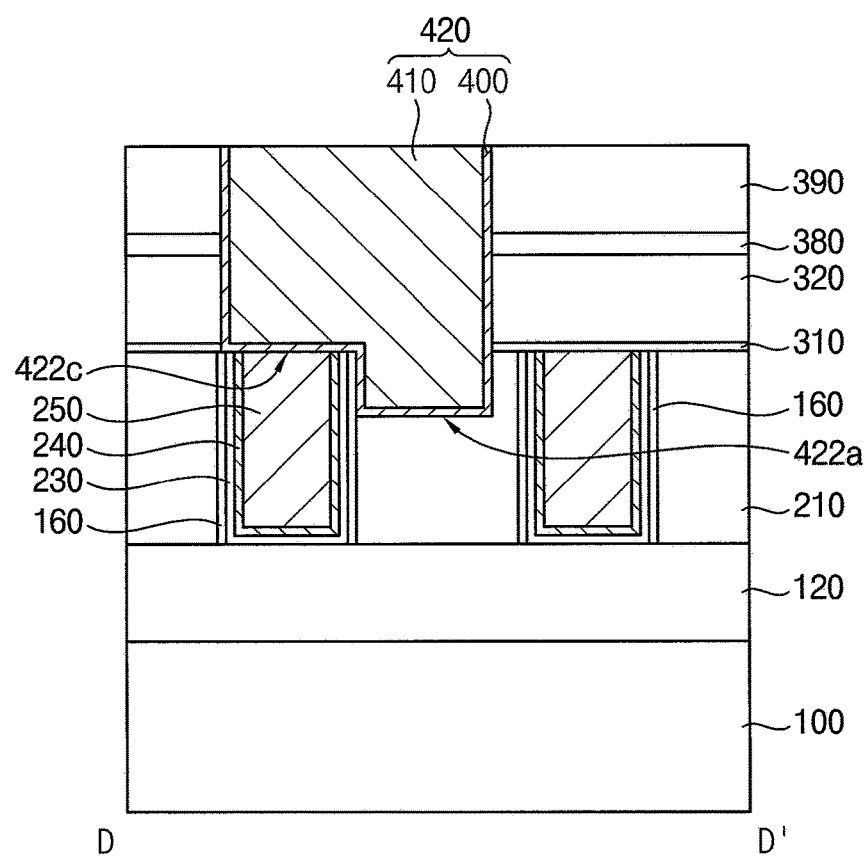

Referring to FIGS. 89 to 91, embodiments including the second contact plugs 422 of FIGS. 66, 69 and 72, respectively, having no second portions 422b at the bottoms thereof like that of FIGS. 87 and 88.

Figure 92:
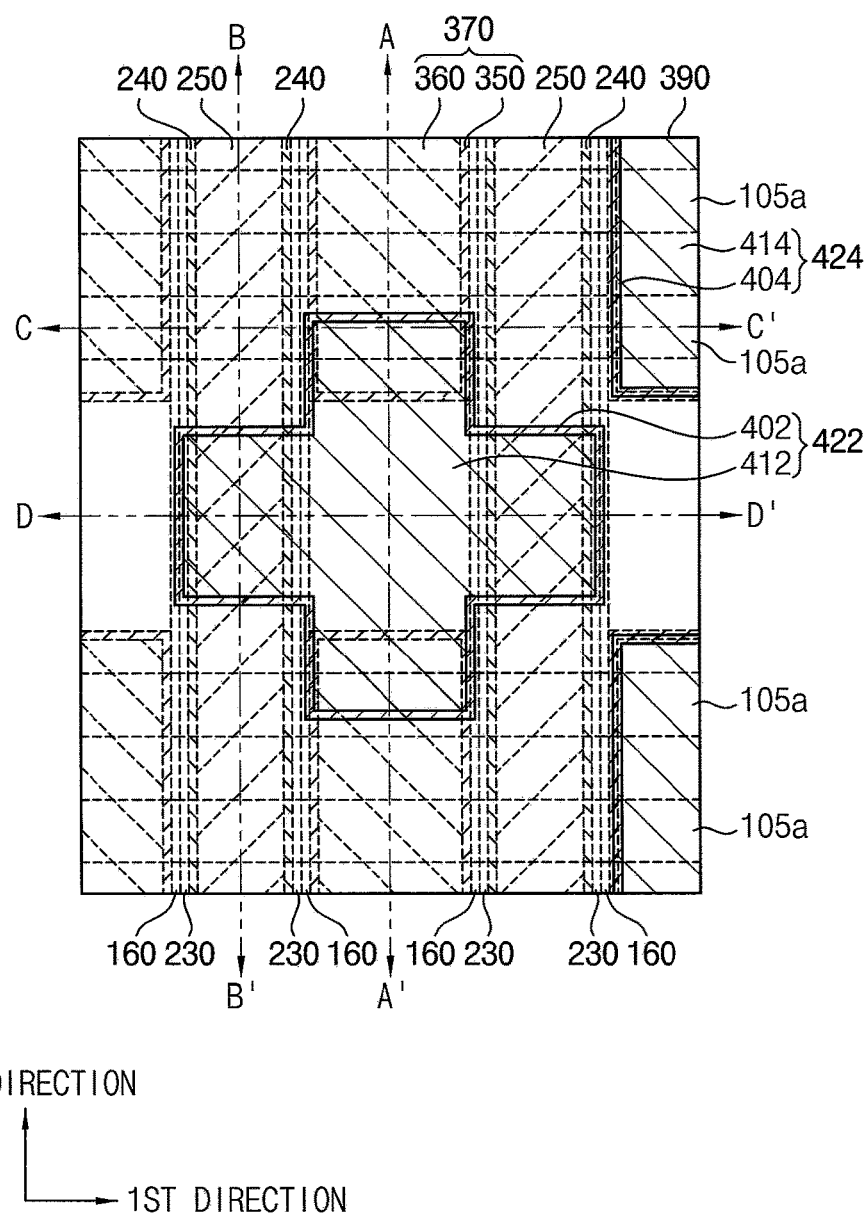

FIGS. 92 to 97 are cross-sectional views illustrating semiconductor devices, respectively, in accordance with example embodiments. FIG. 92 is a plan view, and FIGS. 93 to 97 are cross-sectional views taken along a line D-D' of FIG. 92.

The semiconductor devices may be substantially the same as or similar to those previously illustrated, except for the shape of the second contact plug. Thus, like reference numerals refer to like elements, and detailed descriptions thereon are omitted herein.

Figure 93:
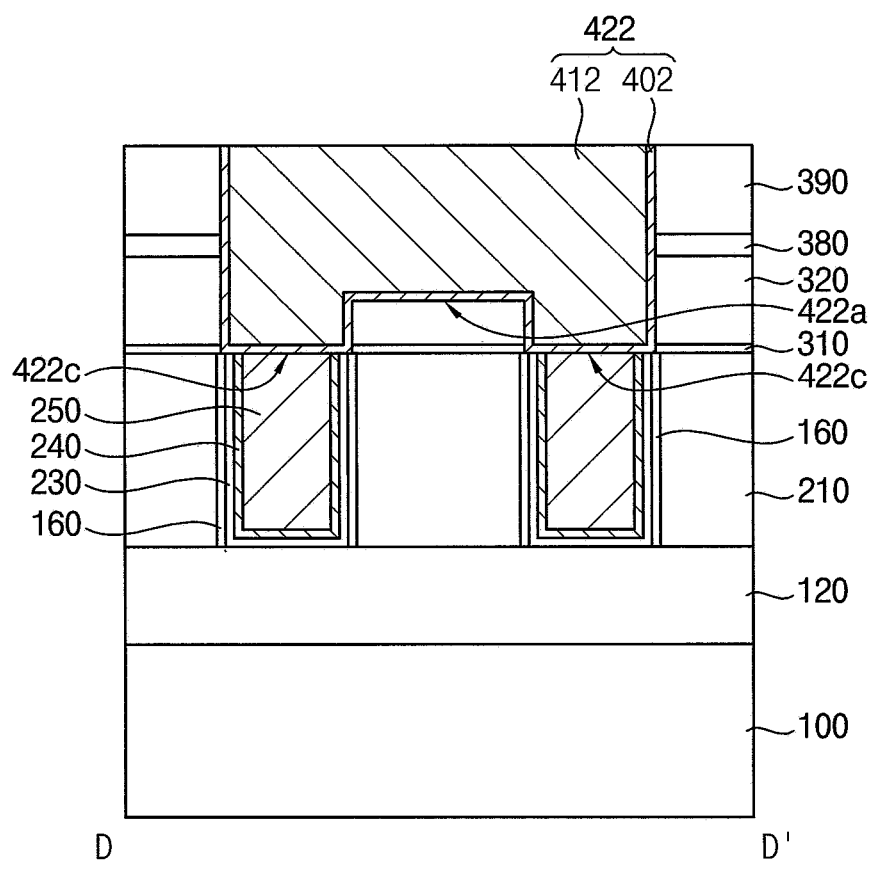
Figure 94:
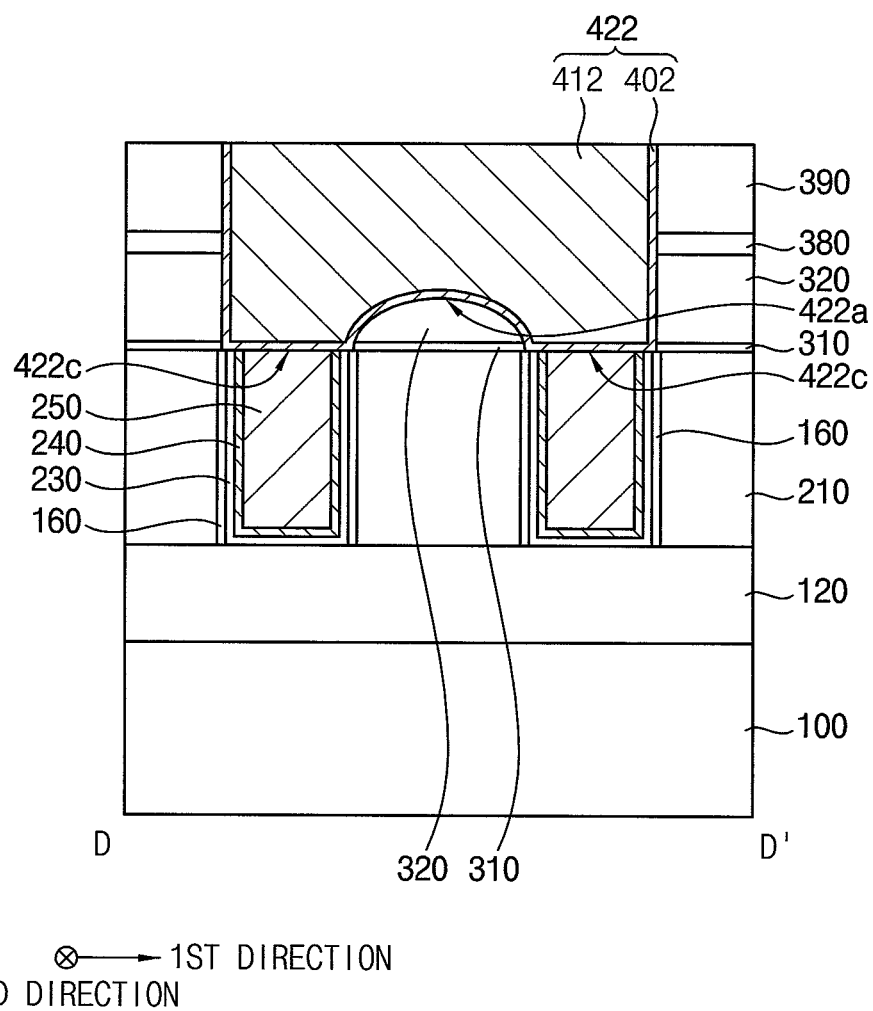
Figure 95:
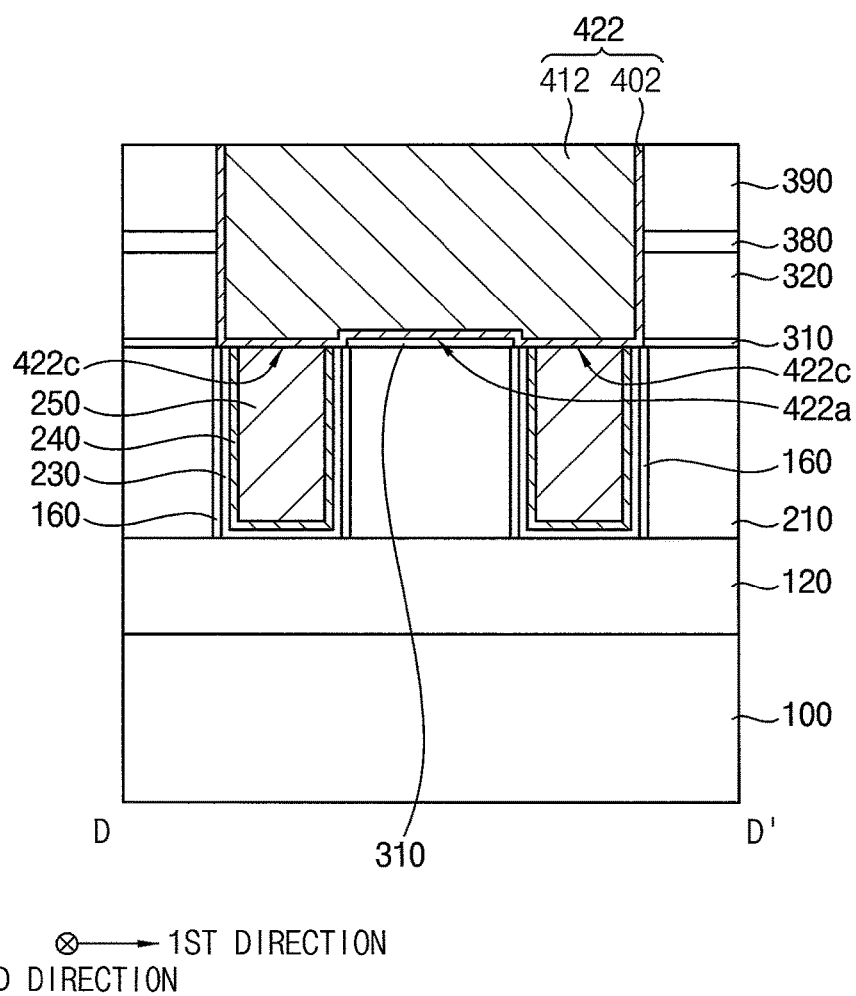
Figure 96:
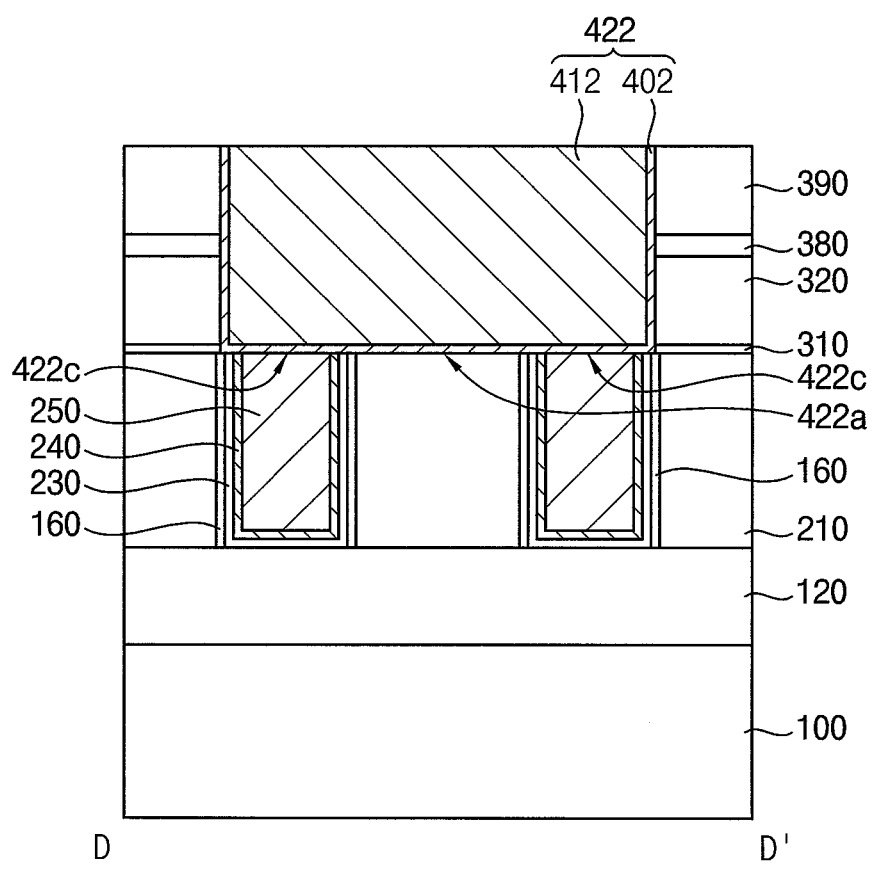
Figure 97:
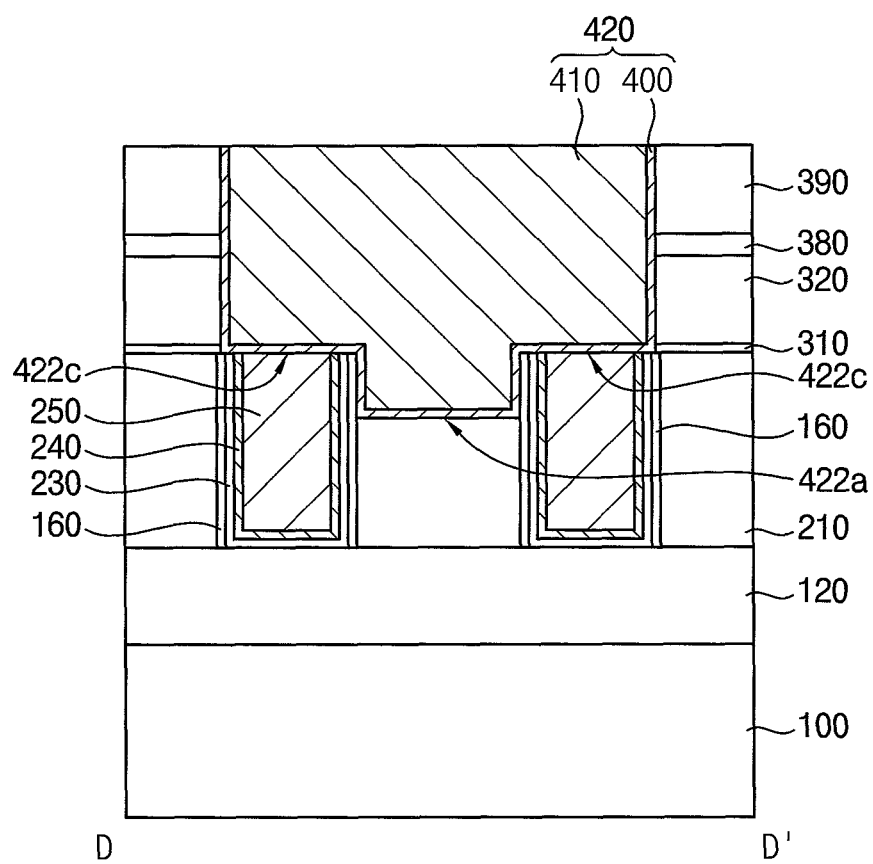

Referring to FIGS. 92 and 93, the second contact plug 422 may have a shape similar to that of FIGS. 75 and 76. However, like that of FIGS. 87 and 88, the bottom of the second contact plug 422 may only include the first portion 422a higher than the upper surface of the gate structure 260, and the third portion 422c contacting the gate structure 260. The bottom of the second contact plug 422 may have the concave portion of which an upper surface may be the first portion 422a thereof, and the third portions 422c may be formed at opposite sides, respectively, of the concave portion in the first direction.

Referring to FIGS. 94 to 97, embodiments including the second contact plugs 422 of FIGS. 77, 79, 80 and 81, respectively, having no second portions 422b at the bottoms thereof like that of FIGS. 92 and 93.

The above method of manufacturing the semiconductor device may be applied to methods of manufacturing various types of memory devices including contact plugs each of which may be electrically connected to both of a source/drain layer and a gate structure. For example, the method may be applied to methods of manufacturing logic devices such as central processing units (CPUs), main processing units (MPUs), or application processors (APs), or the like. Additionally, the method may be applied to methods of manufacturing volatile memory devices such as DRAM devices or SRAM devices, or non-volatile memory devices such as flash memory devices, PRAM devices, MRAM devices, RRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
a gate structure on a substrate;
a source/drain layer on a portion of the substrate adjacent the gate structure;
a first contact plug on an upper surface of the source/drain layer; and
a second contact plug contacting an upper surface of the gate structure and contacting an upper surface of the first contact plug, a bottom surface of the second contact plug having first and second portions adjacent to each other, each of the first and second portions contacting neither the upper surface of the first contact plug nor the upper surface of the gate structure, and the second portion being convex and lower than the upper surface of the gate structure,
wherein the gate structure is closer to the second portion of the bottom surface of the second contact plug than the first portion thereof.

2. The semiconductor device of claim 1, wherein each of the first and second portions of the bottom surface of the second contact plug vertically overlaps neither the first contact plug nor the gate structure.

3. The semiconductor device of claim 1, wherein the first portion of the bottom surface of the second contact plug is a concave portion.

4. The semiconductor device of claim 3, further comprising an insulation layer structure filling the concave portion of the bottom surface of the second contact plug.

5. The semiconductor device of claim 3, wherein the concave portion of the bottom surface of the second contact plug has a width constant along a vertical direction.

6. The semiconductor device of claim 3, wherein the concave portion of the bottom surface of the second contact plug has a width gradually decreasing from a bottom toward a top thereof.

7. The semiconductor device of claim 3, wherein the second contact plug includes:
a metal pattern; and
a barrier pattern covering a bottom and a sidewall of the metal pattern,
wherein a thickness of the barrier pattern at an upper surface of the concave portion is greater than a thickness of the barrier pattern at a sidewall of the concave portion.

8. The semiconductor device of claim 1, wherein the first portion of the second contact plug is higher than the upper surface of the gate structure.

9. A semiconductor device, comprising:
a gate structure on a substrate;
a source/drain layer on a portion of the substrate adjacent the gate structure;
a first contact plug contacting an upper surface of the source/drain layer; and
a second contact plug contacting an upper surface of the gate structure and an upper surface of the first contact plug, a bottom surface of the second contact plug having a first portion contacting neither the upper surface of the first contact plug nor the upper surface of the gate structure,
wherein the gate structure is one of a plurality of gate structures spaced apart from each other in a first direction, each of the gate structures extending in a second direction substantially perpendicular to the first direction,
and wherein the second contact plug includes:
a first extension portion extending in the second direction between the gate structures and contacting at least a part of the upper surface of the first contact plug; and
a second extension portion extending in the first direction, the second extension portion being connected to the first extension portion and contacting a part of the upper surface of at least one of the gate structures.

10. The semiconductor device of claim 9, wherein the first portion of the bottom surface of the second contact plug is formed at an area in which the first and second extension portions of the second contact plug meet each other.

11. The semiconductor device of claim 9, further comprising:
an isolation pattern on the substrate; and
a plurality of active fins spaced apart from each other in the second direction, each of the active fins partially protruding from an upper surface of the isolation pattern and extending in the first direction,
wherein the source/drain layer is formed on each of the active fins.

12. The semiconductor device of claim 11, wherein the first portion of the bottom surface of the second contact plug vertically overlaps the isolation pattern.

13. The semiconductor device of claim 11, wherein a lowermost portion of the bottom surface of the second contact plug is higher than the upper surface of the isolation pattern.

14. A semiconductor device, comprising:
a gate structure on a substrate, the gate structure having a topmost surface at a first height and a bottom-most surface at a second height;
a source/drain layer on a portion of the substrate adjacent the gate structure;
a first contact plug on a top surface of the source/drain layer; and
a second contact plug contacting the topmost surface of the gate structure and a top surface of the first contact plug, a bottom surface of the second contact plug having first and second portions contacting neither the topmost surface of the gate structure nor the top surface of the first contact plug,
wherein the first portion of the bottom surface of the second contact plug is at a height equal to the first height or the second height or between the first height and the second height, and the second portion of the bottom surface of the second contact plug is at a height greater than the first height.

15. The semiconductor device or claim 14, wherein both the first portion and the second portion of the bottom surface of the second contact plug are above an upper surface of an isolation pattern.

16. The semiconductor device of claim 15, wherein the first portion of the bottom surface of the second contact plug is lower than the second portion thereof.

17. The semiconductor device of claim 16, wherein the first portion of the bottom surface of the second contact plug is closer to the gate structure than the second portion thereof.

18. The semiconductor device of claim 14, wherein the second contact plug has a first extension portion extending in a first direction when viewed from a top-down view, and a second extension portion protruding from the first portion in the top-down view to extend in a second direction different from the first direction.

* * * * *